(12) United States Patent
Mason et al.

(10) Patent No.: US 9,564,405 B2
(45) Date of Patent: Feb. 7, 2017

(54) SUBSTRATE OPENING FORMATION IN SEMICONDUCTOR DEVICES

(71) Applicant: SKYWORKS SOLUTIONS, INC., Woburn, MA (US)

(72) Inventors: Jerod F. Mason, Bedford, MA (US); Dylan Charles Bartle, Arlington, MA (US); David Scott Whitefield, Andover, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/154,864

(22) Filed: May 13, 2016

(65) Prior Publication Data
US 2016/0336279 A1   Nov. 17, 2016

Related U.S. Application Data

(60) Provisional application No. 62/162,640, filed on May 15, 2015.

(51) Int. Cl.
| H01L 21/00 | (2006.01) |
| H01L 23/00 | (2006.01) |
| H01L 21/768 | (2006.01) |
| H01L 29/06 | (2006.01) |
| H01L 23/528 | (2006.01) |
| H01L 21/683 | (2006.01) |
| H01L 21/762 | (2006.01) |

(Continued)

(52) U.S. Cl.
CPC ......... *H01L 23/562* (2013.01); *H01L 21/6835* (2013.01); *H01L 21/7624* (2013.01); *H01L 21/7685* (2013.01); *H01L 21/76877* (2013.01); *H01L 23/5283* (2013.01); *H01L 29/0649* (2013.01); *H01L 29/78* (2013.01); *H04B 1/40* (2013.01); *H01L 2221/68318* (2013.01); *H01L 2223/6677* (2013.01)

(58) Field of Classification Search
CPC .............. H04B 1/38; H04B 1/40; H04B 1/44; H04B 1/48; H01L 23/562; H01L 21/84; H01L 21/6835; H01L 21/7624; H01L 21/7685; H01L 21/42384; H01L 21/76877; H01L 23/5283; H01L 29/0649; H01L 29/78; G06F 19/24
See application file for complete search history.

(56) References Cited

U.S. PATENT DOCUMENTS

| 8,748,285 B2 * | 6/2014 | Botula | H01L 21/84 257/E21.319 |
| 2005/0003592 A1 * | 1/2005 | Jones | H01L 29/42384 438/157 |

(Continued)

*Primary Examiner* — Thanh Le
(74) *Attorney, Agent, or Firm* — Chang & Hale LLP

(57) ABSTRACT

Radio-frequency (RF) devices are fabricated by providing a field-effect transistor (FET) formed over an oxide layer, forming one or more electrical connections to the FET, forming one or more dielectric layers over at least a portion of the electrical connections, electrically coupling an electrical element to the FET via the one or more electrical connections, disposing a handle wafer layer on at least a portion of the one or more dielectric layers, the handle wafer layer being at least partially over the electrical element; and removing at least a portion of the handle wafer layer to form an opening exposing at least a portion of the electrical element.

20 Claims, 45 Drawing Sheets

(51) Int. Cl.
    *H01L 29/78*    (2006.01)
    *H04B 1/40*    (2015.01)

(56) References Cited

U.S. PATENT DOCUMENTS

2009/0121260 A1* 5/2009 Bernstein ............ H01L 21/6835
                                                    257/255
2013/0231870 A1* 9/2013 Sugnet ................... G06F 19/24
                                                    702/19

* cited by examiner

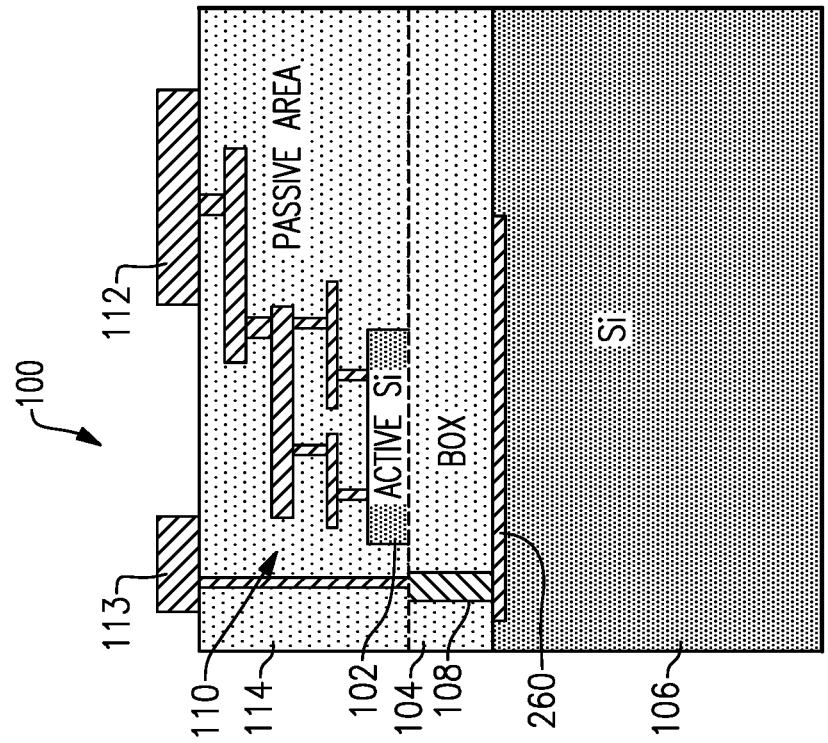
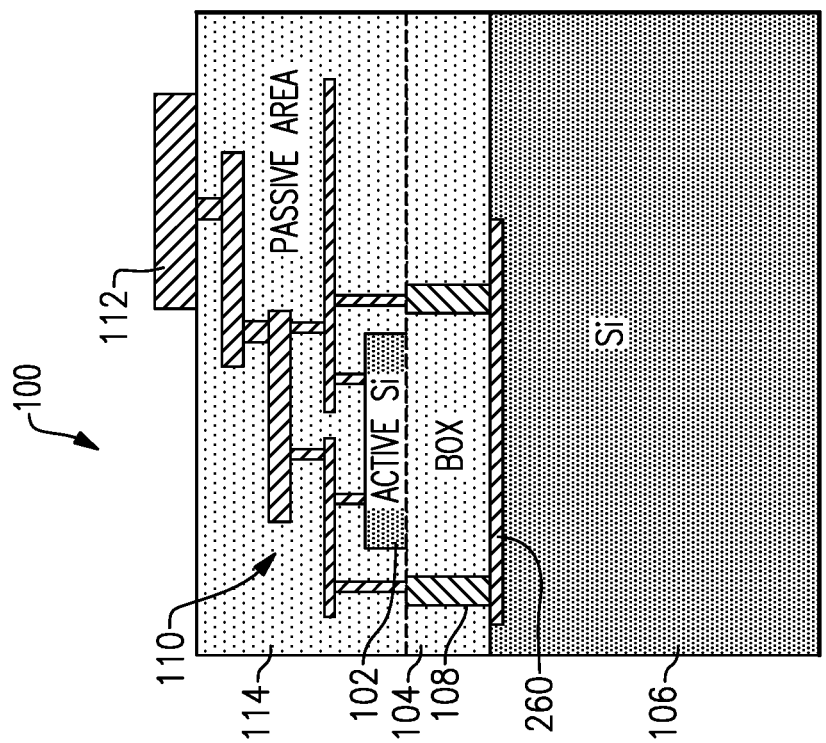

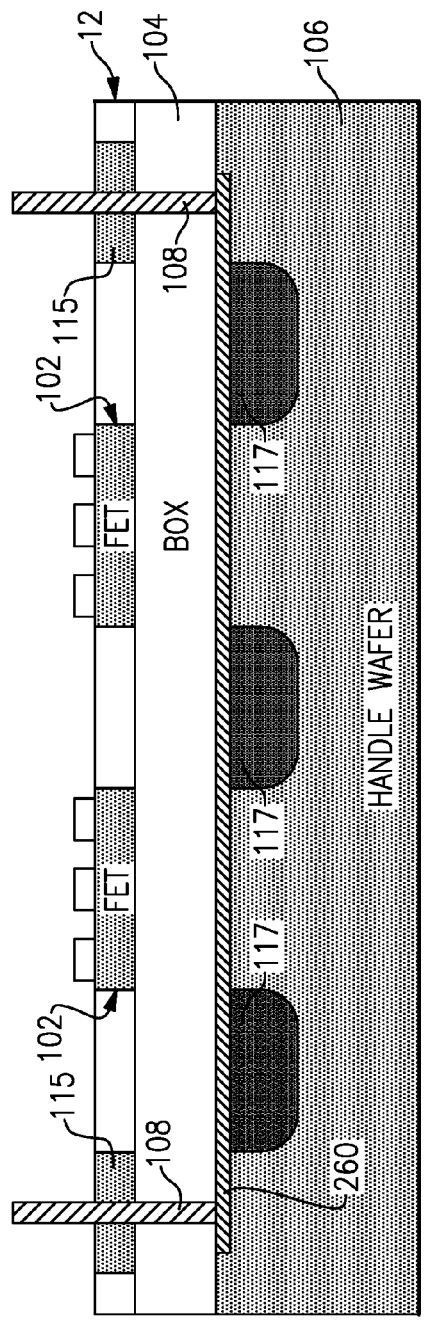
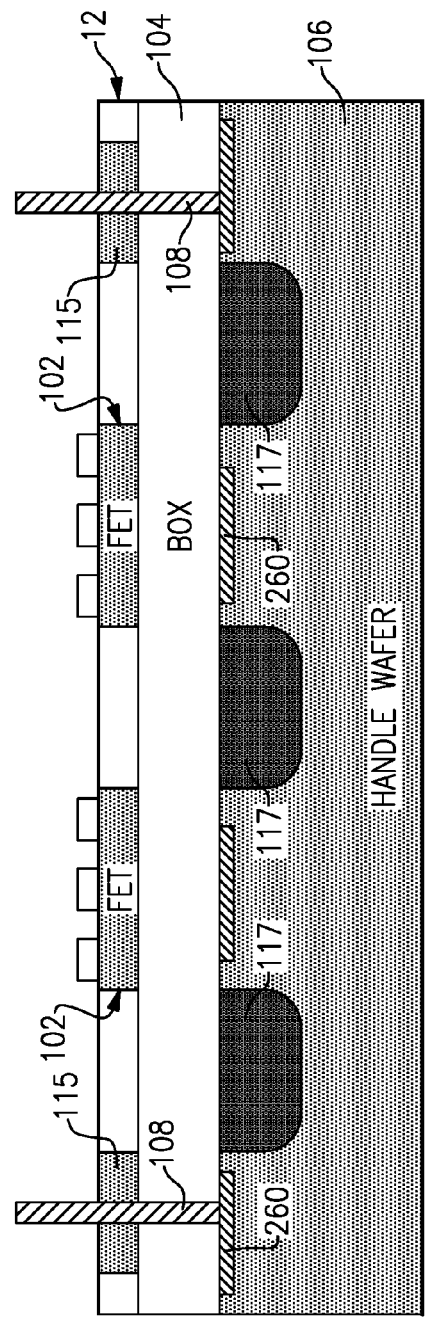

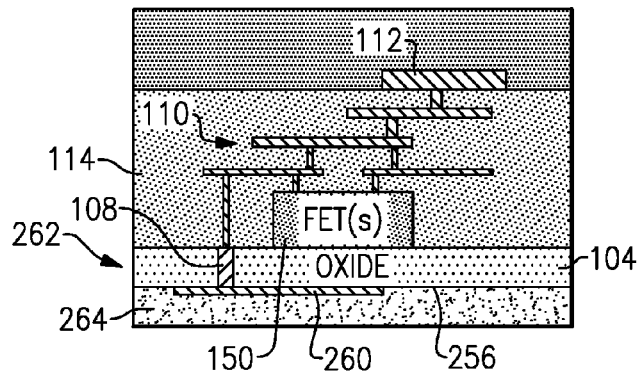
210 — FORM AN INTERFACE LAYER ON THE EXPOSED BACK SIDE
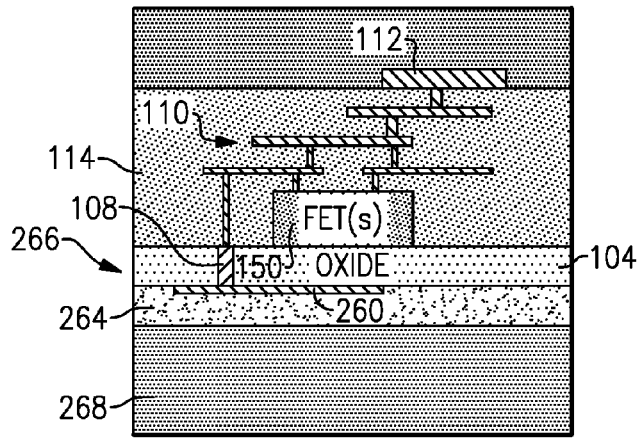
212 — FORM OR ATTACH A REPLACEMENT SUBSTRATE LAYER TO THE INTERFACE LATER
214 — REMOVE THE CARRIER FROM THE FRONT SIDE OF THE WATER
FIG.22B
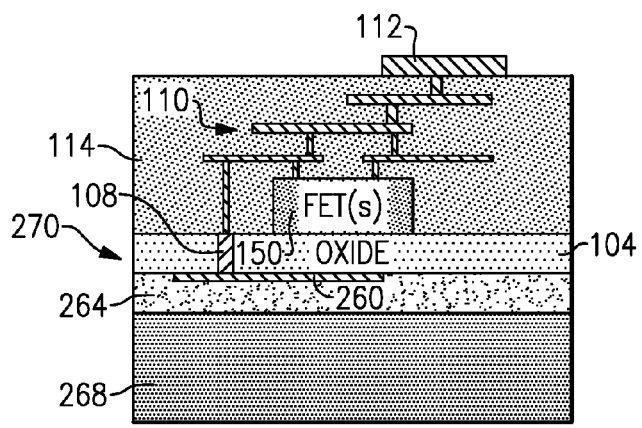
FIG.23B

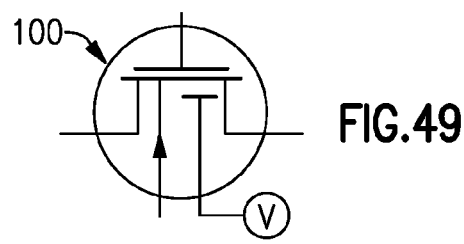
FIG. 49
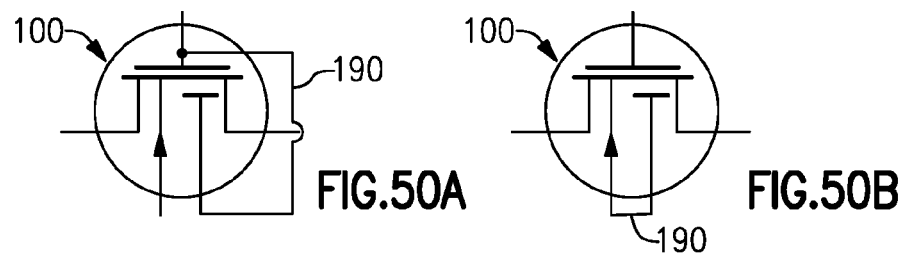
FIG. 50A
FIG. 50B
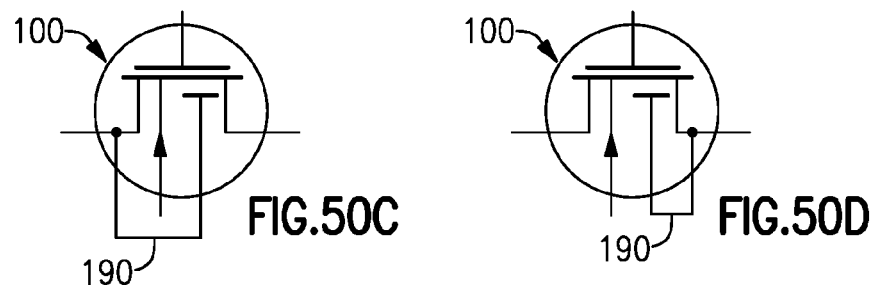
FIG. 50C
FIG. 50D
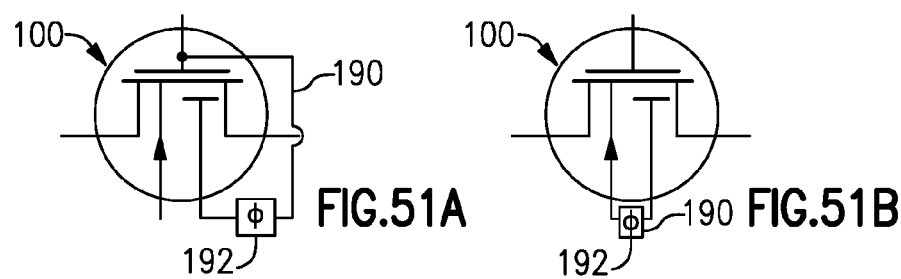
FIG. 51A
FIG. 51B
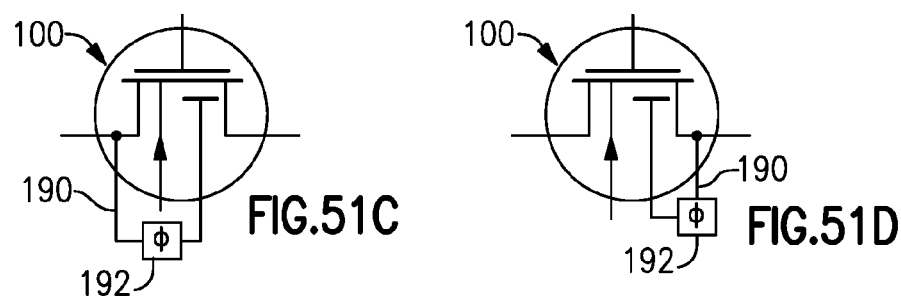
FIG. 51C
FIG. 51D

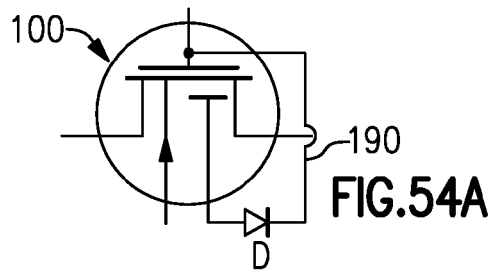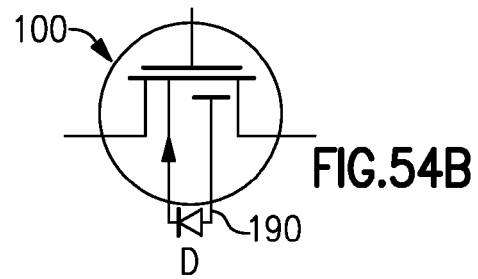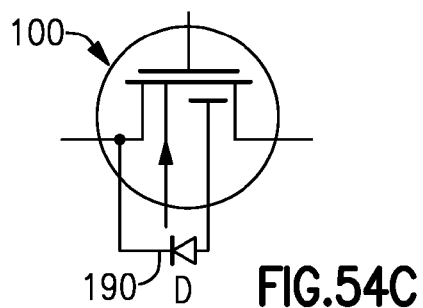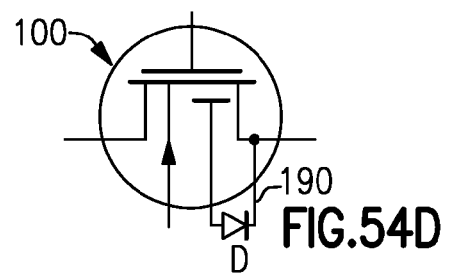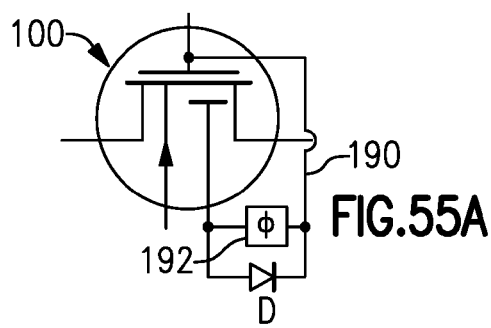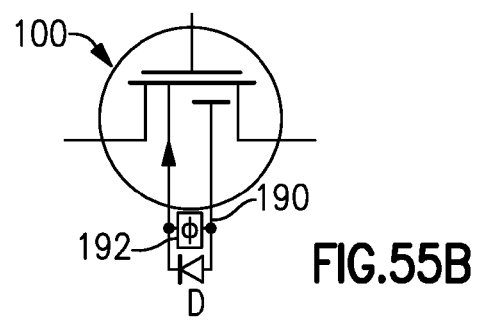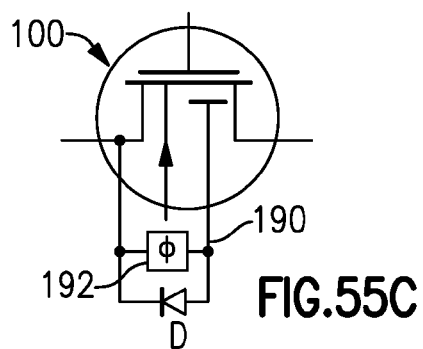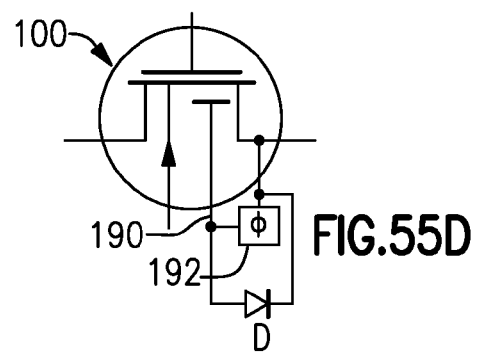

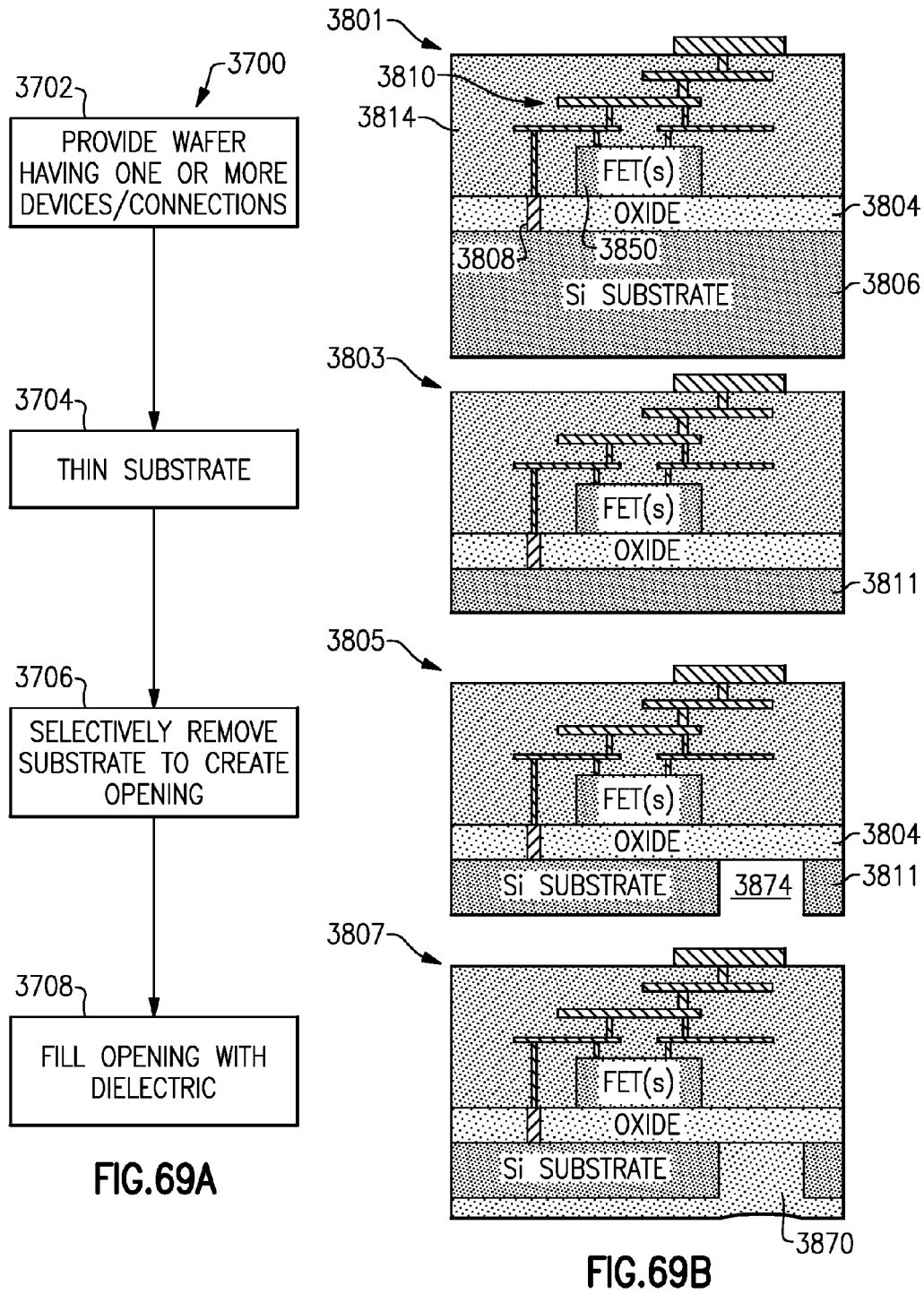

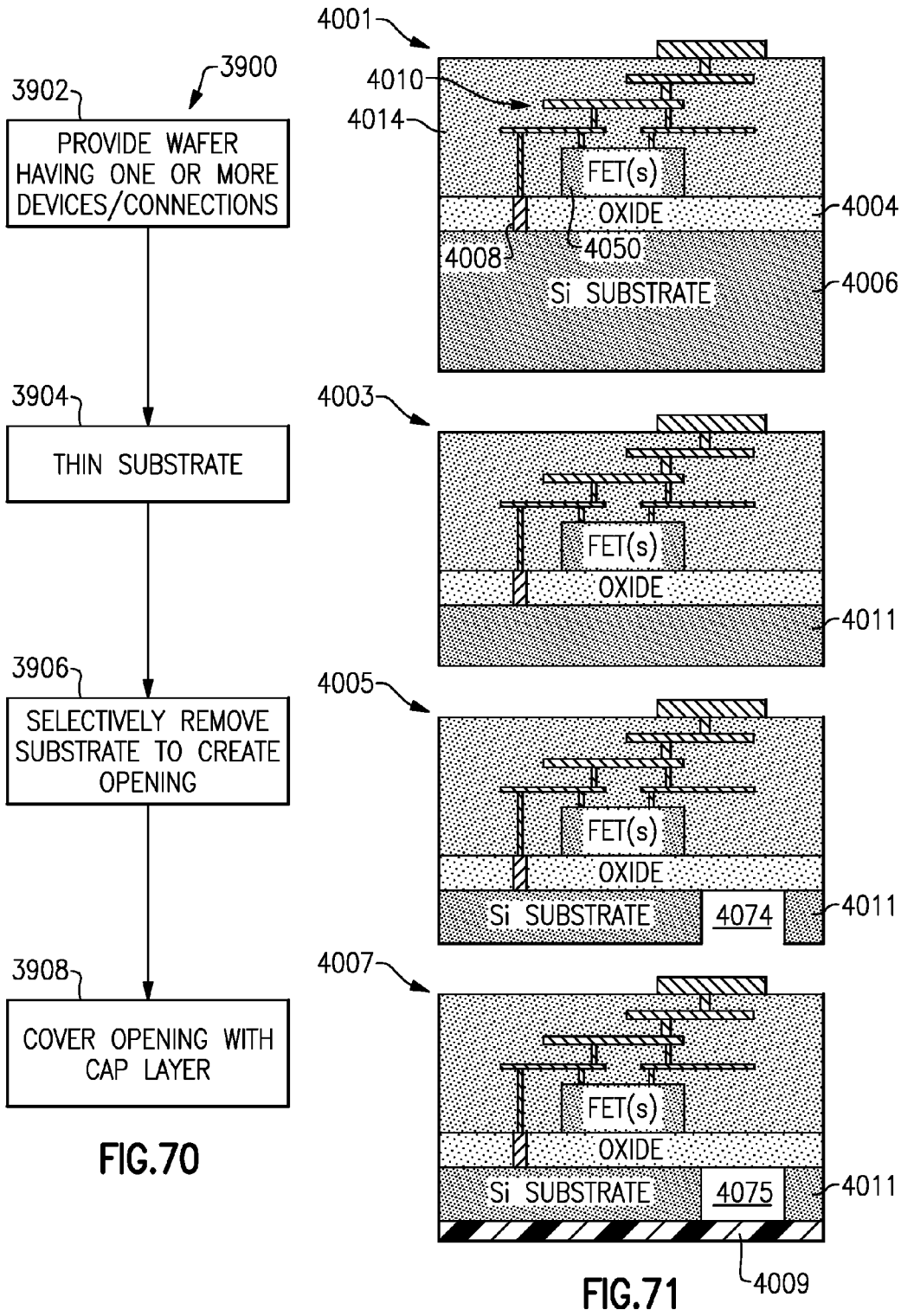

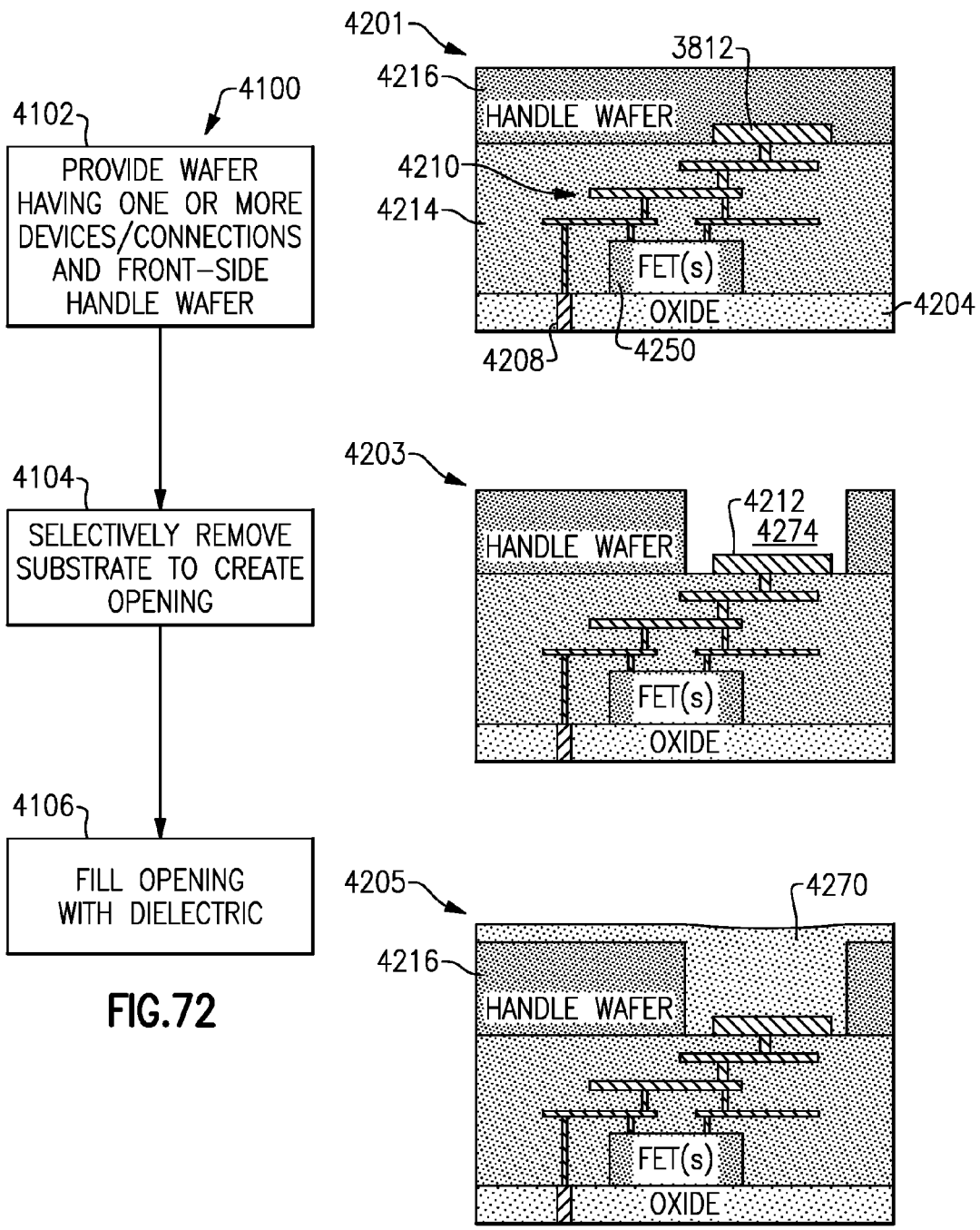

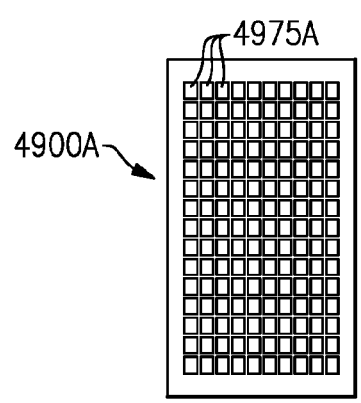
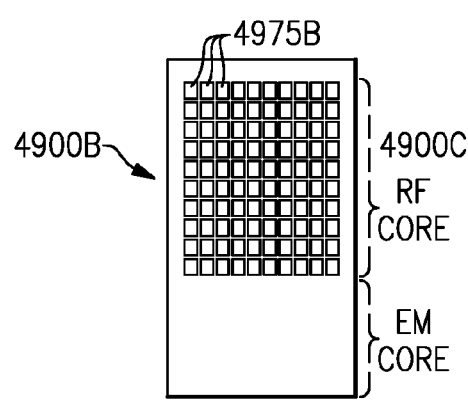
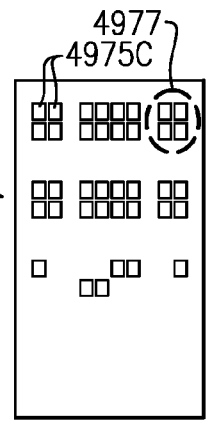
FIG.76A　　　　FIG.76B　　　　FIG.76C
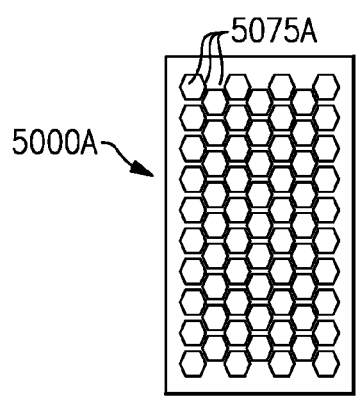
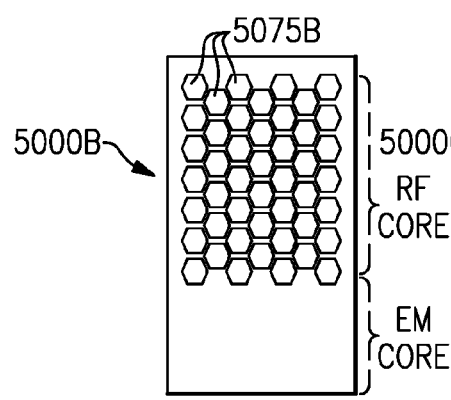
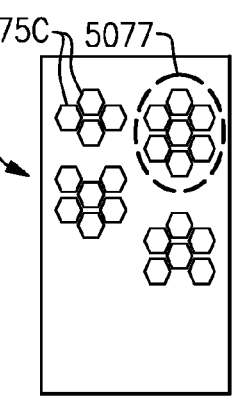
FIG.77A　　　　FIG.77B　　　　FIG.77C

SUBSTRATE OPENING FORMATION IN SEMICONDUCTOR DEVICES

CROSS-REFERENCE TO RELATED APPLICATION(S)

This application claims priority to U.S. Provisional Application No. 62/162,640, filed May 15, 2015, and entitled RADIO FREQUENCY ISOLATION USING SUBSTRATE OPENING, the disclosure of which is hereby incorporated by reference in its entirety.

BACKGROUND

Field

The present disclosure relates to field-effect transistor (FET) devices such as silicon-on-insulator (SOI) devices.

Description of the Related Art

In electronics applications, field-effect transistors (FETs) can be utilized as switches. Such switches can allow, for example, routing of radio-frequency (RF) signals in wireless devices.

SUMMARY

In accordance with a number of implementations, the present disclosure relates to a method for fabricating a radio-frequency (RF) device. The method comprises providing a field-effect transistor (FET) formed over a an oxide layer formed on a substrate layer and removing at least a portion of the substrate layer to form an opening exposing at least a portion of a backside of the oxide layer, the opening being positioned to enhance RF performance for one or more components of the RF device.

In certain embodiments, the method further comprises thinning the substrate layer prior to removing the at least a portion of the substrate layer. The method may comprise covering at least a portion of the substrate layer and the opening with a covering to form a cavity. The covering may be a laminate film, a plastic lid structure, an additional replacement substrate layer, or the like.

In certain embodiments, the method comprises at least partially filling the opening with a dielectric filler. The method may further comprise covering at least a portion of a backside of the substrate layer with the dielectric filler to form a dielectric layer. The method may further comprise applying a replacement substrate layer to the dielectric layer to provide mechanical stability for the RF device. In certain embodiments, the method comprises applying a handle wafer to the RF device to provide mechanical stability for the RF device.

In accordance with a number of implementations, the present disclosure relates to a radio-frequency (RF) device comprising a field-effect transistor (FET) implemented over an oxide layer, a patterned semiconductor substrate layer on which the oxide layer is formed, the substrate layer including a backside trench defined at least in part by side wall portions of the substrate layer, and one or more electrical connections connected to the FET.

In certain embodiments, the substrate layer is a thinned substrate layer. The RF device may further comprise a replacement substrate layer disposed on a backside of the substrate layer and covering the trench to form a cavity. The RF device may further comprise a dielectric filler material contained within the trench. In certain embodiments, the RF device further comprises a dielectric layer disposed on a backside of the substrate layer.

In accordance with a number of implementations, the present disclosure relates to a wireless device comprising a transceiver configured to process radio-frequency (RF) signals and an RF module in communication with the transceiver, the RF module including a switching device having a field-effect transistor (FET) implemented over an oxide layer and a patterned semiconductor substrate layer including an opening defined at least in part by a side wall of the substrate layer and a portion of a backside of the oxide layer, the switching device further including one or more electrical connections connected to the FET. The wireless device further comprises an antenna in communication with the RF module, the antenna configured to facilitate transmitting and/or receiving of the RF signals.

In certain embodiments, the substrate layer is a thinned substrate layer. The wireless device may further comprise a replacement substrate layer disposed on a backside of the substrate layer that covers the opening to form a cavity. The wireless device may comprise a dielectric filler contained within the opening. A dielectric layer may be disposed on a backside of the substrate layer.

In accordance with a number of implementations, the present disclosure relates to a radio-frequency (RF) module comprising a packaging substrate configured to receive a plurality of devices and a switching device mounted on the packaging substrate, the switching device including a field-effect transistor (FET) implemented over an oxide layer and a patterned semiconductor substrate layer including an opening defined at least in part by a side wall of the substrate layer and a portion of a backside of the oxide layer, the switching device further including one or more electrical connections connected to the FET.

In certain embodiments, the substrate layer is a thinned substrate layer. The RF module may comprise a replacement substrate layer disposed on a backside of the substrate layer and covering the opening to form a cavity. In certain embodiments, the RF module comprises a dielectric filler contained within the opening. A dielectric layer may be disposed on a backside of the substrate layer.

In accordance with a number of implementations, the present disclosure relates to a method of fabricating a radio-frequency (RF) device. The method may comprise providing a field-effect transistor (FET) formed over an oxide layer, forming one or more electrical connections to the FET, forming one or more dielectric layers over at least a portion of the electrical connections, electrically coupling an electrical element to the FET via the one or more electrical connections, and disposing a handle wafer layer on at least a portion of the one or more dielectric layers, the handle wafer layer being at least partially over the electrical element. The method further comprises removing at least a portion of the handle wafer layer to form an opening exposing at least a portion of the electrical element.

In certain embodiments, the method comprises thinning the handle wafer layer prior to said removing the at least a portion of the handle wafer layer. The method may comprise covering at least a portion of the handle wafer layer and the opening with a covering to form a cavity. In certain embodiments, the covering may be a laminate film, a plastic lid structure, an additional replacement substrate layer, or other type of covering.

The method may comprise at least partially filling the opening with a dielectric material. The method may further comprise covering at least a portion of the handle wafer layer with the dielectric material to form a dielectric layer.

The method may further comprise applying a replacement substrate layer to the dielectric layer to provide mechanical stability for the RF device.

The electrical element may be a surface acoustic wave (SAW) device, a bulk acoustic wave (BAW) device, or other type of electrical device, such as a passive device (e.g., inductor).

In certain embodiments, the method comprises at least partially removing the substrate layer to expose at least a portion of a backside of an oxide layer disposed between the FET and the substrate layer. The method may further comprise disposing an electrical contact structure on the backside of the oxide layer to provide electrical contact to the one or more electrical connections through a through-oxide via. The method may comprise disposing a substrate contact layer on the backside of the oxide layer.

In accordance with a number of implementations, the present disclosure relates to a radio-frequency (RF) device comprising a field-effect transistor (FET) implemented over an oxide layer, one or more electrical connections to the FET, one or more dielectric layers formed over at least a portion of the electrical connections, an electrical element electrically coupled to the FET via the one or more electrical connections, and a handle wafer layer disposed on at least a portion of the one or more dielectric layers, the handle wafer layer including a topside trench defined at least in part by sidewall portions of the handle wafer layer, the trench exposing at least a portion of the electrical element.

In certain embodiments, the RF device further comprises a covering that covers at least a portion of the handle wafer layer and the trench to form a cavity. The covering may be a laminate film, for example. In certain embodiments, the RF device comprises a dielectric material that fills the trench. The RF device may further comprise a replacement substrate layer applied to the dielectric material to provide mechanical stability for the RF device.

In accordance with a number of implementations, the present disclosure relates to a wireless device comprising a transceiver configured to process radio-frequency (RF) signals and an RF module in communication with the transceiver, the RF module including a switching device having a field-effect transistor (FET) implemented over an oxide layer, one or more electrical connections to the FET, one or more dielectric layers formed over at least a portion of the electrical connections, an electrical element electrically coupled to the FET via the one or more electrical connections, a handle wafer layer disposed on at least a portion of the one or more dielectric layers, the handle wafer layer including a topside trench defined at least in part by sidewall portions of the handle wafer layer, the trench exposing at least a portion of the electrical element. The wireless device further comprises an antenna in communication with the RF module, the antenna configured to facilitate transmitting and/or receiving of the RF signals.

In certain embodiments, the RF module includes a covering that covers at least a portion of the handle wafer layer and the trench to form a cavity. The RF module may include a dielectric material that at least partially fills the trench.

In accordance with a number of implementations, the present disclosure relates to a method of fabricating a radio-frequency (RF) device. The method comprises providing a field-effect transistor (FET) formed over an oxide layer, forming one or more electrical connections to the FET, forming one or more dielectric layers over at least a portion of the electrical connections, disposing a handle wafer layer on at least a portion of the one or more dielectric layers, and removing at least a portion of the handle wafer layer to form an opening at least partially above the FET.

In certain embodiments, the method comprises thinning the handle wafer layer prior to removing the at least a portion of the handle wafer layer. The method may comprise covering at least a portion of the handle wafer layer and the opening with a covering to form a cavity. For example, the covering may comprise a laminate film, a plastic lid structure, an additional replacement substrate layer, or other type of covering.

In certain embodiments, the method comprises at least partially filling the opening with a dielectric material. The method may further comprise covering at least a portion of the handle wafer layer with the dielectric material to form a dielectric layer. The method may further comprise applying a replacement substrate layer to the dielectric layer to provide mechanical stability for the RF device.

BRIEF DESCRIPTION OF THE DRAWINGS

FIG. 15 shows an example SOI FET device that is similar to the example of FIG. 11, but with a contact layer implemented underneath a BOX layer.

FIG. 16 shows an example SOI FET device that is similar to the example of FIG. 12, but with a contact layer implemented underneath a BOX layer.

FIG. 18 shows an example SOI FET device that is similar to the example of FIG. 13, but with a contact layer implemented underneath a BOX layer.

FIG. 19 shows another example SOI FET device that is similar to the example of FIG. 13, but with a perforated contact layer implemented underneath a BOX layer.

FIGS. 22A and 22B show a process that can be implemented to fabricate an SOI FET device having one or more features as described herein.

FIGS. 23A and 23B show examples of various stages of the fabrication process of FIGS. 22A and 22B.

FIG. 49 shows an SOI FET device having a conductive layer as described herein.

FIGS. 50A-50D show examples of how a conductive layer of an SOI FET device can be coupled to other nodes of the SOI FET device.

FIGS. 51A-51D show examples of how a conductive layer of an SOI FET device can be coupled to other nodes of the SOI FET device through a phase-shifting circuit.

FIGS. 54A-54D show examples of how a conductive layer of an SOI FET device can be coupled to other nodes of the SOI FET device through a diode D.

FIGS. 55A-55D show examples of how a conductive layer of an SOI FET device can be coupled to other nodes of the SOI FET device through a diode D and a phase-shifting circuit.

FIG. 69A shows a process for forming a cavity in accordance with one or more embodiments disclosed herein.

FIG. 69B shows examples of various structures associated with a cavity formation processes in accordance with one or more embodiments disclosed herein.

FIG. 70 shows a process for forming a cavity in accordance with one or more embodiments disclosed herein.

FIG. 71 shows examples of various structures associated with a cavity formation processes in accordance with one or more embodiments disclosed herein.

FIG. 72 shows a process for forming a cavity in accordance with one or more embodiments disclosed herein.

FIG. 73 shows examples of various structures associated with a cavity formation processes in accordance with one or more embodiments disclosed herein.

FIGS. 76A-76C show embodiments of die structures in accordance with one or more embodiments.

FIGS. 77A-77C show embodiments of die structures in accordance with one or more embodiments.

DETAILED DESCRIPTION OF SOME EMBODIMENTS

The headings provided herein, if any, are for convenience only and do not necessarily affect the scope or meaning of the claimed invention.

INTRODUCTION

Disclosed herein are various examples of a field-effect transistor (FET) device having one or more regions relative to an active FET portion configured to provide a desired operating condition for the active FET. In such various examples, terms such as FET device, active FET portion, and FET are sometimes used interchangeably, with each other, or some combination thereof. Accordingly, such interchangeable usage of terms should be understood in appropriate contexts.

Figure 1:
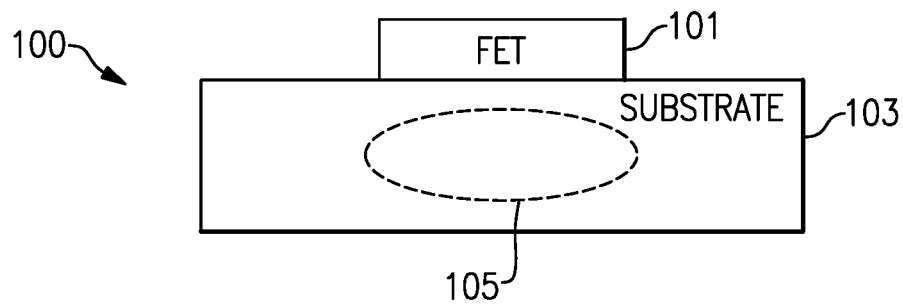
FIG. 1 shows an example of a field-effect transistor (FET) device having an active FET implemented on a substrate, and a region below the active FET configured to include one or more features to provide one or more desirable operating functionalities for the active FET.

FIG. 1 shows an example of a FET device 100 having an active FET 101 implemented on a substrate 103. As described herein, such a substrate can include one or more layers configured to facilitate, for example, operating functionality of the active FET, processing functionality for fabrication and support of the active FET, etc. For example, if the FET device 100 is implemented as a silicon-on-Insulator (SOI) device, the substrate 103 can include an insulator layer such as a buried oxide (BOX) layer, an interface layer, and a handle wafer layer.

FIG. 1 further shows that in some embodiments, a region 105 below the active FET 101 can be configured to include one or more features to provide one or more desirable operating functionalities for the active FET 101. For the purpose of description, it will be understood that relative positions above and below are in the example context of the active FET 101 being oriented above the substrate 103 as shown. Accordingly, some or all of the region 105 can be implemented within the substrate 103. Further, it will be understood that the region 105 may or may not overlap with the active FET 101 when viewed from above (e.g., in a plan view).

Figure 2:
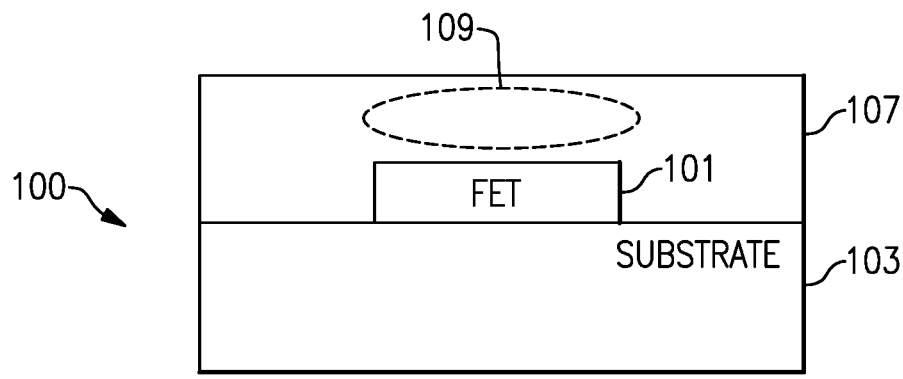
FIG. 2 shows an example of a FET device having an active FET implemented on a substrate, and a region above the active FET configured to include one or more features to provide one or more desirable operating functionalities for the active FET.

FIG. 2 shows an example of a FET device 100 having an active FET 101 implemented on a substrate 103. As described herein, such a substrate can include one or more layers configured to facilitate, for example, operating functionality of the active FET 100, processing functionality for fabrication and support of the active FET 100, etc. For example, if the FET device 100 is implemented as a silicon-on-Insulator (SOI) device, the substrate 103 can include an insulator layer such as a buried oxide (BOX) layer, an interface layer, and a handle wafer layer.

In the example of FIG. 2, the FET device 100 is shown to further include an upper layer 107 implemented over the substrate 103. In some embodiments, such an upper layer can include, for example, a plurality of layers of metal routing features and dielectric layers to facilitate, for example, connectivity functionality for the active FET 100.

FIG. 2 further shows that in some embodiments, a region 109 above the active FET 101 can be configured to include one or more features to provide one or more desirable operating functionalities for the active FET 101. Accordingly, some or all of the region 109 can be implemented within the upper layer 107. Further, it will be understood that the region 109 may or may not overlap with the active FET 101 when viewed from above (e.g., in a plan view).

Figure 3:
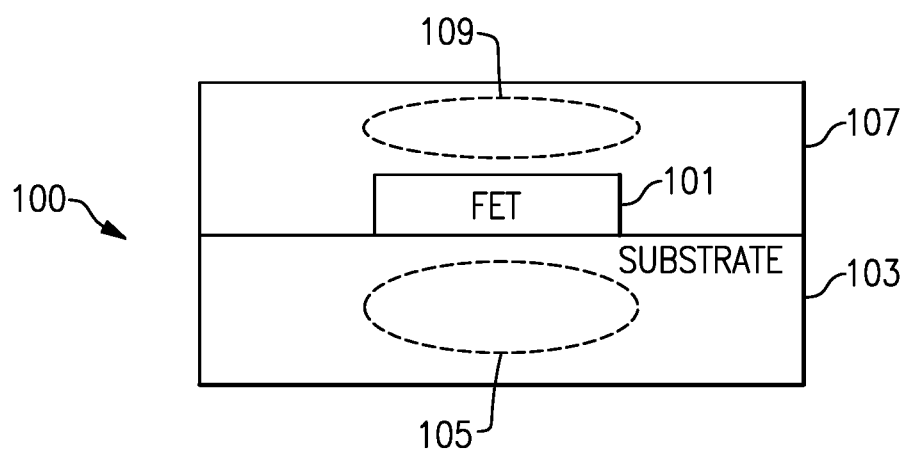
FIG. 3 shows that in some embodiments, a FET device can include both of the regions of FIGS. 1 and 2 relative an active FET.

FIG. 3 shows an example of a FET device 100 having an active FET 101 implemented on a substrate 103, and also having an upper layer 107. In some embodiments, the substrate 103 can include a region 105 similar to the example of FIG. 1, and the upper layer 107 can include a region 109 similar to the example of FIG. 2.

Examples related to some or all of the configurations of FIGS. 1-3 are described herein in greater detail.

Figure 4:
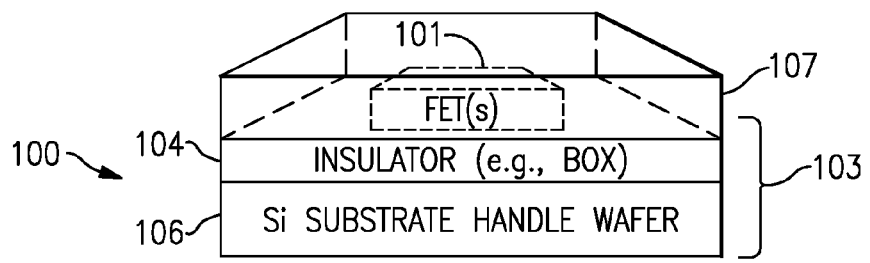
FIG. 4 shows an example FET device implemented as an individual silicon-on-insulator (SOI) unit.
Figure 5:
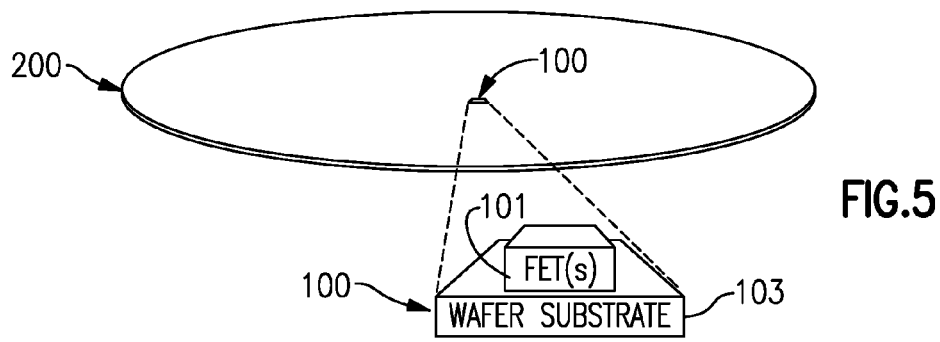
FIG. 5 shows that in some embodiments, a plurality of individual SOI devices similar to the example SOI device of FIG. 4 can be implemented on a wafer.

In the examples of FIGS. 1-3, the FET devices 100 are depicted as being individual units (e.g., as semiconductor die). FIGS. 4-6 show that in some embodiments, a plurality of FET devices having one or more features as described herein can be fabricated partially or fully in a wafer format, and then be singulated to provide such individual units.

For example, FIG. 4 shows an example FET device 100 implemented as an individual SOI unit. Such an individual SOI device can include one or more active FETs 101 implemented over an insulator such as a BOX layer 104 which is itself implemented over a handle layer such as a silicon (Si) substrate handle wafer 106. In the example of FIG. 4, the BOX layer 104 and the Si substrate handle wafer 106 can collectively form the substrate 103 of the examples of FIGS. 1-3, with or without the corresponding region 105.

In the example of FIG. 4, the individual SOI device 100 is shown to further include an upper layer 107. In some embodiments, such an upper layer can be the upper layer 103 of FIGS. 2 and 3, with or without the corresponding region 109.

FIG. 5 shows that in some embodiments, a plurality of individual SOI devices similar to the example SOI device 100 of FIG. 4 can be implemented on a wafer 200. As shown, such a wafer can include a wafer substrate 103 that includes a BOX layer 104 and a Si handle wafer layer 106 as described in reference to FIG. 4. As described herein, one or more active FETs can be implemented over such a wafer substrate.

In the example of FIG. 5, the SOI device 100 is shown without the upper layer (107 in FIG. 4). It will be understood that such a layer can be formed over the wafer substrate 103, be part of a second wafer, or any combination thereof.

Figure 6A:
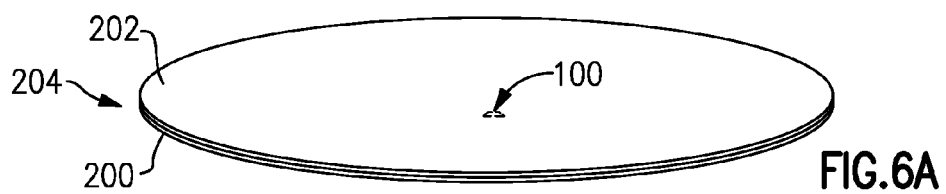
FIG. 6A shows an example wafer assembly having a first wafer and a second wafer positioned over the first wafer.
Figure 6B:
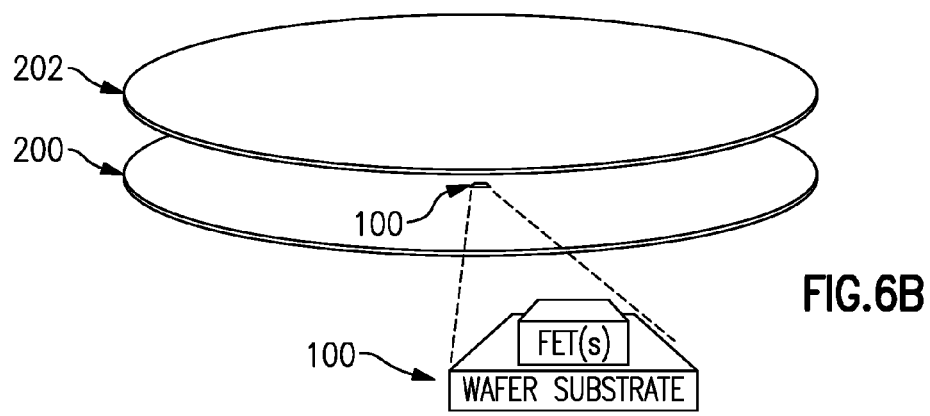
FIG. 6B shows an unassembled view of the first and second wafers of the example of FIG. 6A.

FIG. 6A shows an example wafer assembly 204 having a first wafer 200 and a second wafer 202 positioned over the first wafer 200. FIG. 6B shows an unassembled view of the first and second wafers 200, 202 of the example of FIG. 6A.

In some embodiments, the first wafer 200 can be similar to the wafer 200 of FIG. 5. Accordingly, the first wafer 200 can include a plurality of SOI devices 100 such as the example of FIG. 4. In some embodiments, the second wafer 202 can be configured to provide, for example, a region (e.g., 109 in FIGS. 2 and 3) over a FET of each SOI device 100, and/or to provide temporary or permanent handling wafer functionality for process steps involving the first wafer 200.

Examples of SOI Implementation of FET Devices

Silicon-on-Insulator (SOI) process technology is utilized in many radio-frequency (RF) circuits, including those involving high performance, low loss, high linearity switches. In such RF switching circuits, performance advantage typically results from building a transistor in silicon, which sits on an insulator such as an insulating buried oxide (BOX). The BOX typically sits on a handle wafer, typically silicon, but can be glass, borosilicon glass, fused quartz, sapphire, silicon carbide, or any other electrically-insulating material.

Typically, an SOI transistor is viewed as a 4-terminal field-effect transistor (FET) device with gate, drain, source, and body terminals. However, an SOI FET can be represented as a 5-terminal device, with an addition of a substrate node. Such a substrate node can be biased and/or be coupled one or more other nodes of the transistor to, for example, improve both linearity and loss performance of the transistor. Various examples related to such a substrate node and biasing/coupling of the substrate node are described herein in greater detail.

In some embodiments, such a substrate node can be implemented with a contact layer having one or more features as described herein to allow the contact layer to provide a desirable functionality for the SOI FET. Although various examples are described in the context of RF switches, it will be understood that one or more features of the present disclosure can also be implemented in other applications involving FETs.

Figure 7:
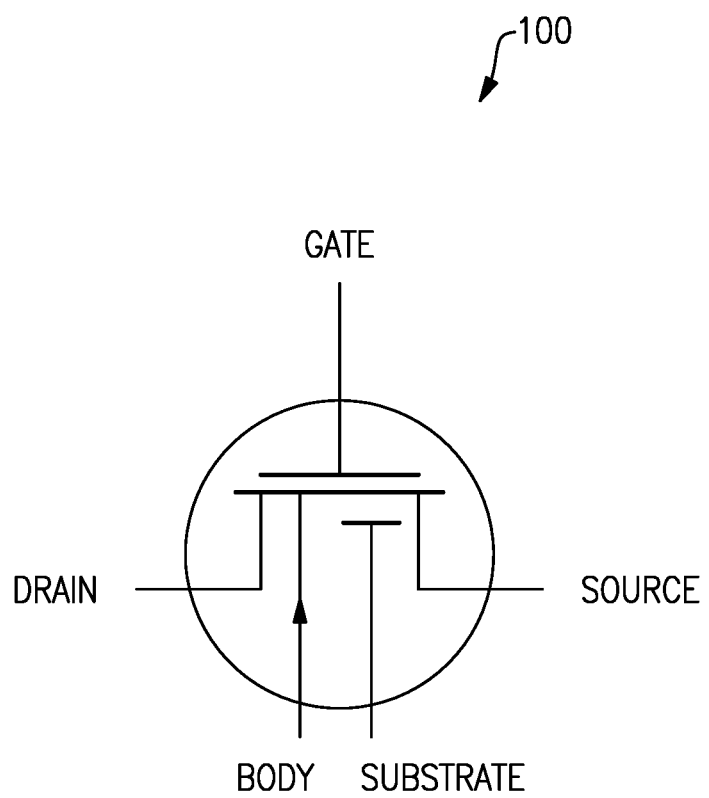
FIG. 7 shows a terminal representation of an SOI FET having nodes associated with a gate, a source, a drain, a body, and a substrate.

FIG. 7 shows a terminal representation of an SOI FET 100 having nodes associated with a gate, a source, a drain, a body, and a substrate. It will be understood that in some embodiments, the source and the drain can be reversed.

Figure 8A:
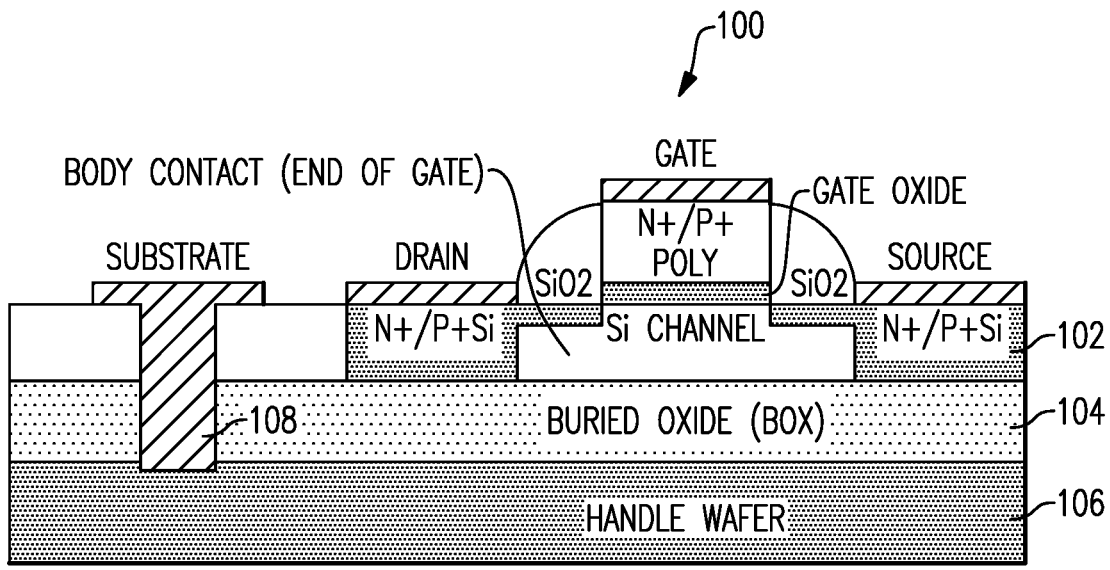
FIGS. 8A and 8B show side sectional and plan views, respectively, of an example SOI FET device having a node for its substrate.
Figure 8B:
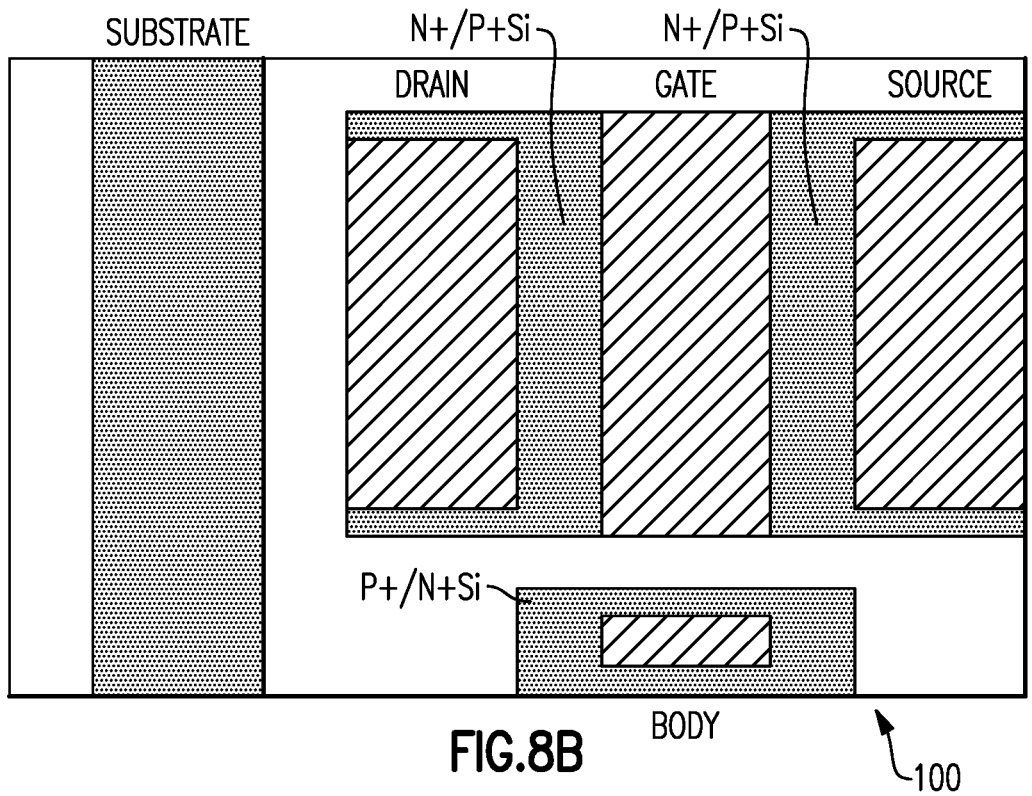

FIGS. 8A and 8B show side sectional and plan views of an example SOI FET device 100 having a node for its substrate. Such a substrate can be, for example, a silicon substrate associated with a handle wafer 106 as described herein. Although described in the context of such a handle wafer, it will be understood that the substrate does not necessarily need to have functionality associated with a handle wafer.

An insulator layer such as a BOX layer 104 is shown to be formed over the handle wafer 106, and a FET structure is shown to be formed based on an active silicon device 102 over the BOX layer 104. In various examples described herein, and as shown in FIGS. 8A and 8B, the FET structure can be configured as an NPN or PNP device.

In the example of FIGS. 8A and 8B, terminals for the gate, source, drain and body are shown to be configured and provided so as to allow operation of the FET. A substrate terminal is shown to be electrically connected to the substrate (e.g., handle wafer) 106 through an electrically conductive feature 108 extending through the BOX layer 104. Such an electrically conductive feature can include, for example, one or more conductive vias, one or more conductive trenches, or any combination thereof. Various examples of how such an electrically conductive feature can be implemented are described herein in greater detail.

In some embodiments, a substrate connection can be connected to ground to, for example, avoid an electrically floating condition associated with the substrate. Such a substrate connection for grounding typically includes a seal-ring implemented at an outermost perimeter of a given die.

In some embodiments, a substrate connection such as the example of FIGS. 8A and 8B can be utilized to bias the substrate 106, to couple the substrate with one or more nodes of the corresponding FET (e.g., to provide RF feedback), or any combination thereof. Such use of the substrate connection can be configured to, for example, improve RF performance and/or reduce cost by eliminating or reducing expensive handle-wafer treatment processes and layers. Such performance improvements can include, for example, improvements in linearity, loss and/or capacitance performance.

In some embodiments, the foregoing biasing of the substrate node can be, for example, selectively applied to achieve desired RF effects only when needed or desired. For example, bias points for the substrate node can be connected to envelope-tracking (ET) bias for power amplifier (PA) to achieve distortion cancellation effects.

In some embodiments, a substrate connection for providing the foregoing example functionalities can be implemented as a seal-ring configuration similar to the grounding configuration, or other connection configurations. Examples of such substrate connections are described herein in greater detail.

Figure 9:
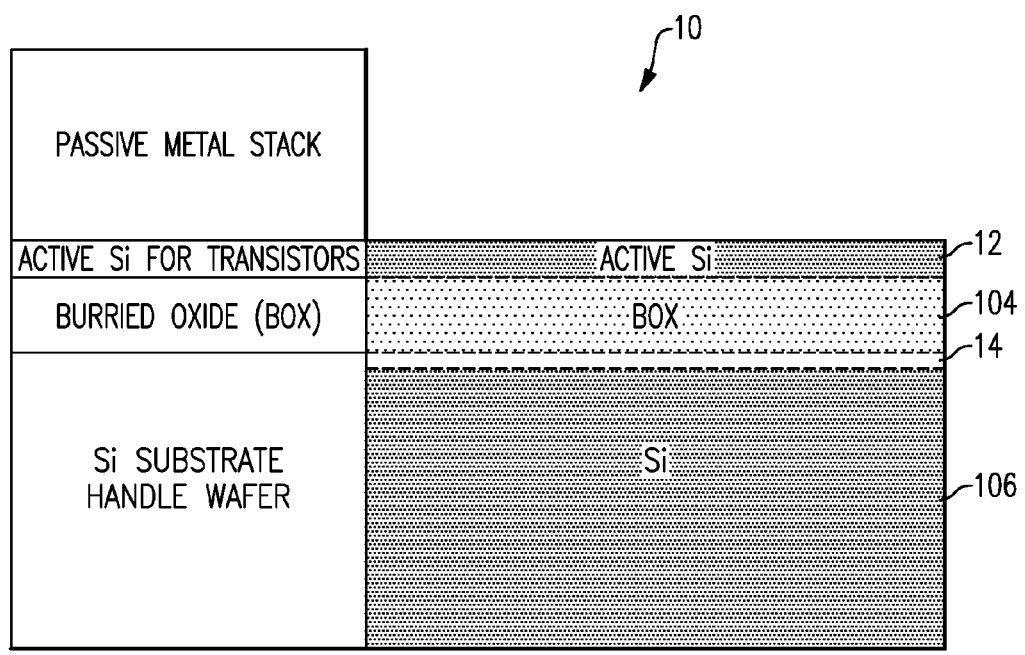
FIG. 9 shows a side sectional view of an SOI substrate that can be utilized to form an SOI FET device having an electrical connection for a substrate layer.
Figure 10:
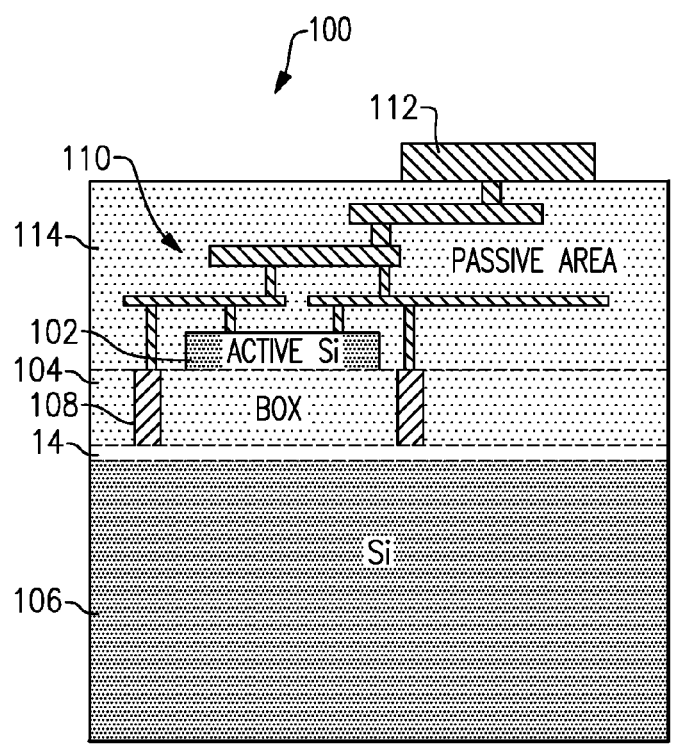
FIG. 10 shows a side sectional view of an SOI FET device having an electrical connection for a substrate layer.

FIG. 9 shows a side sectional view of an SOI substrate 10 that can be utilized to form an SOI FET device 100 of FIG. 10 having an electrical connection for a substrate layer 106 (e.g., Si handle layer). In FIG. 9, an insulator layer such as a BOX layer 104 is shown to be formed over the Si handle layer 106. An active Si layer 12 is shown to be formed over the BOX layer 104. It will be understood that in some embodiments, the foregoing SOI substrate 10 of FIG. 9 can be implemented in a wafer format, and SOI FET devices having one or more features as described herein can be formed based on such a wafer.

In FIG. 10, an active Si device 102 is shown to be formed from the active Si layer 12 of FIG. 9. One or more electrically conductive features 108 such as vias are shown to be implemented through the BOX layer 104, relative to the active Si device 102. In some embodiments, such conductive features (108) can allow the Si handle layer 106 to be coupled to the active Si device (e.g., a FET), be biased, or any combination thereof. Such coupling and/or biasing can be facilitated by, for example, a metal stack 110. In some embodiments, such a metal stack can allow the conductive features 108 to be electrically connected to a terminal 112. In the example of FIG. 10, one or more passivation layers, one or more dielectric layers, or some combination thereof (collectively indicated as 114) can be formed to cover some or all of such a metal stack.

In some embodiments, a trap-rich layer 14 can be implemented between the BOX layer 104 and the Si handle layer 106. However, and as described herein, the electrical connection to the Si handle layer 106 through the conductive feature(s) 108 can eliminate or reduce the need for such a trap-rich layer which is typically present to control charge at an interface between the BOX layer 104 and the Si handle layer 106, and which can involve costly process steps.

Aside from the foregoing example of eliminating or reducing the need for a trap-rich layer, the electrical connection to the Si handle layer 106 can provide a number of advantageous features. For example, the conductive feature(s) 108 can allow forcing of excess charge at the BOX/Si handle interface to thereby reduce unwanted harmonics. In another example, excess charge can be removed through the conductive feature(s) 108 to thereby reduce the off-capacitance (Coff) of the SOI FET. In yet another example, the presence of the conductive feature(s) 108 can lower the threshold of the SOI FET to thereby reduce the on-resistance (Ron) of the SOI FET.

Figure 11:
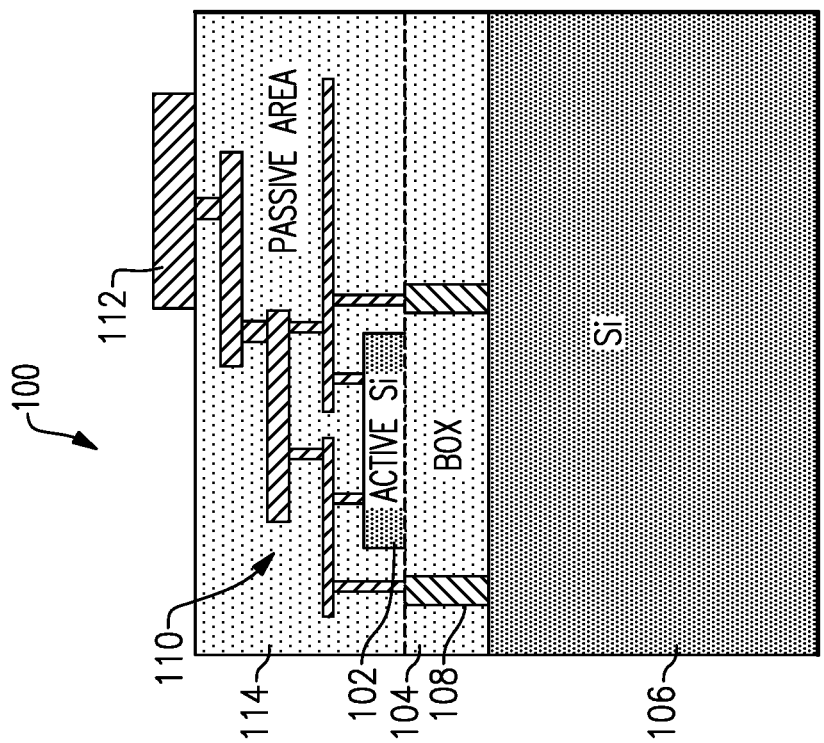
FIG. 11 shows an example SOI FET device that is similar to the example of FIG. 10, but in which a trap-rich layer is substantially absent.

FIG. 11 shows an example FET device 100 that is similar to the example of FIG. 10, but in which a trap-rich layer (14 in FIG. 10) is substantially absent. Accordingly, in some embodiments, the BOX layer 104 and the Si handle layer 106 can be in substantially direct engagement with each other.

In the example of FIG. 11, the conductive features (e.g., vias) 108 are depicted as extending through the BOX layer 104 and contacting the Si handle layer 106 generally at the BOX/Si handle interface. It will be understood that in some embodiments, such conductive features can extend deeper into the Si handle layer 106.

Figure 12:
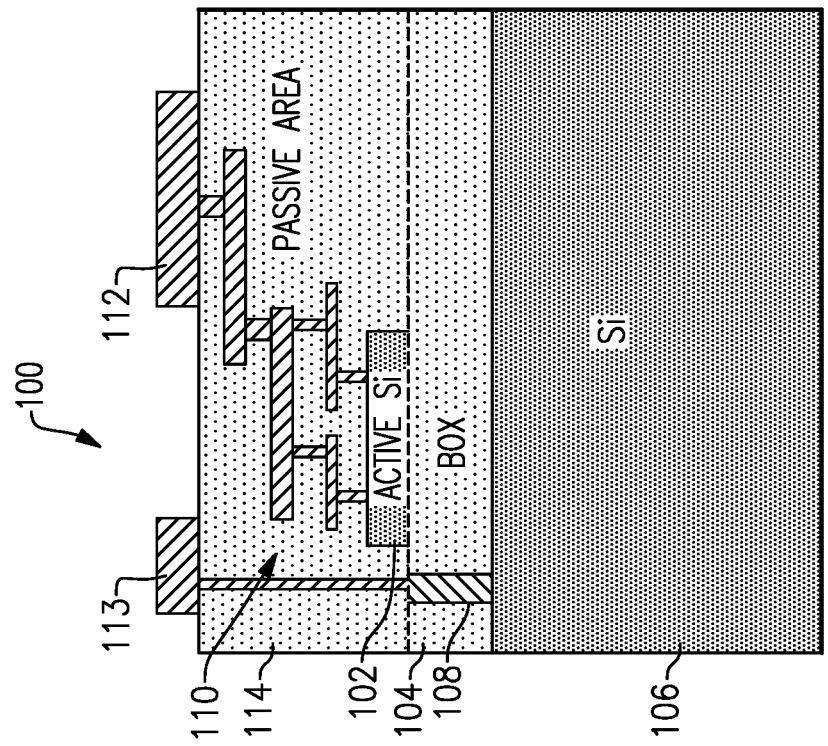
FIG. 12 shows that in some embodiments, an electrical connection to a substrate can be implemented without being coupled to other portions of an active FET.

In the examples of FIGS. 10 and 11, the conductive features 108 are depicted as being coupled to other electrical connections associated with the active Si device 102. FIG. 12 shows that in some embodiments, an electrical connection to a substrate (e.g., Si handle layer 106) can be implemented without being coupled to such other electrical connections associated with the active Si device 102. For example, a conductive feature 108 such as a via is shown to extend through the BOX layer 104 so as to form a contact with the Si handle layer 106. The upper portion of the through-BOX conductive feature 108 is shown to be electrically connected to a terminal 113 that is separate from a terminal 112.

In some embodiments, the electrical connection between the separate terminal 113 and the Si handle layer 106 (through the conductive feature 108) can be configured to allow, for example, separate biasing of a region in the substrate (e.g., Si handle layer 106) to achieve a desired operating functionality for the active Si device 102. Such an electrical connection between the separate terminal 113 and the Si handle layer 106 is an example of a non-grounding configuration utilizing one or more through-BOX conductive features 108.

In the examples of FIGS. 10-12, the through-BOX conductive features (108) are depicted as either being coupled to electrical connections associated with the active Si device 102, or as being separate from such electrical connections. It will be understood that other configurations can also be implemented. For example, one or more through-BOX conductive features (108) can be coupled to one node of the active Si device 102 (e.g., source, drain or gate), but not other node(s). Non-limiting examples of circuit representations of such coupling (or non-coupling) between the substrate node and other nodes of the active Si device are disclosed herein in greater detail.

In the example of FIG. 10, the trap-rich layer 14 can be implemented as an interface layer between the BOX layer 104 and the Si handle layer 106, to provide one or more functionalities as described herein. In the examples of FIGS. 11 and 12, such a trap-rich interface layer 14 can be omitted as described herein.

Figure 13:
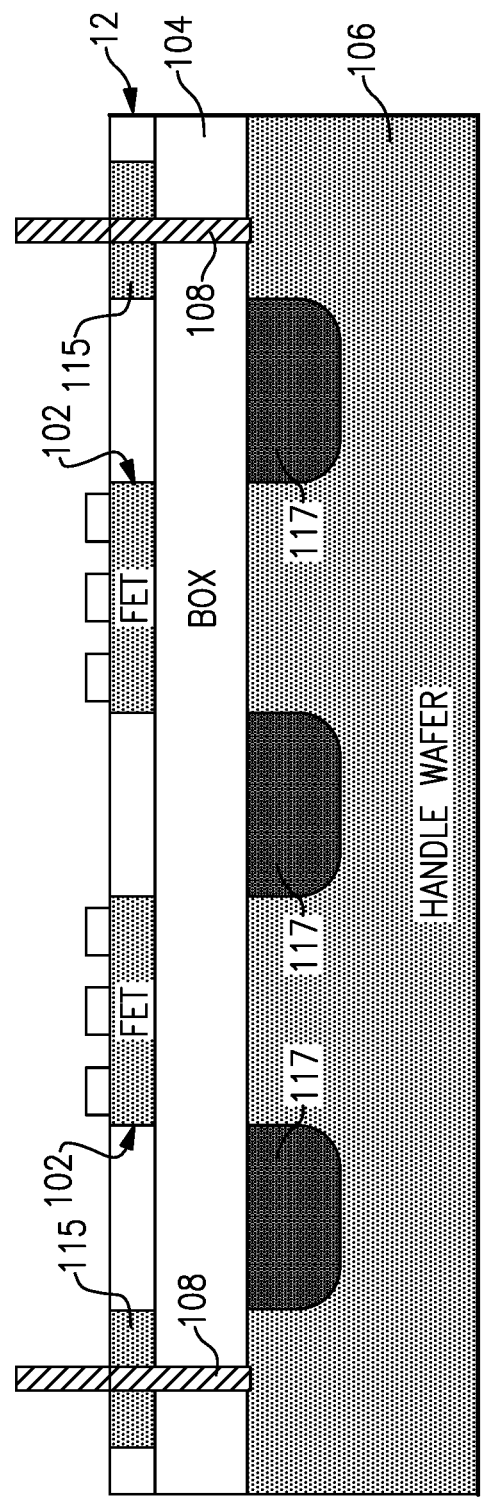
FIG. 13 shows that in some embodiments, a handle wafer can include a plurality of doped regions implemented to provide one or more functionalities similar to a trap-rich interface layer in the example of FIG. 10.

FIG. 13 shows that in some embodiments, a handle wafer 106 (e.g., Si handle layer) can include a plurality of doped regions 117 implemented to provide one or more functionalities similar to a trap-rich interface layer (e.g., 14 in FIG. 10). Such doped regions can be, for example, generally amorphous and have relatively high resistivity when compared to other portions of the handle wafer 106. In some embodiments, such doped regions can include crystalline structure, amorphous structure, or any combination thereof.

In the example of FIG. 13, two FETs 102 and islands 115 are shown to be formed from an active Si layer 12 which is implemented over a BOX layer 104. The BOX layer is shown to be implemented over the handle wafer 106 having the doped regions 117. In some embodiments, such doped regions (117) can be implemented to be laterally positioned generally under gaps between the FETs 102 and/or the islands 115.

FIG. 13 further shows that in some embodiments, the handle wafer 106 having doped regions such as the foregoing doped regions 117 can be biased as described herein through one or more conductive features 108 such as vias. As described herein, such conductive features 108 can be coupled to other portions of FET(s), to a separate terminal, or any combination thereof, so as to provide biasing to the handle wafer substrate 106 to achieve one or more desired operating functionalities for the FET(s).

In the example of FIG. 13, a given conductive feature 108 can interact with a FET 102 through the handle wafer 106. For example, the BOX layer being interposed between the FET 102 and the handle wafer 106 can result in a capacitance C therebetween. Further, a resistance R can exist between the end of the conductive feature 108 and the BOX/handle wafer interface. Accordingly, a series RC coupling can be provided between the conductive feature 108 and the underside of the FET 102. Thus, providing a bias signal to handle wafer 106 through the conductive feature 108 can provide a desirable operating environment for the FET 102.

In the example of FIG. 13, a given conductive feature 108 is depicted as being laterally separated from the nearest FET 102 so as to include at least one doped region 117 in the handle wafer 106. Accordingly, the resulting resistive path (with resistance R) can be relatively long. Thus, the resistance R can be a high resistance.

Referring to the examples of FIGS. 10-13, it is noted that in some embodiments, a given conductive feature 108 can be implemented so as to be laterally separated from the nearest FET 102 by a separation distance. Such a separation distance can be, for example, at least 1 µm, 2 µm, 3 µm, 4 µm, 5 µm, 6 µm, 7 µm, 8 µm, 9 µm, or 10 µm. In some embodiments, the separation distance can be in a range of 5 µm to 10 µm. For the purpose of description, it will be understood that such a separation distance can be, for example, a distance between the closest portions of the conductive feature 108 and the corresponding FET 102 in the active Si layer (12).

Figure 14A:
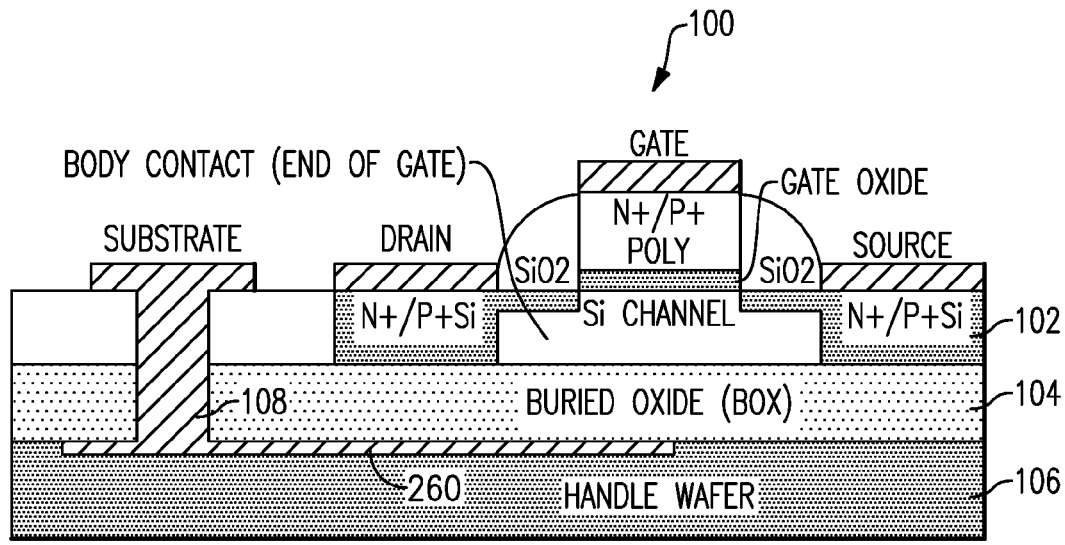
FIGS. 14A and 14B show side sectional and plan views of an example SOI FET having a contact layer implemented underneath an insulator layer such as a buried oxide (BOX) layer.
Figure 14B:
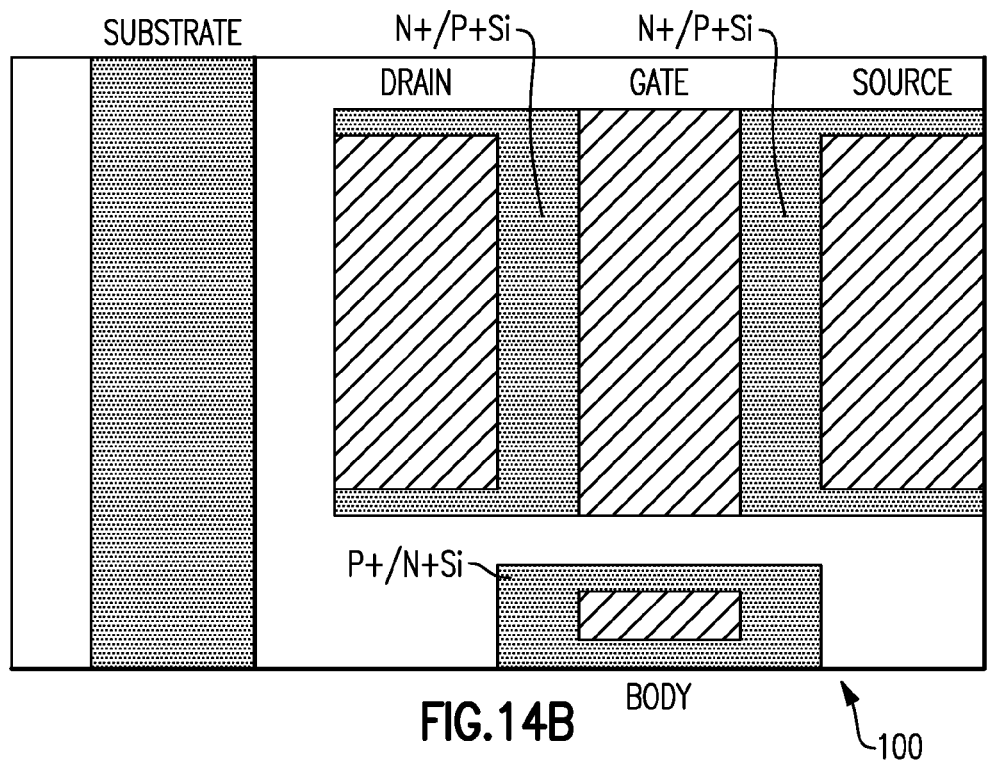

Described herein are, among others, examples related to SOI FET devices having a contact layer. FIGS. 14A and 14B show side sectional and plan views of an example SOI FET 100 having such a contact layer (260), in the context of the example SOI FET 100 of FIGS. 8A and 8B. Examples of how such a contact layer can be formed, as well as how such a contact layer can be configured in different manners, are described herein in greater detail.

In some embodiments, a contact layer having one or more features as described herein can be implemented on a side of a BOX layer opposite from the side on which a FET is formed. In the context of the FET being formed on the front or upper side of such a BOX layer, the contact layer can be implemented on the back or lower side of the BOX. Accordingly, relational terms "back," "backside," "lower," "lower side," etc. referring to position of a contact layer will be understood in the foregoing context.

It will also be understood that a contact layer having one or more features as described herein can also be referred to as a conductive contact layer, a substrate contact layer, a conductive layer, or some combination thereof. In some embodiments, such a contact layer can be implemented to be between a BOX layer and a substrate contact layer. In some embodiments, such a contact layer can be implemented on the backside of a BOX layer without a substrate layer. Accordingly, it will be understood that the foregoing examples of interchangeable terms for the contact layer (including the substrate contact layer) can refer to implementations with or without a substrate layer.

In the example of FIG. 14, the contact layer 260 is depicted as being in electrical contact with the conductive feature 108. Such a conductive feature (108) can allow the contact layer 260 to be in electrical contact with, for example, a substrate node. As described herein, such a substrate node can be electrically connected to a bias circuit and/or be coupled to one or more portions of the FET. Although various examples are described herein in the context of the contact layer 260 being electrically connected through one or more through-BOX conductive feature (such as the conductive feature 108 of FIG. 14), it will be understood that a contact layer (such as the contact layer 260 of FIG. 14) can be electrically connected in other configurations so as to provide an electrical connection to a bias circuit and/or one or more portions of a corresponding FET.

FIG. 15 shows that in some embodiments, a contact layer 260 having one or more features as described herein can be implemented in an FET device 100 that is similar to the example of FIG. 11 (e.g., in which a trap-rich layer (14 in FIG. 10) is substantially absent). Accordingly, in some embodiments, the contact layer 260 can be in substantially direct contact with the BOX layer 104 on one side, and in substantially direct contact with the Si handle layer 106 on the other side.

In the example of FIG. 15, the conductive features (e.g., vias) 108 are depicted as extending through the BOX layer 104 and contacting the contact layer 260. As described herein, such conductive features can be coupled to other electrical connections associated with the active Si device 102.

FIG. 16 shows that in some embodiments, an electrical connection to a contact layer 260 can be implemented without being coupled to such other electrical connections associated with the active Si device 102. For example, a conductive feature 108 (such as a via) is shown to extend through the BOX layer 104 so as to form a contact with the contact layer 260. The upper portion of the through-BOX conductive feature 108 is shown to be electrically connected to a terminal 113 that is separate from a terminal 112.

In some embodiments, the electrical connection between the separate terminal 113 and the contact layer 260 (through the conductive feature 108) can be configured to allow, for example, separate biasing or controlling of a region underneath the active Si device 102 to achieve a desired operating functionality for the active Si device 102. Examples related to such operating functionality are described herein in greater detail.

In the examples of FIGS. 15 and 16, the through-BOX conductive features (108) are depicted as either being coupled to electrical connections associated with the active Si device 102, or as being separate from such electrical connections. It will be understood that other configurations can also be implemented. For example, one or more through-BOX conductive features (108) can be coupled to one node of the active Si device 102 (e.g., source, drain or gate), but not other node(s). Non-limiting examples of circuit representations of such coupling (or non-coupling) between a node associated with the contact layer 260 and other nodes of the active Si device are disclosed herein in greater detail.

Figure 17:
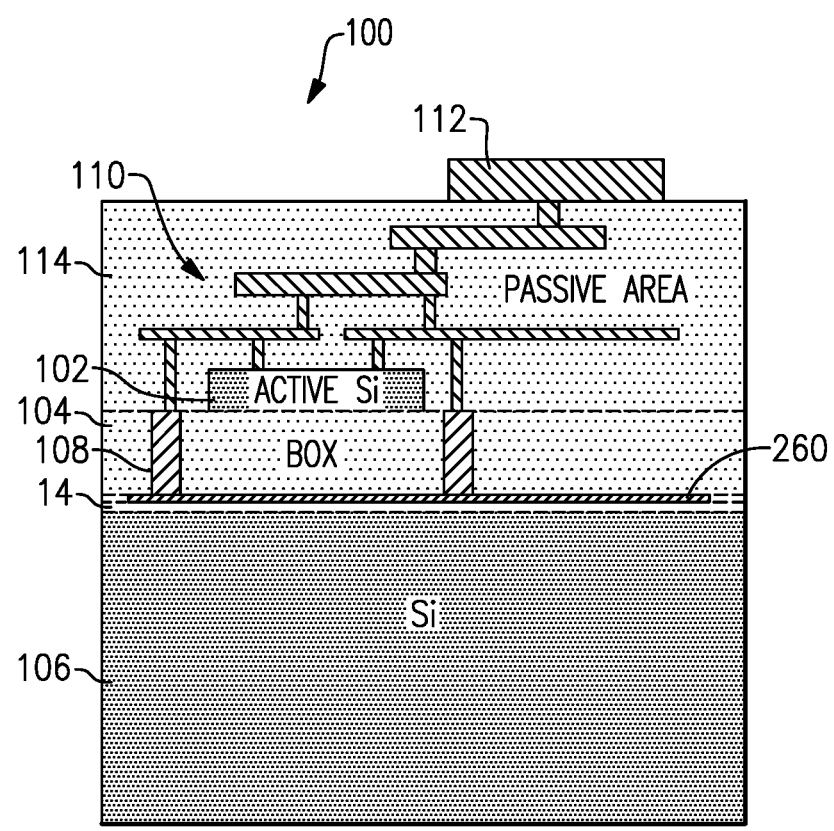
FIG. 17 shows an example SOI FET device that is similar to the example of FIG. 10, but with a contact layer implemented underneath a BOX layer.

FIG. 17 shows that in some embodiments, a contact layer 260 having one or more features as described herein can be implemented in an FET device 100 that is similar to the example of FIG. 10 (e.g., in which a trap-rich layer 14 is present). In the example of FIG. 17, the contact layer 260 can be implemented to be between the trap-rich layer 14 and the BOX layer 104.

In the example of FIG. 17, the contact layer 260 is shown to be coupled to one or more portions of the active Si device 102 (e.g., through one or more through-BOX conductive features 108). It will be understood that in some embodiments, the contact layer of FIG. 17 can be coupled to a separate terminal such as the separate terminal 113 of FIG. 16.

FIGS. 18 and 19 show that in some embodiments, a contact layer 260 having one or more features as described herein can be implemented in an FET device 100 that is similar to the example of FIG. 13 (e.g., in which a plurality of doped regions 117 are present). In the example of FIG. 18, the contact layer 260 can be implemented to be substantially between the plurality of doped regions 117 and the BOX layer 104. In the example of FIG. 19, the contact layer 260 can be configured to allow the plurality of doped regions 117 to be substantially in contact with the BOX layer 104. In some embodiments, such a configuration can be achieved by, for example, the contact layer 260 having a plurality of openings to allow the corresponding doped regions 117 to be in contact with the BOX layer 104. An example of such a perforated configuration of the contact layer 260 is described herein in greater detail.

In the examples of FIGS. 18 and 19, the contact layer 260 can be coupled to one or more portions of an active device 102, be coupled to a separate terminal, or be configured in some combination thereof, similar to the examples of FIGS. 15 and 16.

Examples Related to Fabrication of SOI FET Devices

Figures 20, 21:
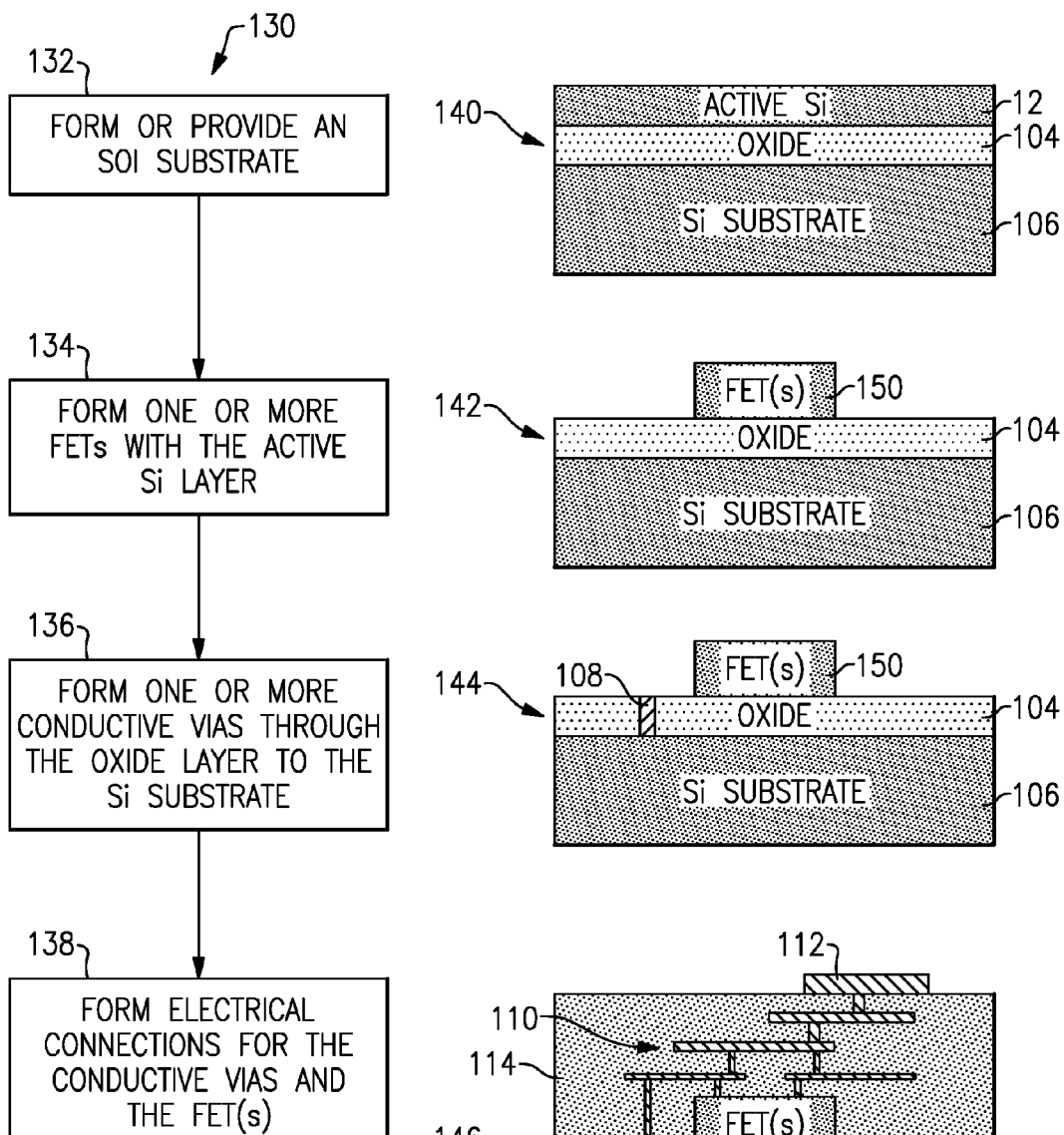
FIG. 20 shows a process that can be implemented to facilitate fabrication of an SOI FET device having one or more features as described herein.
FIG. 21 shows examples of various stages of the fabrication process of FIG. 20.

FIGS. 20 and 22 show processes 130 and 200 that can be implemented to fabricate an SOI device having one or more features as described herein. FIGS. 21 and 23 show examples of various stages of the fabrication processes of FIGS. 20 and 22. In some embodiments, some or all of the various process steps can be implemented utilizing wafer processing technologies.

In some embodiments, fabrication of an SOI device having one or more features as described herein can include fabrication of a wafer having an electrical connection formed between a contact layer and a terminal. An example of a wafer that can be utilized to achieve such a connection between the contact layer and the terminal is shown in FIG. 21 as 146, and examples of process steps in FIG. 20 can be implemented to achieve such a wafer configuration.

In block 132 of FIG. 20, an SOI substrate can be formed or provided. In state 140 of FIG. 21, such an SOI substrate can include an Si substrate 106 such as an Si handle wafer, an oxide layer 104 over the Si substrate 106, and an active Si layer 12 over the oxide layer 104. Such an SOI substrate may or may not have a trap-rich layer (e.g., 14 in FIGS. 9 and 10) between the oxide layer 104 and the Si substrate 106. Similarly, such an SOI substrate may or may not have doped regions (e.g., 117 in FIG. 13) in the Si substrate 106.

In block 134 of FIG. 20, one or more FETs can be formed with the active Si layer. In state 142 of FIG. 21, such a FET is depicted as 150.

In block 136 of FIG. 20, one or more conductive features such as vias can be formed through the oxide layer, to the Si substrate, and relative to the FET(s). In state 144 of FIG. 21, such a conductive via is depicted as 108. As described herein, such an electrical connection through the oxide layer 104 to the Si substrate 106 can also be implemented utilizing other conductive features such as one or more conductive trenches.

In the example of FIGS. 20 and 21, it will be understood that blocks 134 and 136 may or may not be performed in the example sequence shown. In some embodiments, conductive feature(s) such as a deep trench can be formed and filled with poly prior to the formation of the FET(s). In some embodiments, such conductive feature(s) can be formed (e.g., cut and filled with a metal such as tungsten (W) after the formation of the FET(s). It will be understood that other variations in sequences associated with the example of FIGS. 20 and 21 can also be implemented.

In block 138 of FIG. 20, electrical connections can be formed for the conductive vias and the FET(s). In state 146 of FIG. 21, such electrical connections are depicted as a metallization stack collectively indicated as 110. Such a metal stack can electrically connect the FET(s) 150 and the conductive vias 108 to one or more terminals 112. In the example state 146 of FIG. 21, a passivation layer 114 is shown to be formed to cover some or all of the metallization stack 110.

Figures 22A, 23A:
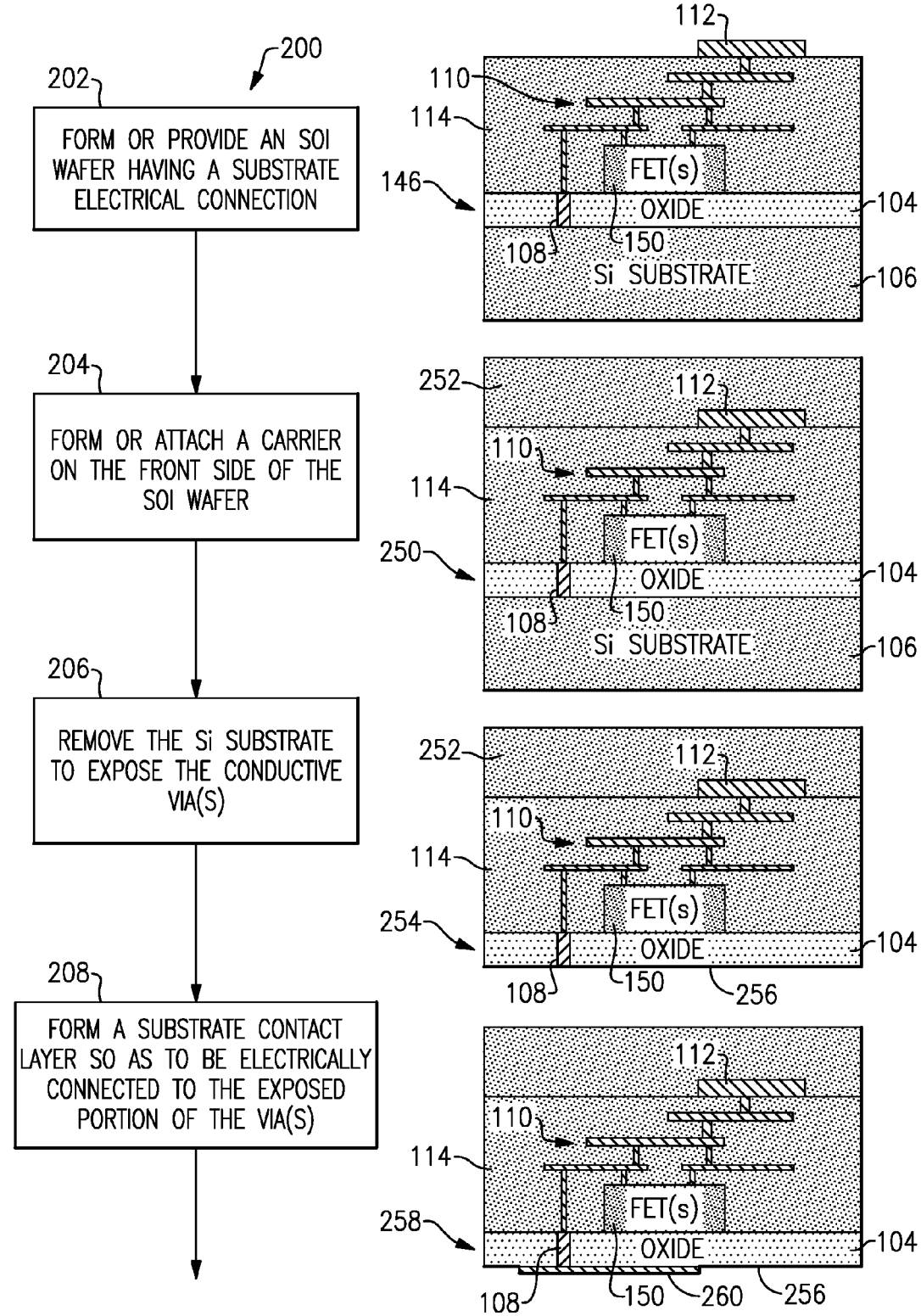

Referring to FIGS. 22 and 23, process 200 can be a continuation of the process 130 associated with FIGS. 20 and 21 (e.g., both processes implemented at one fabrication facility), a separate process that utilizes as an input a wafer (e.g., configuration 146 in FIG. 21) resulting from the process 130 (e.g., two processes implemented at different fabrication facilities), or any combination thereof. Accordingly, in block 202 of the process 200 of FIG. 22A, an SOI wafer having an electrical connection for a substrate layer can be formed or provided. In FIG. 23A, state 146 can be similar to state 146 of FIG. 21.

In block 204 of FIG. 22A, a carrier layer can be formed or attached on the front side of the SOI wafer. For the purpose of description, the front side of the SOI wafer can include the side opposite from the substrate layer. In state 250 of FIG. 23A, such a carrier layer is depicted as 252. As described herein, such a carrier layer on the front side of the SOI wafer can allow fabrication steps to be performed on the back side to facilitate formation of a contact layer.

In some embodiments, the carrier layer can be a temporarily attached layer, or a permanently attached layer. In some embodiments, the carrier layer can be any material suitable for being attached (temporarily or permanently) to one side of a wafer so as to allow one or more process steps to be performed on the other side of the wafer. Such a carrier layer can include, for example, another wafer, silicon, glass, quartz, silicon carbide, sapphire, etc. Such a carrier layer can be attached to the front side of the SOI wafer utilizing, for example, a spun-on adhesive.

In block 206 of FIG. 22A, some or all of the substrate layer can be removed from the back side of the SOI wafer. In FIG. 23A, such a substrate layer is depicted as 106 in state 250. In state 254, such a substrate layer is shown to be removed so as to expose a surface 256.

In some embodiments, the substrate layer can be removed sufficiently to expose the conductive feature(s) 108 such as conductive via(s). In some embodiments, such removal of the substrate layer may or may not expose the oxide layer 104. Such removal of the substrate layer can be achieved by, for example, grinding, chemical mechanical polishing (CMP), selective etching using an appropriate chemistry, or some combination thereof.

In block 208 of FIG. 22A, a contact layer can be formed on the surface resulting from the removal of the substrate layer. In state 258 of FIG. 23A, such a contact layer is depicted as 260 formed on the exposed surface 256.

As described herein, such a contact layer can be formed so as to be in electrical contact with the conductive feature(s) 108. In some embodiments, the contact layer 260 can include one or more layers that can be, for example, patterned, deposited, implanted, and/or formed by surface treatment on the exposed surface 256 of the oxide layer 104. Such a contact layer on the oxide layer 104 can have, for example, conductive, resistive, dielectric, inductive, rectifying, semi-insulating, semiconducting, trap and/or hole type properties.

In block 210 of FIG. 22B, an interface layer can be formed over the contact layer. In state 262 of FIG. 23B, such an interface layer is depicted as 264 formed so as to substantially cover the contact layer 260 and the surface 256. In some embodiments, such an interface layer (264) can be configured to facilitate attachment of a replacement substrate layer.

In block 212 of FIG. 22B, a replacement substrate layer can be formed on or attached to the interface layer. In state 266 of FIG. 23B, such a replacement substrate layer is depicted as 268.

In some embodiments, the substrate layer 268 can be a wafer, and such a wafer can be wafer-bonded to the oxide layer 104 of the SOI wafer, with or without the interface layer 104. Such wafer-bonding can be achieved by one or more wafer-bonding techniques. In some embodiments, the replacement substrate wafer can include, for example, silicon, glass, quartz, sapphire, silicon carbide, and/or gallium arsenide. Other materials can also be utilized for the replacement substrate wafer.

In block 214 of FIG. 22B, the carrier layer can be removed from the SOI wafer's front side. In state 270 of FIG. 23B, the front side of the SOI wafer is shown to have the carrier layer removed so as to substantially expose the terminals 112. Such removal of the carrier layer from the front side of the SOI wafer can be facilitated by the replacement substrate layer 268 now providing, among others, handle layer functionality.

In the example state 270 of FIG. 23B, it is assumed that the carrier layer about the terminal 112 was a temporary layer. Such a temporary layer can be removed substantially completely from the front side of the SOI wafer. In some embodiments, at least some of the carrier layer can remain on the front side of the SOI wafer. In some embodiments, the front side of the SOI wafer can be further processed.

In the fabrication example described in reference to FIGS. 22 and 23, layer transfer techniques are utilized. However, it will be understood that use of other process techniques can be utilized to form a contact layer on or near the back side surface of an oxide layer of an SOI device.

Figure 24:
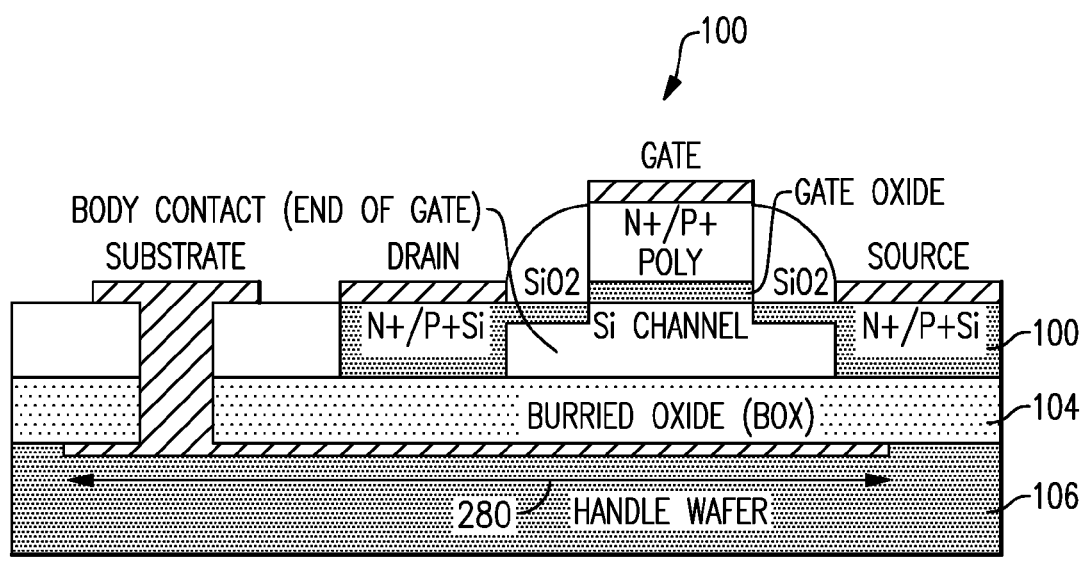
FIG. 24 shows that in some embodiments, a contact layer having one or more features as described herein can be implemented with, for example, desired dimensions and/or separation from an active FET to provide one or more functionalities.

In some embodiments, a contact layer as described herein can be utilized to, for example, provide bias for the substrate of an SOI device. In some embodiments, a contact layer as described herein can also be utilized for other applications. For example, FIG. 24 shows that a contact layer 260 can be configured to be utilized as a back-gate to a transistor. Such a back-gate can provide one or more functionalities such as assisting in depleting or increasing charge in the active channel of an SOI FET 100. In some embodiments, the contact layer 260 can be dimensioned appropriately (e.g., depicted as dimension 280) to provide such back-gate functionality. In some embodiments, the contact layer 260 can be separated from the active channel of an SOI FET 100 by a desired distance 282 to provide a desired functionality such as the back-gate functionality. In some embodiments, such a separation distance (282) can be achieved by, for example, a selected thickness of the BOX layer 104. In some embodiments, both of the dimension 280 and the separation distance 282 can be selected appropriately to achieve one or more functionalities for the FET.

Figure 25A:
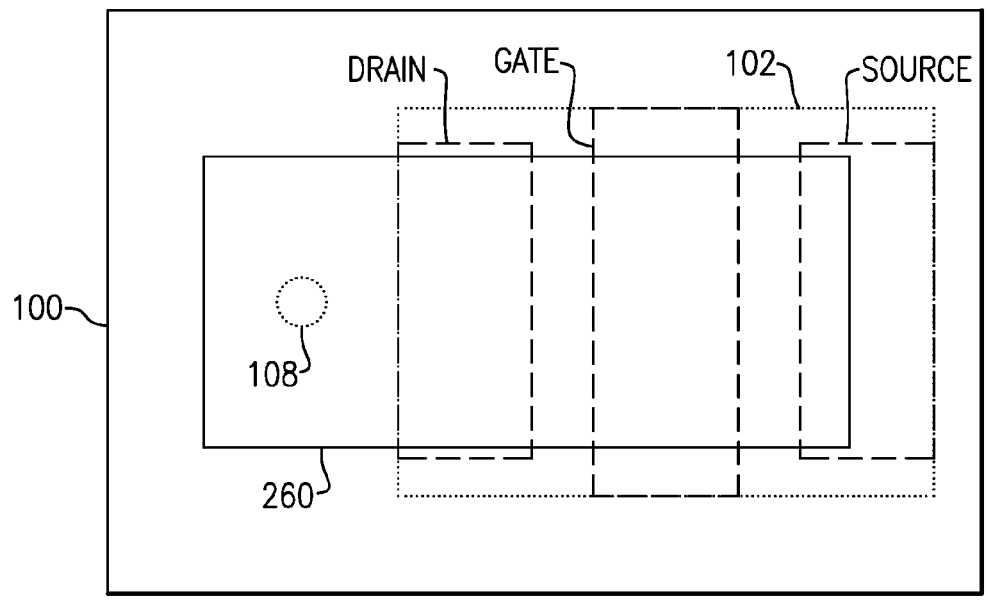
FIGS. 25A and 25B show examples of how a contact layer having one or more features as described herein can be dimensioned to provide one or more desirable functionalities.
Figure 25B:
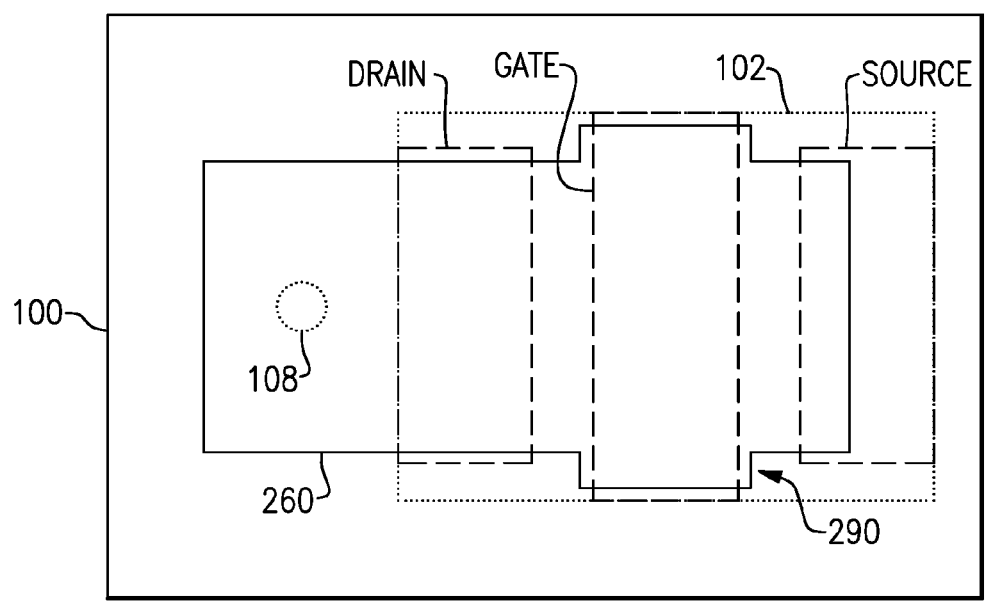

FIGS. 25A and 25B show additional examples of how a contact layer 260 having one or more features as described herein can be dimensioned to provide one or more desirable functionalities. In the example of FIG. 25A, the contact layer 260 is depicted as having a rectangular footprint shape dimensioned to be in electrical contact with a conductive feature 108, and to provide at least some overlap with a gate region associated with a FET 102.

FIG. 25B shows that in some embodiments, a footprint shape of a contact layer can be selected to facilitate one or more functionalities. For example, suppose that an additional overlap is desired between a substrate contact layer and a gate region of the FET 102 (e.g., compared to the example of FIG. 25A). To achieve such an increased overlap, a contact layer 260 can include an extended area 290 (e.g., depicted as additional areas above and below the original rectangular shape of the contact layer 260) to accommodate such an additional overlap.

In some embodiments, other design parameters associated with a contact layer can be implemented to achieve one or more desired functionalities. For example, design parameters such as contact layer material(s), thickness of the oxide layer, and/or the biasing networks can be configured appropriately for devices such as MOSFET devices to lower resistance, improve linearity performance, lower threshold voltage, increase breakdown voltage, and/or improve isolation performance of the transistor.

In the various examples described in reference to FIGS. 14, 24 and 25, the contact layer 260 is depicted as being located generally under a circuit element such as a FET. However, it will be understood that a contact layer having one or more features as described herein can also be implemented in other configurations. For example, different patterns of electrical connections can be implemented for substrates. In some embodiments, contact layers can be configured to facilitate such patterns of electrical connections for substrates; and such patterns may or may not be under circuit elements.

FIGS. 26A-26F show non-limiting examples of how contact layers having one or more features as described herein can be implemented relative to circuit elements. In each of the examples, a contact layer 260 is shown to be electrically connected through one or more conductive vias 108; however, it will be understood that such electrical connections can also be implemented by other conductive features such as trenches.

Figure 26A:
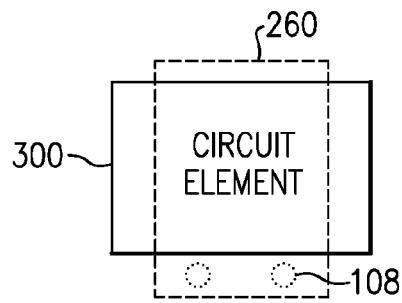
FIGS. 26A-26F show non-limiting examples of how contact layers can be implemented relative to circuit elements.

FIG. 26A shows an example where a contact layer 260 can be located generally below a circuit element 300. Such a configuration can represent, for example, the examples described herein in reference to FIGS. 14, 24 and 25.

Figure 26B:
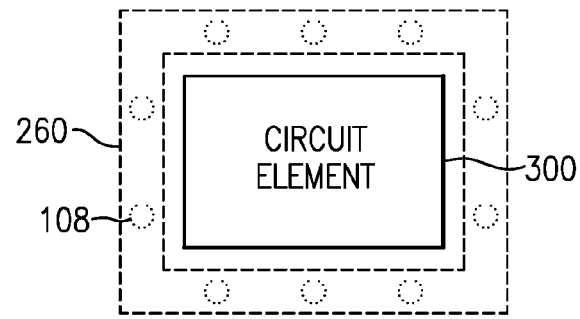

FIG. 26B shows an example where a contact layer 260 can be a strip that forms a perimeter around a circuit element 300. In some embodiments, such a configuration can be implemented with, for example, an example pattern of conductive vias that generally surround the circuit element 300.

Figure 26C:
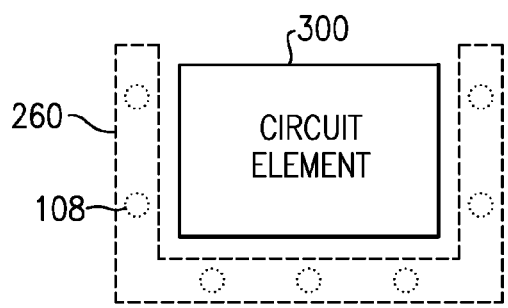
Figure 26D:
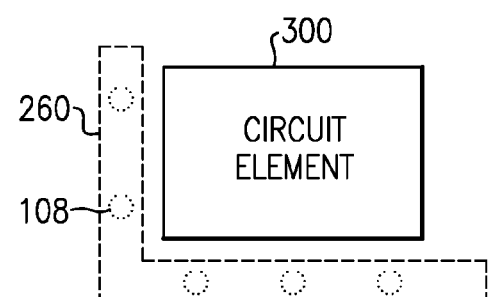

FIGS. 26C and 26D show examples where contact layers 260 can be strips that form partial perimeters about their respective circuit elements 300. For example, FIG. 26C shows a U-shape configuration, and FIG. 26D shows an L-shaped configuration. In some embodiments, such configurations can be implemented with, for example, example patterns of conductive vias that partially surround the circuit element 300.

Figure 26E:
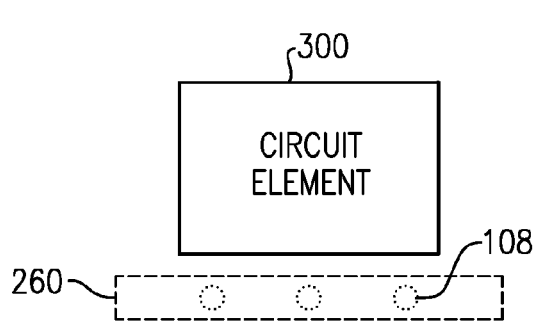

FIG. 26E shows an example where a contact layer 260 can be a strip that forms a segment at or near a side of a circuit element 300. In some embodiments, such a configuration can be implemented with, for example, an example pattern of conductive vias that form a segment at or near a side of the circuit element 300.

Figure 26F:
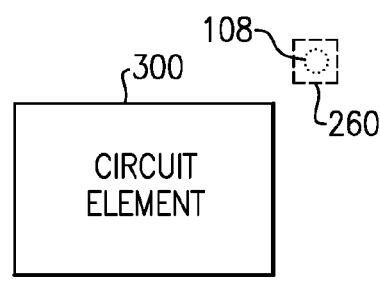

FIG. 26F shows an example where a contact layer 260 can have a relatively small pad shape that is not necessarily a strip. Such a configuration can be utilized in applications where relatively discrete contact layer is desired. In some embodiments, such a configuration can be implemented with, for example, an example pattern of one or more conductive vias grouped in a discrete manner.

It will be understood that contact layers having one or more features as described herein can also be configured in other ways. For example, there may be more than one contact layers for a given circuit element.

Figure 27:
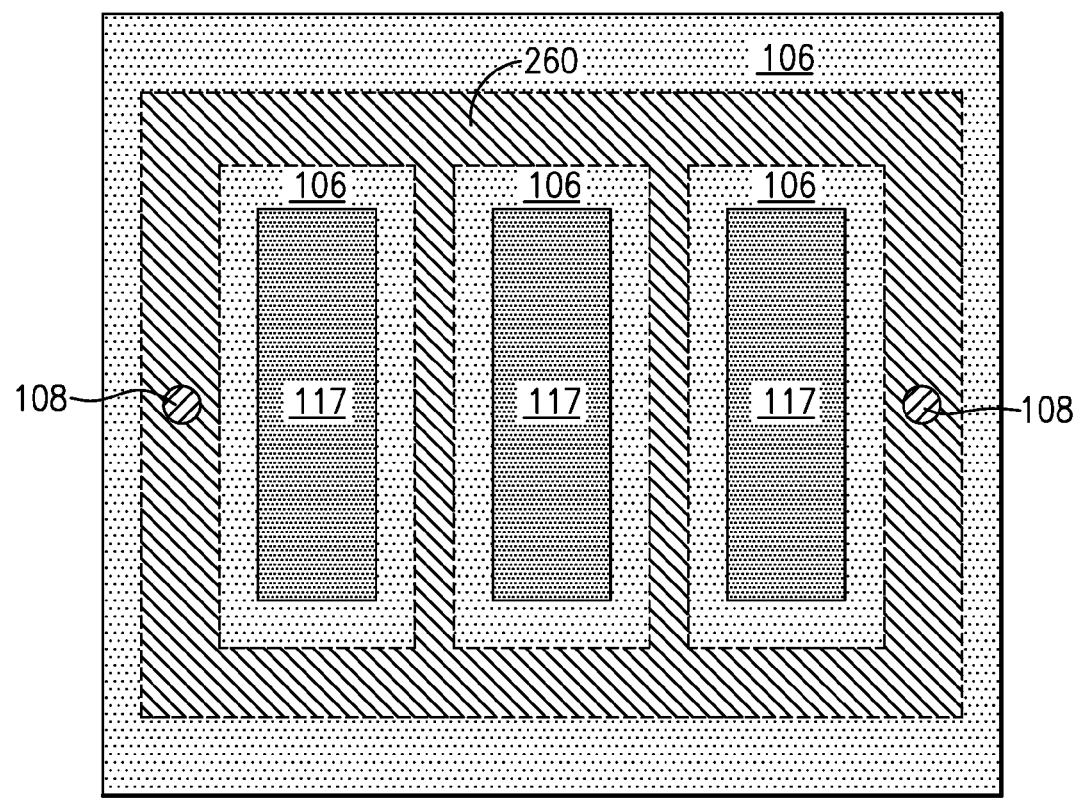
FIG. 27 shows an example of a contact layer that can be implemented in the example SOI FET device of FIG. 19.

FIG. 27 shows that in some embodiments, a contact layer 260 can include one or more openings. Such a configuration can, for example, accommodate features or regions formed on a handle wafer layer (e.g., Si handle wafer). For example, and in the context of the example configuration of FIG. 19 (in which a plurality of doped regions 117 are provided on the handle wafer 106, the contact layer 260 of FIG. 19 can include a plurality of openings as shown in FIG. 27 to accommodate such doped regions.

In the example of FIG. 27, such openings in the contact layer 260 are shown to substantially expose the corresponding doped regions. In some embodiments, such openings can also be dimensioned to partially expose corresponding doped regions.

In the example of FIG. 27, the contact layer 260 can be electrically connected to one or more portions of an FET and/or a terminal through, for example, one or more conductive vias 108. It will be understood that other numbers and/or other arrangements of conductive vias can be implemented.

Examples Related to Biasing and/or Coupling of SOI FET Devices

Figure 28:
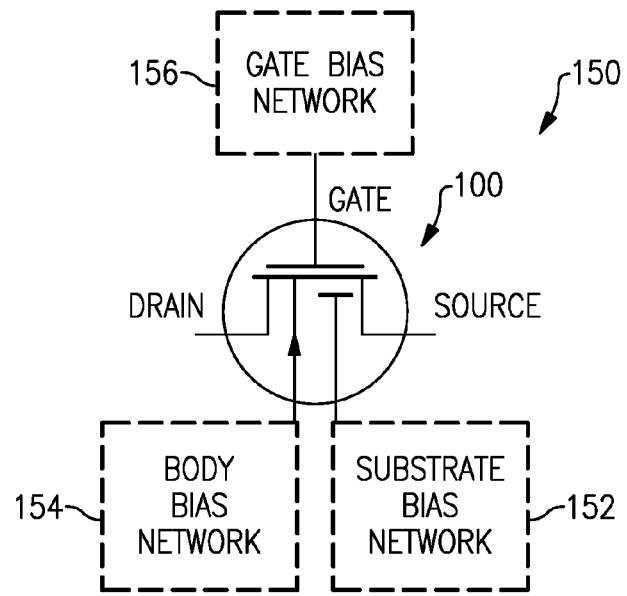
FIG. 28 shows that in some embodiments, an SOI FET device can have its contact layer having one or more features as described herein biased by, for example, a substrate bias network.

FIG. 28 shows that in some embodiments, an SOI FET device 100 having one or more features as described herein can have its contact layer biased by, for example, a substrate bias network 152. Various examples related to such a substrate bias network are described herein in greater detail.

In the example of FIG. 28, other nodes such as the gate and the body of the SOI FET device 100 can also be biased by their respective networks. Among others, examples related to such gate and body bias networks can be found in PCT Publication No. WO 2014/011510 entitled CIRCUITS, DEVICES, METHODS AND COMBINATIONS RELATED TO SILICON-ON-INSULATOR BASED RADIO-FREQUENCY SWITCHES, the disclosure of which is hereby expressly incorporated by reference herein in its entirety.

Figure 29:
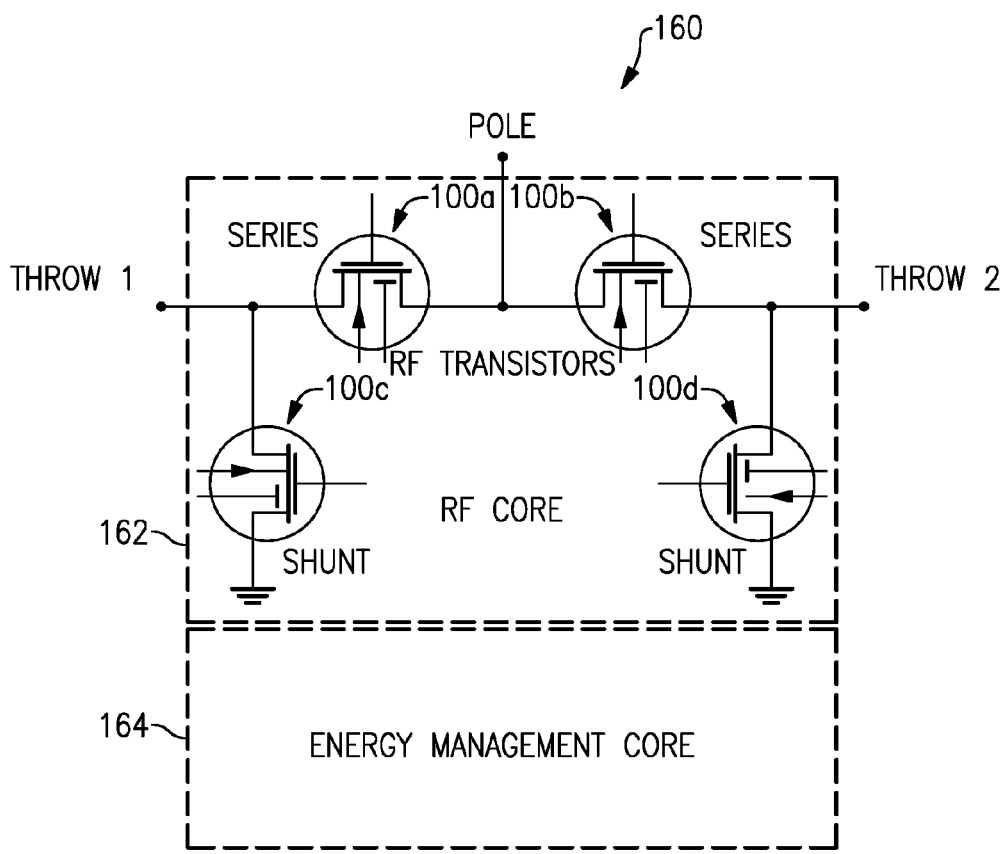
FIG. 29 shows an example of a radio-frequency (RF) switching configuration having an RF core and an energy management (EM) core.
Figure 30:
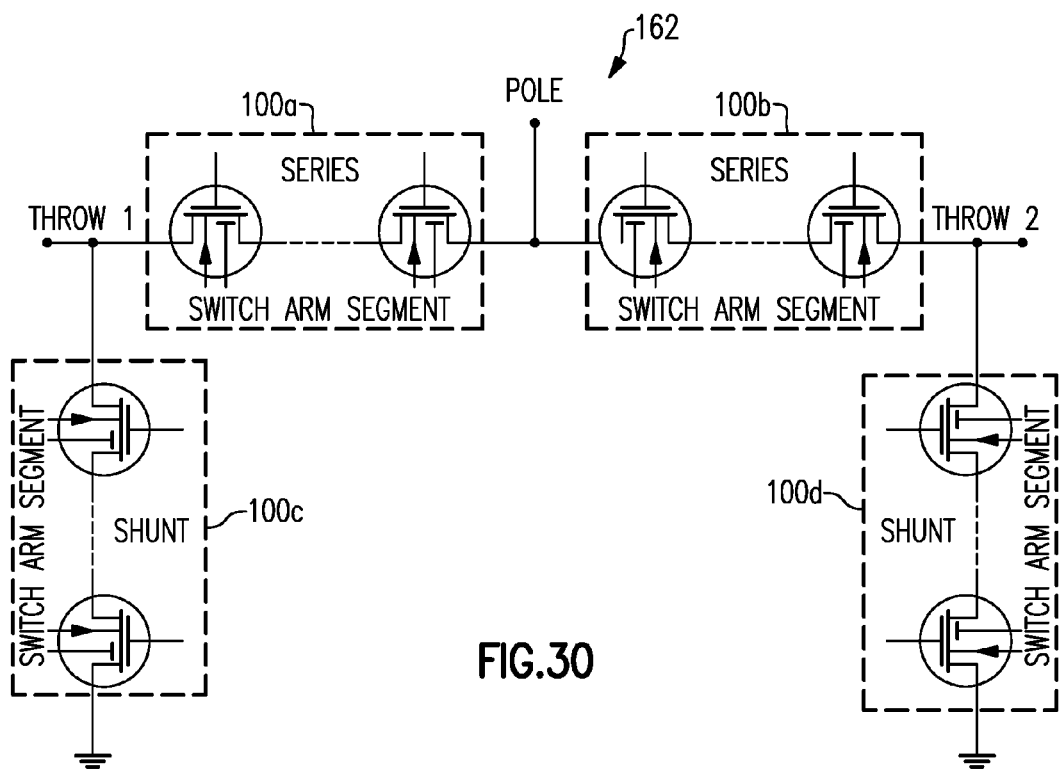
FIG. 30 shows an example of the RF core of FIG. 29, in which each of the switch arms includes a stack of FET devices.
Figure 31:
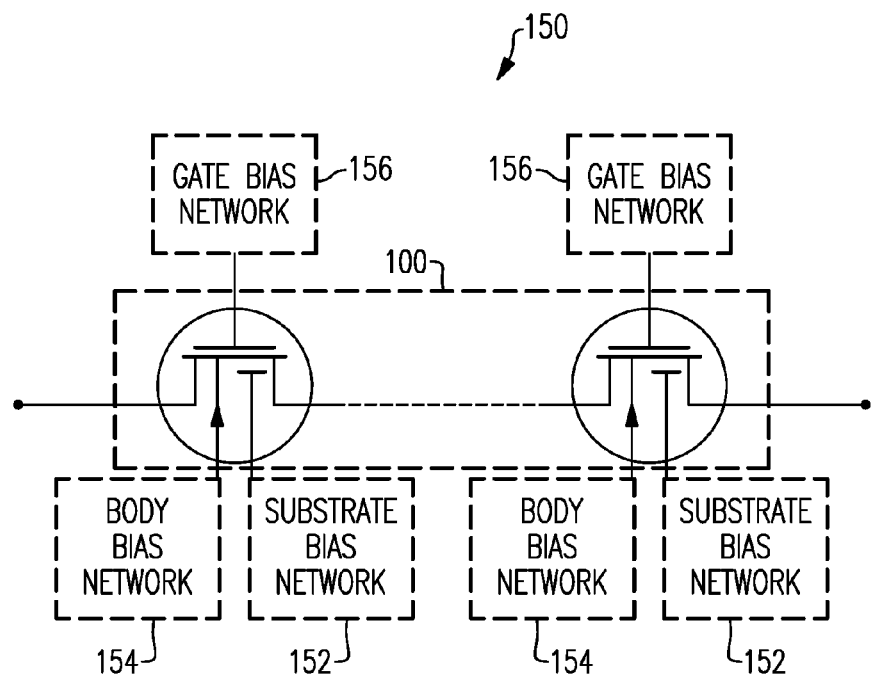
FIG. 31 shows an example of the biasing configuration of FIG. 28, implemented in a switch arm having a stack of FETs as described in reference to FIG. 30.

FIGS. 29-31 show that in some embodiments, SOI FETs having one or more features as described herein can be implemented in RF switching applications.

FIG. 29 shows an example of an RF switching configuration 160 having an RF core 162 and an energy management (EM) core 164. Additional details concerning such RF and EM cores can be found in the above-referenced PCT Publication No. WO 2014/011510. The example RF core 162 of FIG. 29 is shown as a single-pole-double-throw (SPDT) configuration in which series arms of transistors 100a, 100b are arranged between a pole and first and second throws, respectively. Nodes associated with the first and second throws are shown to be coupled to ground through their respective shunt arms of transistors 100c, 100d.

In the example of FIG. 29, some or all of the transistors 100a-100d can include contact layers as described herein. Such contact layers can be utilized to provide desirable functionalities for the corresponding transistors.

FIG. 30 shows an example of the RF core 162 of FIG. 29, in which each of the switch arms 100a-100d includes a stack of FET devices. For the purpose of description, each FET in such a stack can be referred to as a FET, the stack itself can be collectively referred to as a FET, or some combination thereof can also be referred to as a FET. In the example of FIG. 30, each FET in the corresponding stack one or more contact layers as described herein. It will be understood that some or all of the FET devices in the RF core 162 can include such contact layers.

FIG. 31 shows an example of the biasing configuration 150 of FIG. 28, implemented in a switch arm having a stack of FETs 100 as described in reference to FIG. 30. In the example of FIG. 31, each FET in the stack can be biased with a separate substrate bias network 152, the FETs in the stack can be biased with a plurality of substrate bias networks 152, all of the FETs in the stack can be biased with a common substrate bias network, or any combination thereof. Such possible variations can also apply to gate biasing (156) and body biasing (154).

Figure 32:
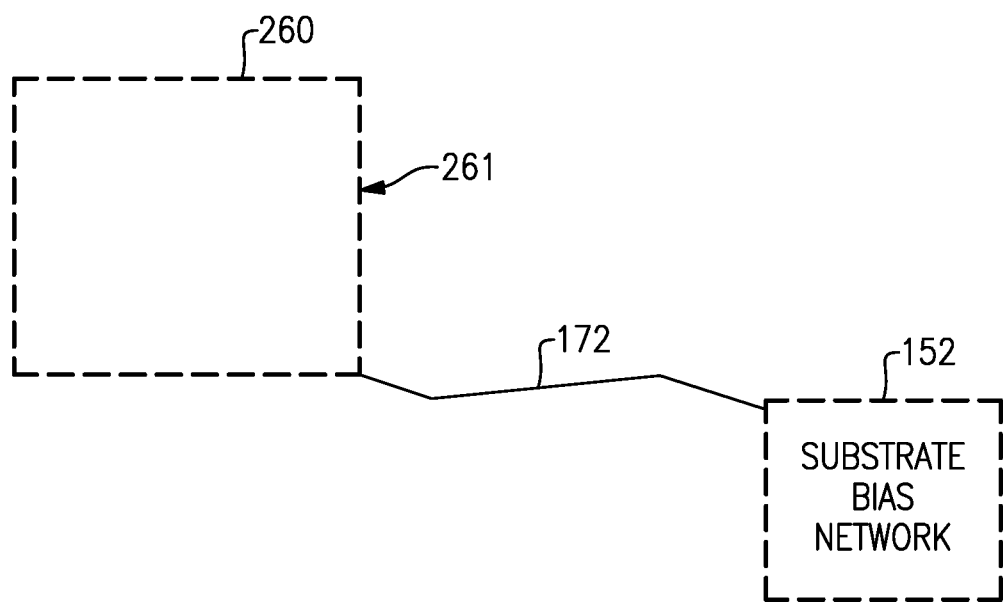
FIG. 32 shows that a pattern of one or more conductive layers can be implemented to be electrically connected to a bias circuit such as a substrate bias circuit.

FIG. 32 shows that a pattern 261 of one or more contact layers 260 can be implemented to be electrically connected as described herein. In some embodiments, such a pattern of contact layers can also be electrically connected (depicted as 172) to, for example, a substrate bias network 152. In some embodiments, and as described herein, such a pattern of contact layers can be electrically connected to another node of the SOI FET device, with or without the substrate bias network 152. In some embodiments, some or all of the foregoing electrical connections for the contact layer(s) can be facilitated by corresponding patterns of conductive features configured to provide substrate biasing functionality.

FIGS. 33-38 show non-limiting examples of the pattern 261 of one or more contact layers of FIG. 32. In the examples of FIGS. 33-37, a pattern of such contact layer(s) (indicated as 170) is depicted as generally surrounding a corresponding circuit element. However, and as shown in FIGS. 38A-38E, such a pattern of contact layer(s) (indicated as 261) may or may not surround a corresponding circuit element.

In the examples of FIGS. 33-38, it will be understood that for some or all of such examples, the pattern of contact layer(s) can be electrically connected to another node of the SOI FET device, with or without the substrate bias network 152.

Figure 33:
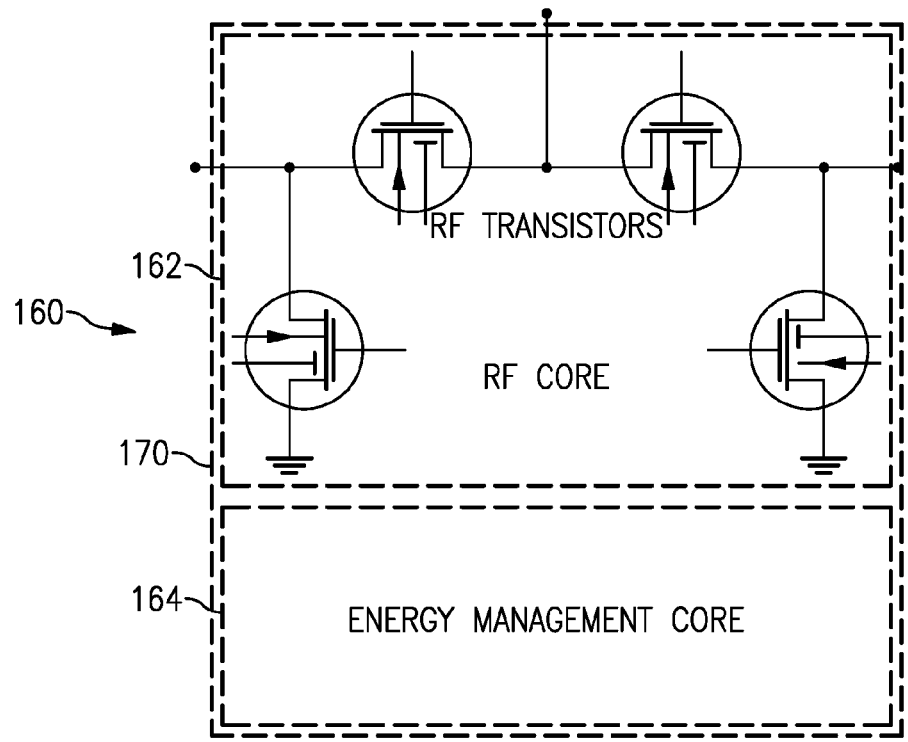
FIG. 33 shows an example configuration in which a pattern of one or more conductive layers can generally form a ring shaped perimeter substantially around an entire die having an RF core and an energy management core ("EM core").

FIG. 33 shows an example configuration 160 in which a pattern 170 of contact layers as described herein can generally form a ring shaped perimeter substantially around an entire die having an RF core 162 and an EM core 164. Accordingly, the RF core 162 and the EM core 164 collectively can be a circuit element associated with the pattern 170 of contact layers.

Figure 34:
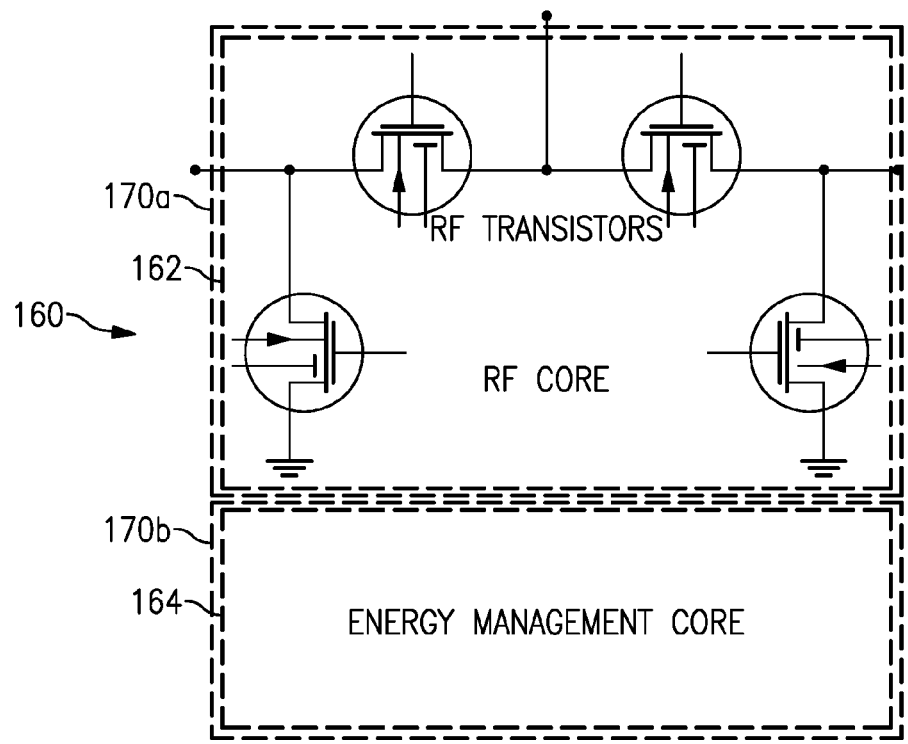
FIG. 34 shows an example configuration in which a pattern of one or more conductive layers can generally form a ring shaped distribution implemented substantially around each of an RF core and an EM core of a switching die.

FIG. 34 shows an example configuration 160 in which a pattern of contact layers as described herein can generally form a ring shaped distribution implemented substantially around each of an RF core 162 (pattern 170a) and an EM core 164 (pattern 170b) of a switching die. Accordingly, the RF core 162 can be a circuit element associated with the pattern 170a of contact layers, and the EM core 164 can be a circuit element associated with the pattern 170b of contact layers. Although both of the RF and EM cores are depicted as having respective patterns of contact layers, it will be understood that one pattern can have such contact layers while the other pattern does not. For example, the RF core can have such a pattern of contact layers while the EM core does not.

Figure 35:
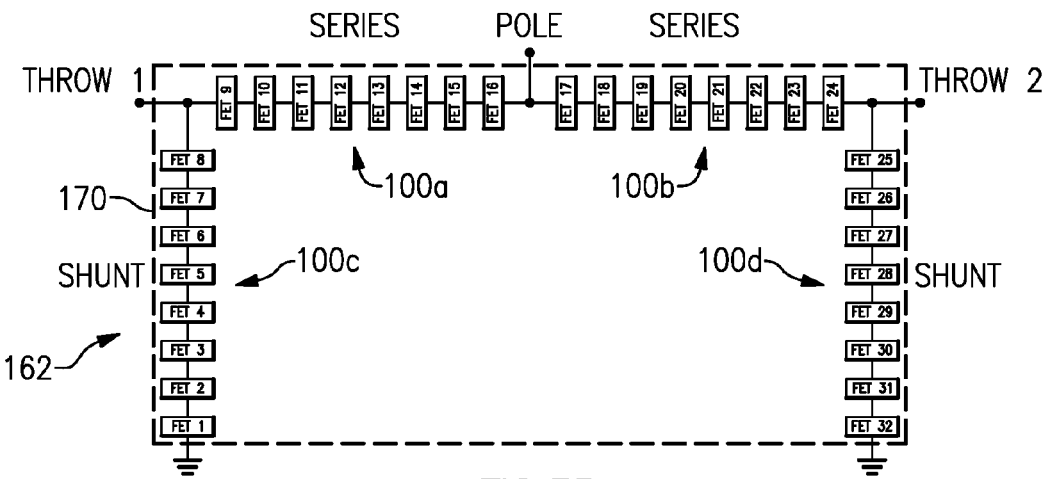
FIG. 35 shows an example configuration in which a pattern of one or more conductive layers can generally form a ring shaped distribution implemented substantially around an assembly of series arms and shunt arms.
Figure 36:
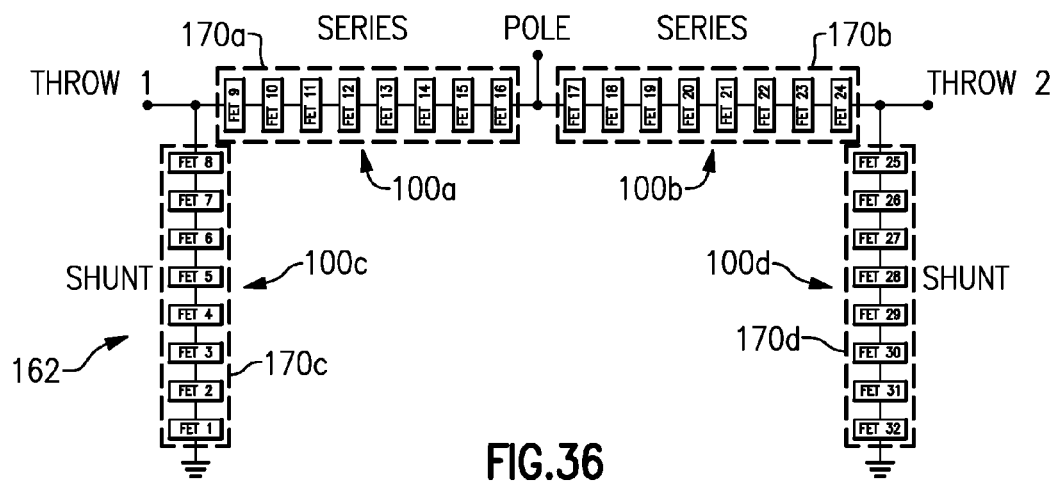
FIG. 36 shows an example configuration in which a pattern of one or more conductive layers can generally form a ring shaped distribution implemented substantially around each of series arms and shunt arms.
Figure 37:
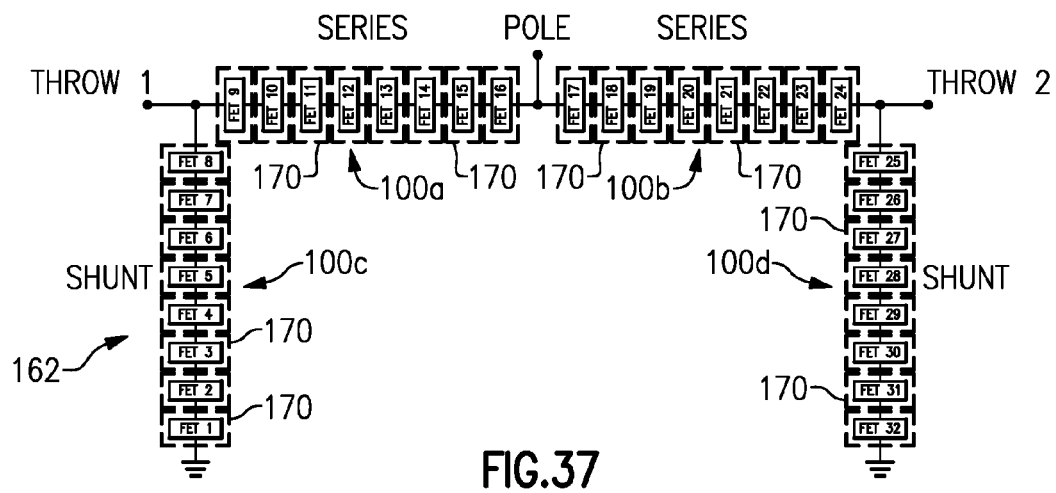
FIG. 37 shows an example configuration in which a pattern of one or more conductive layers can generally form a ring shaped distribution implemented substantially around each FET in a given arm.

FIGS. 35-37 show examples of one or more patterns of contact layers as described herein that can be implemented for an RF core 162. FIG. 35 shows an example configuration in which a pattern 170 of contact layers as described herein can generally form a ring shaped distribution implemented substantially around an assembly of series arms 100*a*, 100*b* and shunt arms 100*c*, 100*d*. Accordingly, the RF core 162 can be a circuit element associated with the pattern 170 of contact layers.

FIG. 36 shows an example configuration in which a pattern of contact layers as described herein can generally form a ring shaped distribution implemented substantially around each of series arms 100*a* (pattern 170*a*), 100*b* (pattern 170*b*) and shunt arms 100*c* (pattern 170*c*), 100*d* (pattern 170*d*). Accordingly, each arm (100*a*, 100*b*, 100*c* or 100*d*) can be a circuit element associated with the corresponding pattern (170*a*, 170*b*, 170*c* or 170*d*) of contact layers.

FIG. 37 shows an example configuration in which a pattern 170 of contact layers as described herein can generally form a ring shaped distribution implemented substantially around each FET in a given arm. Accordingly, each FET can be a circuit element associated with the corresponding pattern of contact layers.

In the examples of FIGS. 35-37, each component at different levels of the RF core is shown to be provided with a pattern of contact layers. For example, each arm in FIG. 36 is shown to include a pattern of contact layers, and each FET in FIG. 37 is shown to include a pattern of contact layers. It will be understood that not every one of such components necessarily needs to have such pattern of contact layers. Further, it will be understood that various combinations of the patterns of contact layers associated with different levels of the RF core can be combined. For example, an RF core can include a pattern of contact layers around the RF core itself, and one or more additional patterns of contact layers can also be implemented for selected arm(s) and/or FET(s).

As described herein, a pattern of contact layers can be implemented around a circuit element, partially around a circuit element, as a single feature, or any combination thereof.

FIGS. 38A-38E show non-limiting examples of such patterns. In such examples, the patterns are depicted as being electrically connected to their respective substrate bias networks. However, and as described herein, such patterns can be electrically connected to other part(s) of, for example, corresponding FET with or without such substrate bias networks.

Figure 38E:
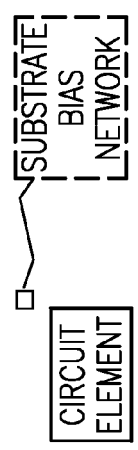
FIGS. 38A-38E show non-limiting examples of patterns of one or more conductive layers that can be implemented around a circuit element.
Figure 38A:
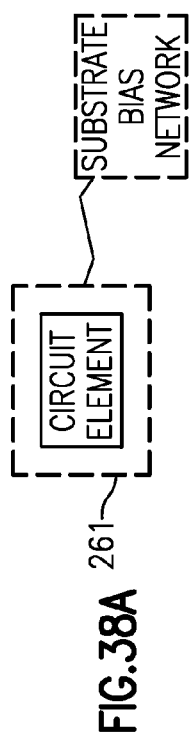

FIG. 38A shows an example in which a pattern 261 of one or more contact layers as described herein can be implemented around a circuit element, similar to the examples of FIGS. 33-37. Such a pattern can be electrically connected to a substrate bias network and/or another portion of the circuit element.

Figure 38B:
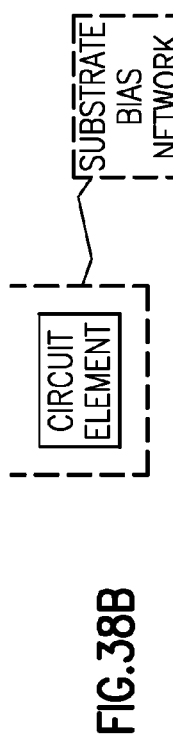

FIG. 38B shows an example in which a pattern 261 of contact layers as described herein can be implemented partially around a circuit element. In the particular example of FIG. 38B, such a partially surrounding pattern can be a U-shaped pattern in which one or more contact layers are implemented on three sides, but not on the fourth side relative to the circuit element. Such a pattern can be electrically connected to a substrate bias network and/or another portion of the circuit element.

Figure 38C:
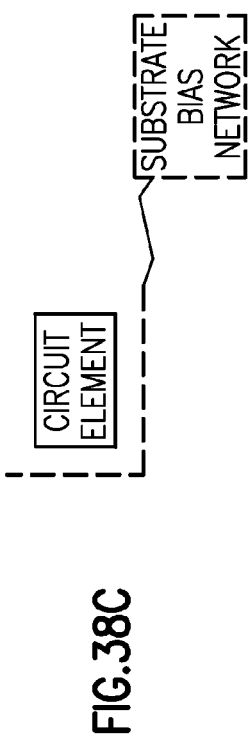

FIG. 38C shows another example in which a pattern 261 of contact layers as described herein can be implemented partially around a circuit element. In the particular example of FIG. 38C, such a partially surrounding pattern can be an L-shaped pattern in which one or more contact layers are implemented on two adjacent sides, but not on the other two sides relative to the circuit element. Such a pattern can be electrically connected to a substrate bias network and/or another portion of the circuit element. In some embodiments, two sides having patterns of contact layers can be opposing sides.

Figure 38D:
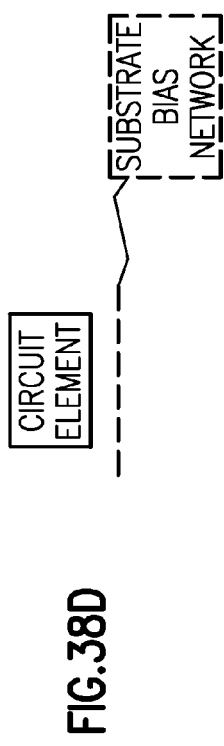

FIG. 38D shows yet another example in which a pattern 261 of contact layers as described herein can be implemented partially around a circuit element. In the particular example of FIG. 38D, such a partially surrounding pattern can be a pattern in which one or more contact layers are implemented on one side, but not on the remaining three sides relative to the circuit element. Such a pattern can be electrically connected to a substrate bias network and/or another portion of the circuit element.

FIG. 38E shows an example in which a pattern 261 of contact layers as described herein can be implemented as one or more discrete contact areas. In the particular example of FIG. 38E, such a pattern can be a pattern in which a single contact layer is implemented relative to the circuit element. Such a pattern can be electrically connected to a substrate bias network and/or another portion of the circuit element.

In the examples of FIGS. 38A-38E, a given pattern 261 can include one or more discrete and/or contiguous contact layers. For the purpose of description, it will be understood that a contiguous pattern (e.g., two joined segments in the example of FIG. 38C) can include contact layers that are electrically connected to a common substrate bias network and/or another common portion of the circuit element.

Figure 39A:
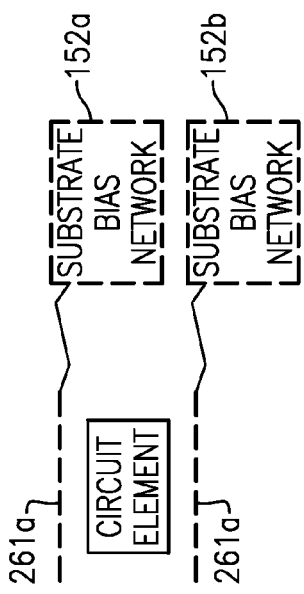
FIGS. 39A and 39B show that in some embodiments, there may be more than one pattern of one or more conductive layers implemented relative a circuit element.
Figure 39B:
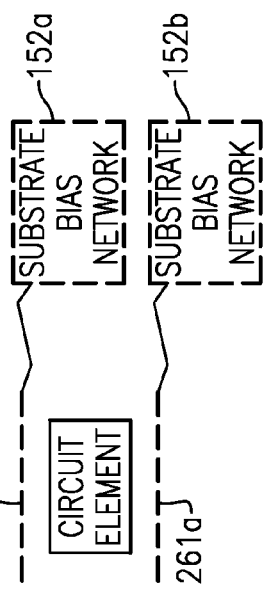

FIGS. 39A and 39B show that in some embodiments, there may be more than one pattern of contact layers implemented relative a circuit element. Such patterns of contact layers can be electrically connected to separate substrate bias networks and/or portions of the circuit element, be electrically connected to a common substrate bias network and/or another common portion of the circuit element, or any combination thereof.

For example, FIG. 39A shows a configuration in which two opposing sides relative to a circuit element are provided with first and second patterns 261 of contact layers. The first pattern can be electrically connected to a first substrate bias network 152*a* and/or a first portion of the circuit element, and the second pattern can be electrically connected to a second substrate bias network 152*b* and/or a second portion of the circuit element.

In another example, 39B shows a configuration in which two opposing sides relative to a circuit element are provided with first and second patterns 261 of contact layers, similar to the example of FIG. 39A. Both of the first and second patterns 261 can be electrically connected to a common substrate bias network 152 and/or a common portion of the circuit element.

FIGS. 40-57 show non-limiting examples of substrate bias networks and/or other portions of an SOI FET device 100 that can be coupled with a contact layer of the SOI FET device 100. Such coupling with the contact layer can be facilitated by one or more patterns of conductive features as described herein. In some embodiments, such contact layers can provide one or more functionalities for the SOI FET device 100, including, for example, substrate biasing functionality, back-gate functionality, or some combination thereof.

Figure 40:
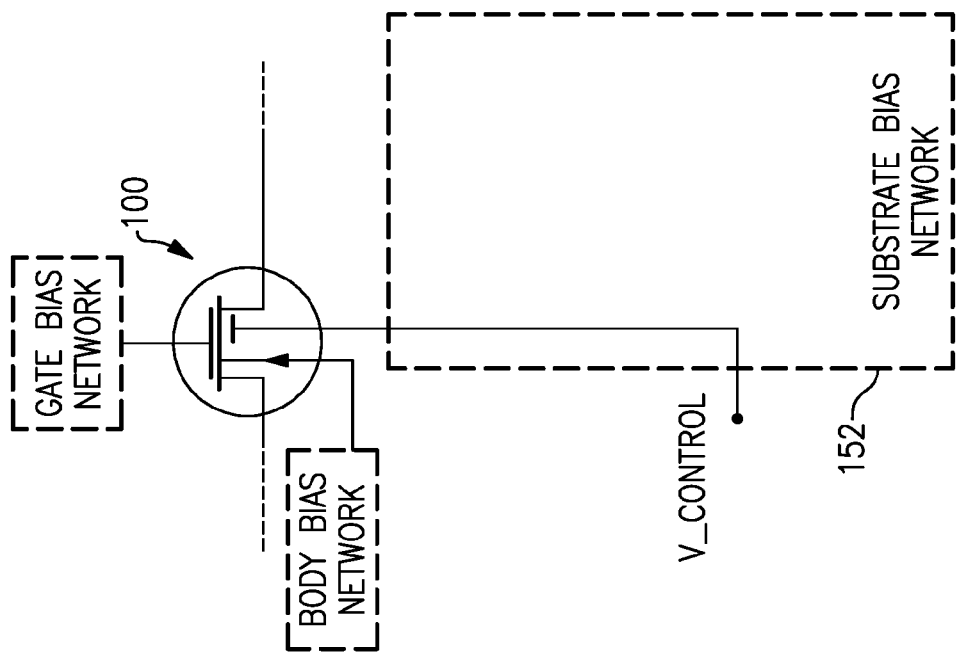
FIG. 40 shows an example in which a conductive layer of an SOI FET device can be electrically connected to a substrate bias network.

FIG. 40 shows an example in which a contact layer of an SOI FET device 100 can be electrically connected to a substrate bias network 152. Such a substrate bias network can be configured to allow application of a DC control voltage (V_control) to the contact layer.

Figure 41:
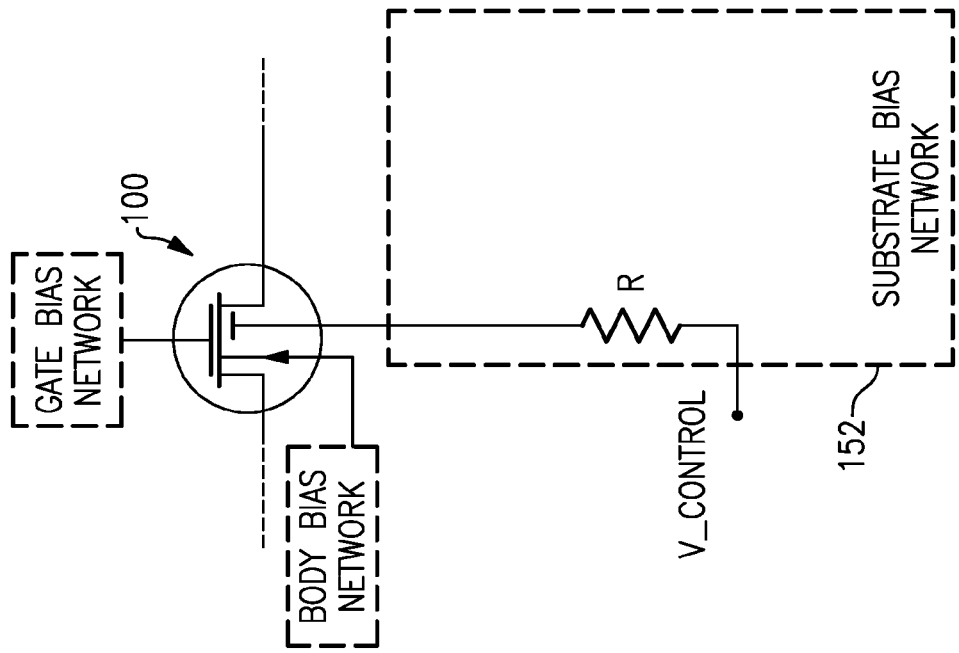
FIG. 41 shows another example in which a conductive layer of an SOI FET device can be electrically connected to a substrate bias network.

FIG. 41 shows an example in which a contact layer of an SOI FET device 100 can be electrically connected to a substrate bias network 152. Such a substrate bias network can be configured to allow application of a DC control voltage (V_control) to the contact through a resistance R (e.g., a resistor).

Figure 42:
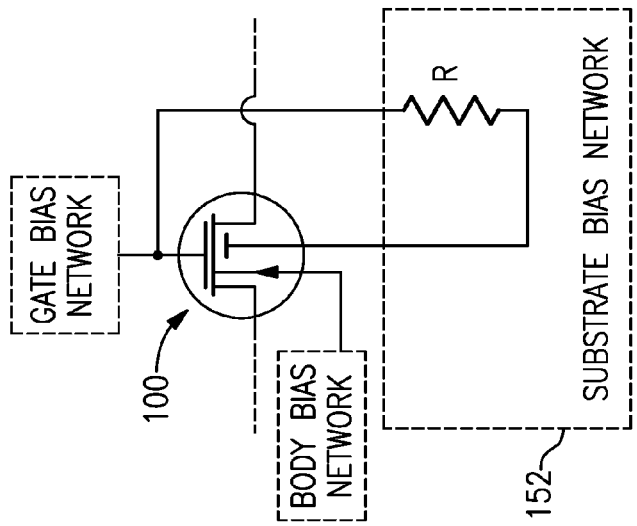
FIG. 42 shows an example in which a conductive layer of an SOI FET device can be electrically connected to a gate node of the SOI FET device.

FIG. 42 shows an example in which a contact layer of an SOI FET device 100 can be electrically connected to a gate node (e.g., back-side of the gate) of the SOI FET device 100. In some embodiments, such a coupling may or may not include a resistance R (e.g., a resistor). In some embodiments, such a coupling may or may not be part of a substrate bias network 152 (if any).

Figure 43:
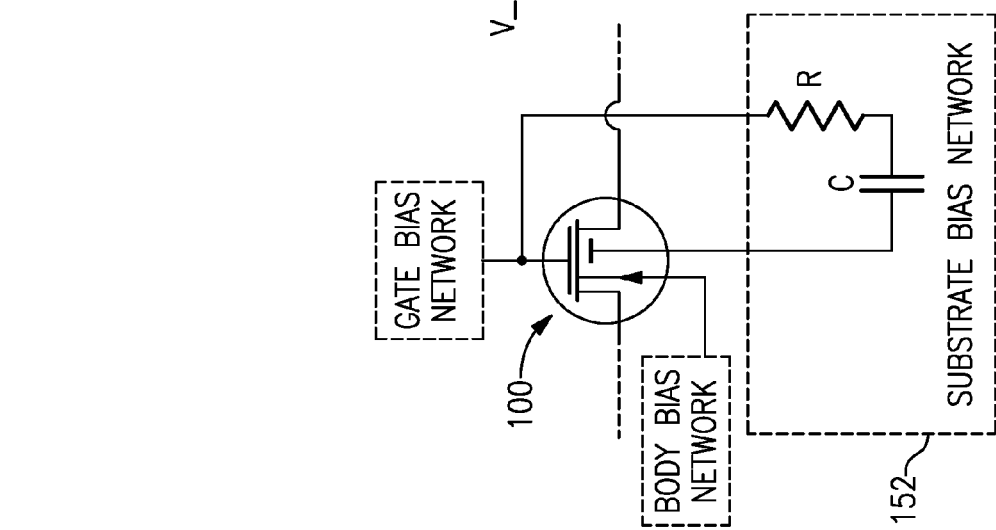
FIG. 43 shows an example in which a conductive layer of an SOI FET device can be electrically connected to a gate node of the SOI FET device through a phase-shift circuit.

FIG. 43 shows an example in which a contact layer of an SOI FET device 100 can be electrically connected to a gate node of the SOI FET device 100 through a phase-shift circuit. In the example shown, the phase-shift circuit includes a capacitance (e.g., a capacitor); however, it will be understood that the phase-shift circuit can be configured in other manners. In some embodiments, such a coupling may or may not include a resistance R (e.g., a resistor). In some embodiments, such a coupling may or may not be part of a substrate bias network 152 (if any).

Figure 44:
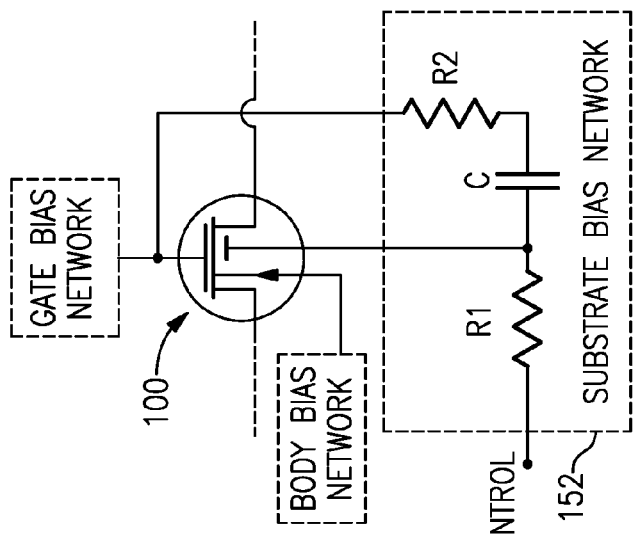
FIG. 44 shows an example in which a conductive layer of an SOI FET device can be electrically connected to a gate node of the SOI FET device through a phase-shift circuit, similar to the example of FIG. 43, and in which a substrate bias network can be configured to allow application of a DC control voltage to the conductive layer.

FIG. 44 shows an example in which a contact layer of an SOI FET device 100 can be electrically connected to a gate node of the SOI FET device 100 through a phase-shift circuit, similar to the example of FIG. 43. In the example of FIG. 44, a substrate bias network 152 can be configured to allow application of a DC control voltage (V_control) to the contact layer. Such V_control can be applied directly to the contact layer, or through a resistance R1 (e.g., a resistor).

FIGS. 45-48 show non-limiting examples in which various couplings between a contact layer of an SOI FET device and another node of the SOI FET device can include a diode. Such a diode can be implemented to, for example, provide voltage-dependent couplings.

Figure 45B:
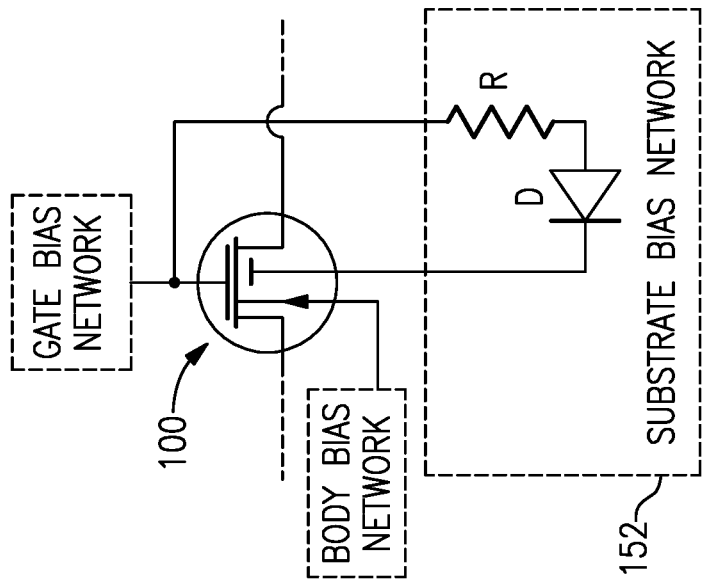
FIG. 45B shows that in some embodiments, the polarity of the diode D can be reversed from the example of FIG. 45A.
Figure 45A:
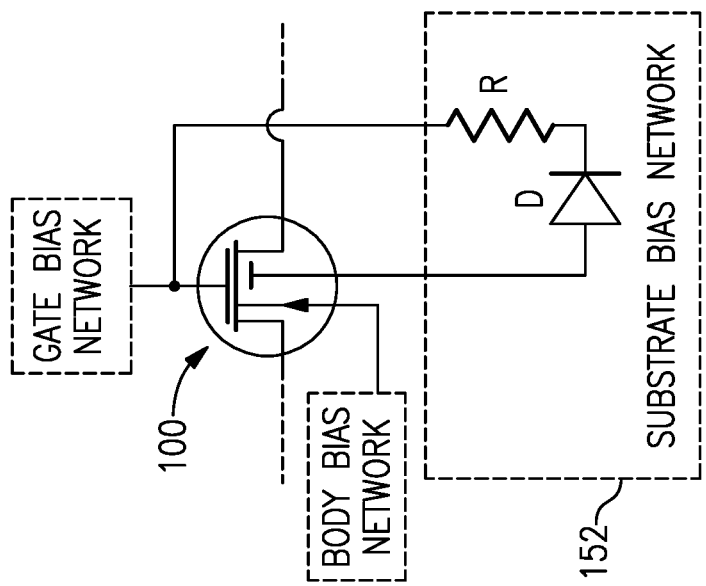
FIG. 45A shows an example that is similar to the example of FIG. 42, but with a diode D in series with a resistance R.

FIG. 45A shows an example that is similar to the example of FIG. 42, but with a diode D in series with the resistance R. In some embodiments, such a coupling between the contact layer the gate node can be implemented with or without the resistance R.

FIG. 45B shows that in some embodiments, the polarity of the diode D can be reversed from the example of FIG. 45A. It will be understood that such polarity reversal of the diode can also be implemented in the examples of FIGS. 46-48.

Figure 46:
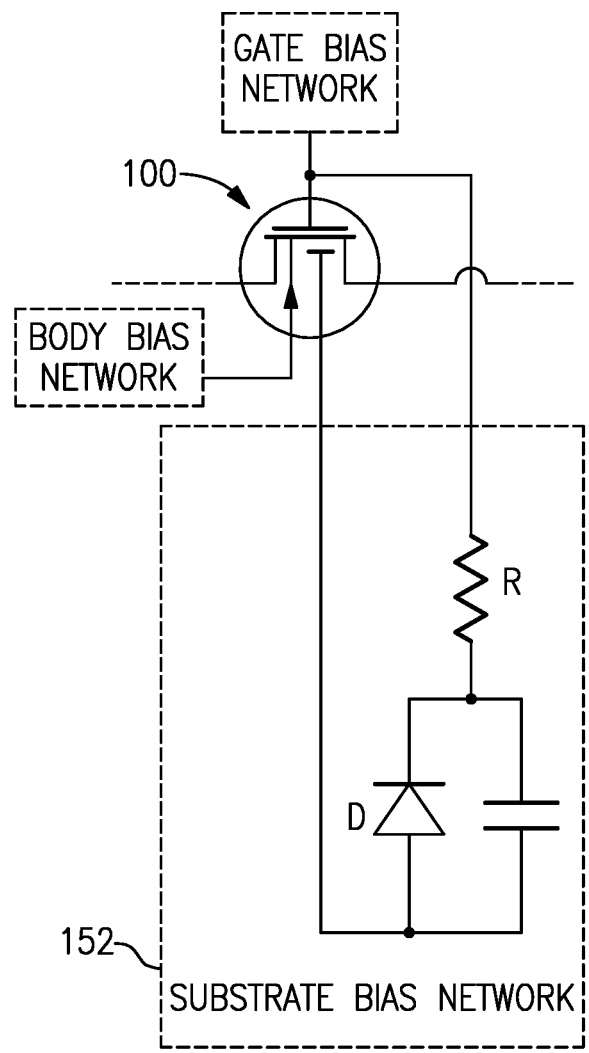
FIG. 46 shows an example that is similar to the example of FIG. 43, but with a diode D in parallel with a phase-shifting circuit.

FIG. 46 shows an example that is similar to the example of FIG. 43, but with a diode D in parallel with a phase-shifting circuit (e.g., a capacitance C). In some embodiments, such a coupling between the contact layer and the gate node can be implemented with or without the resistance R.

Figure 47:
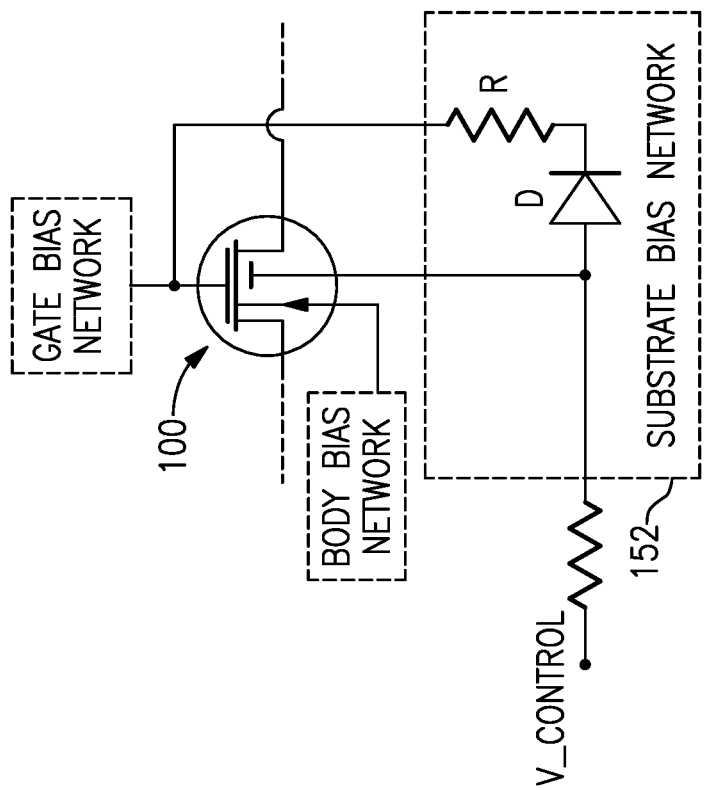
FIG. 47 shows an example that is similar to the example of FIG. 42, but with a diode D in series with a resistance R.
Figure 52A:
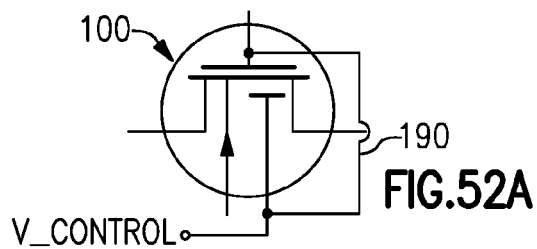
FIGS. 52A-52D show examples that are similar to the examples of FIGS. 50A-50D, and in which a bias signal can be applied to the conductive layer.
Figure 52B:
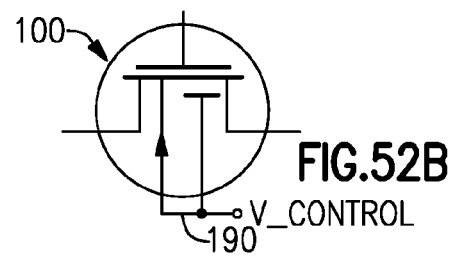
Figure 52C:
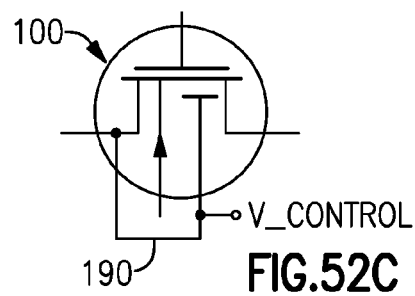
Figure 52D:
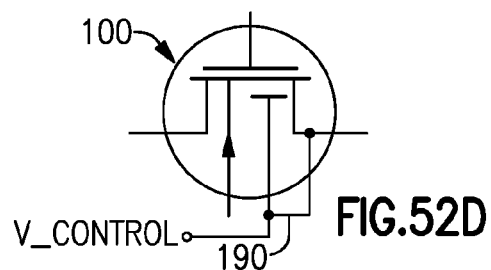
Figure 53A:
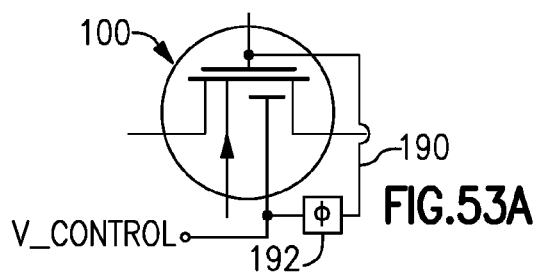
FIGS. 53A-53D show examples that are similar to the examples of FIGS. 51A-51D, and in which a bias signal can be applied to the conductive layer.
Figure 53B:
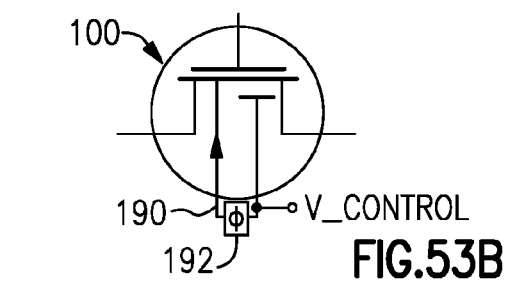
Figure 53C:
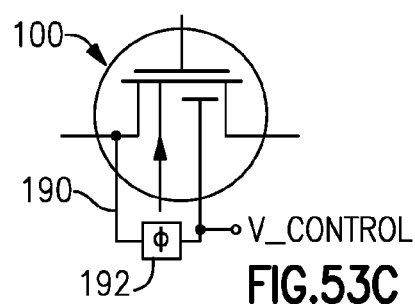
Figure 53D:
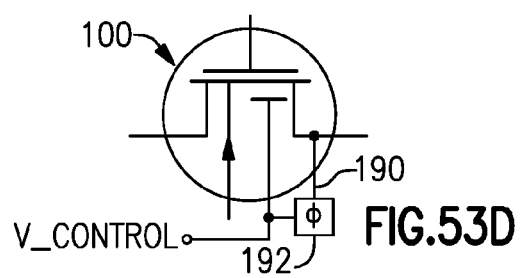
Figure 56A:
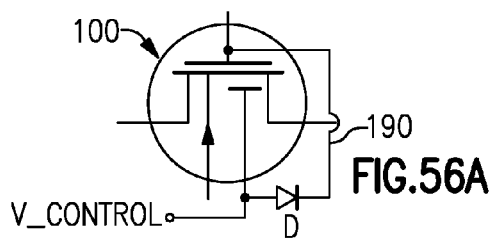
FIGS. 56A-56D show examples that are similar to the examples of FIGS. 54A-54D, and in which a bias signal can be applied to the conductive layer.
Figure 56B:
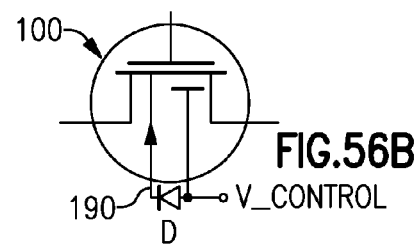
Figure 56C:
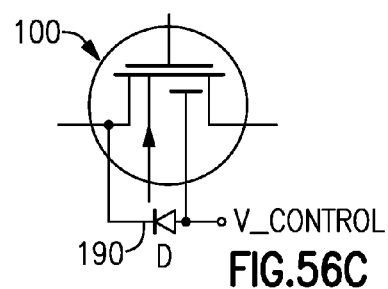
Figure 56D:
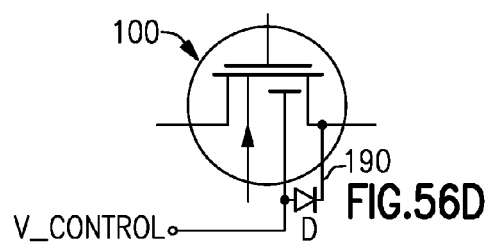
Figure 57A:
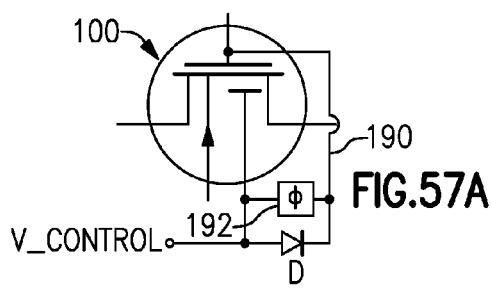
FIGS. 57A-57D show examples that are similar to the examples of FIGS. 55A-55D, and in which a bias signal can be applied to the conductive layer.
Figure 57B:
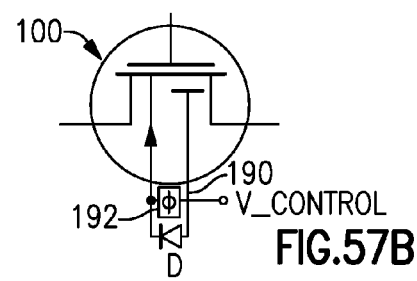
Figure 57C:
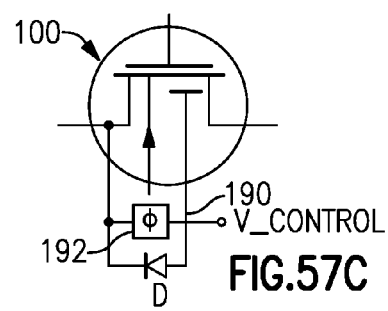
Figure 57D:
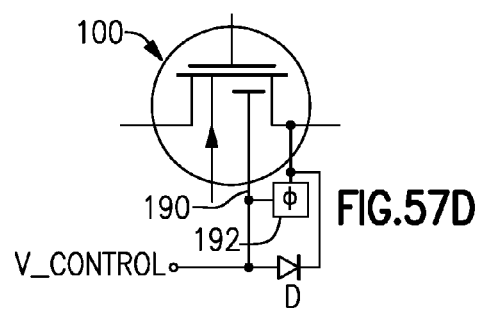

FIG. 47 shows an example that is similar to the example of FIG. 42, but with a diode D in series with the resistance R. In some embodiments, a DC control voltage (V_control) can be applied directly to the contact layer, or through a resistance (e.g., a resistor).

Figure 48:
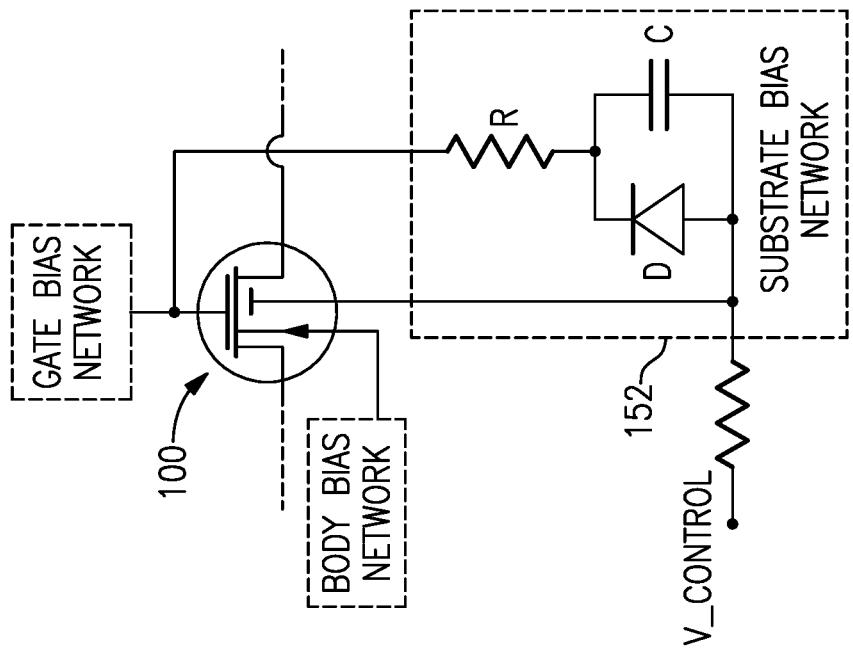
FIG. 48 shows an example that is similar to the example of FIG. 46, but with biasing.

FIG. 48 shows an example that is similar to the example of FIG. 46, but with biasing. Such biasing can be configured to allow application of a DC control voltage (V_control) to the contact layer directly or through a resistance R (e.g., a resistor).

In some embodiments, a contact layer connection having one or more features as described herein can be utilized to sense a voltage condition of the substrate. Such a sensed voltage can be utilized to, for example, compensate the voltage condition. For example, charge can be driven into or out of the substrate as needed or desired through the contact layer.

FIG. 49 shows an SOI FET device 100 having a contact layer as described herein. Such a contact layer can be utilized to sense a voltage V associated with the substrate node. FIGS. 50-57 show non-limiting examples of how such sensed voltage can be utilized in various feedback and/or biasing configurations. Although various examples are described in the context of voltage V, it will be understood that one or more features of the present disclosure can also be implemented utilizing, for example, sensed current associated with the substrate.

FIGS. 50A-50D show examples of how a contact layer of an SOI FET device 100 can be coupled to another node of the SOI FET device 100. In some embodiments, such couplings can be utilized to facilitate the foregoing compensation based on the sensed substrate voltage of FIG. 49. FIG. 50A shows that a coupling 190 can be implemented between the contact layer and a gate node. FIG. 50B shows that a coupling 190 can be implemented between the contact layer and a body node. FIG. 50C shows that a coupling 190 can be implemented between the contact layer and a source node. FIG. 50D shows that a coupling 190 can be implemented between the contact layer and a drain node. In some embodiments, the contact layer can be coupled to more than one of the foregoing nodes.

FIGS. 51A-51D show examples of how a contact layer of an SOI FET device 100 can be coupled to another node of the SOI FET device 100 through a phase-shifting circuit (e.g., a capacitance) 192. In some embodiments, such couplings can be utilized to facilitate the foregoing compensation based on the sensed substrate voltage of FIG. 49. FIG. 51A shows that a coupling 190 having a phase-shifting circuit 192 can be implemented between the contact layer and a gate node. FIG. 51B shows that a coupling 190 having a phase-shifting circuit 192 can be implemented between the contact layer and a body node. FIG. 51C shows that a coupling 190 having a phase-shifting circuit 192 can be implemented between the contact layer and a source node. FIG. 51D shows that a coupling 190 having a phase-shifting circuit 192 can be implemented between the contact layer and a drain node. In some embodiments, the contact layer can be coupled to more than one of the foregoing nodes.

FIGS. 52A-52D show examples that are similar to the examples of FIGS. 50A-50D. However, in each of the examples of FIGS. 52A-52D, a bias signal such as a DC control voltage (V_control) can be applied to the contact layer. Such V_control can be applied to the contact layer directly or through a resistance.

FIGS. 53A-53D show examples that are similar to the examples of FIGS. 51A-51D. However, in each of the examples of FIGS. 53A-53D, a bias signal such as a DC control voltage (V_control) can be applied to the contact layer. Such V_control can be applied to the contact layer directly or through a resistance.

FIGS. 54A-54D show examples of how a contact layer of an SOI FET device 100 can be coupled to another node of the SOI FET device 100 through a diode D. In some embodiments, such couplings can be utilized to facilitate the foregoing compensation based on the sensed substrate voltage of FIG. 49. In some embodiments, a given diode can be reversed from the configuration as shown as needed or desired.

FIG. 54A shows that a coupling 190 having a diode D can be implemented between the contact layer and a gate node.

FIG. 54B shows that a coupling 190 having a diode D can be implemented between the contact layer and a body node. FIG. 54C shows that a coupling 190 having a diode D can be implemented between the contact layer and a source node. FIG. 54D shows that a coupling 190 having a diode D can be implemented between the contact layer and a drain node. In some embodiments, the contact layer can be coupled to more than one of the foregoing nodes.

FIGS. 55A-55D show examples of how a contact layer of an SOI FET device 100 can be coupled to another node of the SOI FET device 100 through a diode D and a phase-shifting circuit 192. In some embodiments, such diode D and the phase-shifting circuit 192 can be arranged in a parallel configuration. In some embodiments, such couplings can be utilized to facilitate the foregoing compensation based on the sensed substrate voltage of FIG. 49. In some embodiments, a given diode can be reversed from the configuration as shown as needed or desired.

FIG. 55A shows that a coupling 190 having a diode D and a phase-shifting circuit 190 can be implemented between the contact layer and a gate node. FIG. 55B shows that a coupling 190 having a diode D and a phase-shifting circuit 190 can be implemented between the contact layer and a body node. FIG. 55C shows that a coupling 190 having a diode D and a phase-shifting circuit 190 can be implemented between the contact layer and a source node. FIG. 55D shows that a coupling 190 having a diode D and a phase-shifting circuit 190 can be implemented between the contact layer and a drain node. In some embodiments, the contact layer can be coupled to more than one of the foregoing nodes.

FIGS. 56A-56D show examples that are similar to the examples of FIGS. 54A-54D. However, in each of the examples of FIGS. 56A-56D, a bias signal such as a DC control voltage (V_control) can be applied to the contact layer. Such V_control can be applied to the contact layer directly or through a resistance.

FIGS. 57A-57D show examples that are similar to the examples of FIGS. 55A-55D. However, in each of the examples of FIGS. 57A-57D, a bias signal such as a DC control voltage (V_control) can be applied to the contact layer. Such V_control can be applied to the contact layer directly or through a resistance.

Examples Related to Switch Configurations

As described herein in reference to the examples of FIGS. 29, 30 and 33-37, FET devices having one or more features of the present disclosure can be utilized to implement an SPDT switch configuration. It will be understood that FET devices having one or more features of the present disclosure can also be implemented in other switch configurations.

Figure 58:
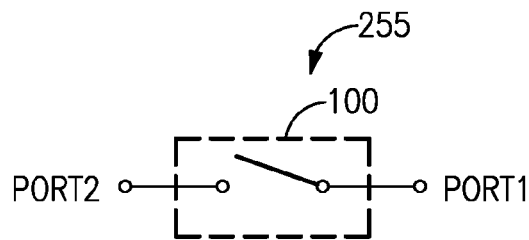
FIG. 58 shows a switch assembly implemented in a single-pole-single-throw (SPST) configuration utilizing an SOI FET device.

FIGS. 58-68 show examples related to various switch configurations that can be implemented utilizing FET devices such as SOI FET devices having one or more features as described herein. For example, FIG. 58 shows a switch assembly 255 implemented in a single-pole-single-throw (SPST) configuration. Such a switch can include an SOI FET device 100 implemented between a first port (Port1) and a second port (Port2).

Figure 59:
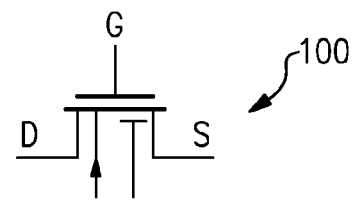
FIG. 59 shows that in some embodiments, the SOI FET device of FIG. 58 can include a conductive layer feature as described herein.

FIG. 59 shows that in some embodiments, the SOI FET device 100 of FIG. 58 can include a contact layer feature as described herein. The source node of the SOI FET device 100 can be connected to the first port (Port1), and the drain node of the SOI FET device 100 can be connected to the second port (Port2). As described herein, the SOI FET device 100 can be turned ON to close the switch 255 (of FIG. 58) between the two ports, and turned OFF to open the switch 250 between the two ports.

It will be understood that the SOI FET device 100 of FIGS. 58 and 59 can include a single FET, or a plurality of FETs arranged in a stack. It will also be understood that each of various SOI FET devices 100 of FIGS. 60-68 can include a single FET, or a plurality of FETs arranged in a stack.

Figure 60:
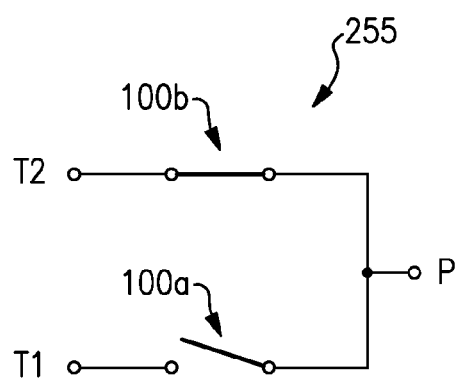
FIG. 60 shows an example of how two SPST switches having one or more features as described herein can be utilized to form a switch assembly having a single-pole-double-throw (SPDT) configuration.
Figure 61:
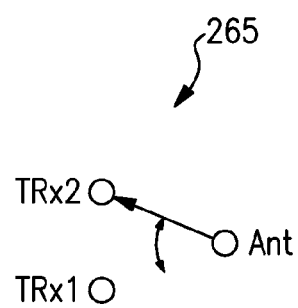
FIG. 61 shows that the switch assembly of FIG. 60 can be utilized in an antenna switch configuration.

FIG. 60 shows an example of how two SPST switches (e.g., similar to the examples of FIGS. 58, 59) having one or more features as described herein can be utilized to form a switch assembly 255 having a single-pole-double-throw (SPDT) configuration. FIG. 61 shows, in a SPDT representation, that the switch assembly 255 of FIG. 60 can be utilized in an antenna switch configuration 265. It will be understood that one or more features of the present disclosure can also be utilized in switching applications other than antenna switching application.

It is noted that in various switching configuration examples of FIGS. 58-68, switchable shunt paths are not shown for simplified views of the switching configurations. Accordingly, it will be understood that some or all of switchable paths in such switching configurations may or may not have associated with them switchable shunt paths (e.g., similar to the examples of FIGS. 29, 30 and 33-37).

Referring to the examples of FIGS. 60 and 61, it is noted that such examples are similar to the examples described herein in reference to FIGS. 29, 30 and 33-37. In some embodiments, the single pole (P) of the switch assembly 250 of FIG. 60 can be utilized as an antenna node (Ant) of the antenna switch 265, and the first and second throws (T1, T2) of the switch assembly 255 of FIG. 60 can be utilized as TRx1 and TRx2 nodes, respectively, of the antenna switch 265. Although each of the TRx1 and TRx2 nodes is indicated as providing transmit (Tx) and receive (Rx) functionalities, it will be understood that each of such nodes can be configured to provide either or both of such Tx and Rx functionalities.

In the examples of FIGS. 60 and 61, the SPDT functionality is shown to be provided by two SPST switches 100a, 100b, with the first SPST switch 100a providing a first switchable path between the pole P (Ant in FIG. 61) and the first throw T1 (TRx1 in FIG. 61), and the second SPST switch 100b providing a second switchable path between the pole P (Ant in FIG. 61) and the second throw T2 (TRx2 in FIG. 61). Accordingly, selective coupling of the pole (Ant) with either of the first throw T1 (TRx1) and the second throw T2 (TRx2) can be achieved by selective switching operations of the first and second SPST switches. For example, if a connection is desired between the pole (Ant) and the first throw T1 (TRx1), the first SPST switch 100a can be closed, and the second SPST switch 100b can be opened. Similarly, and as depicted in the example state in FIGS. 60 and 61, if a connection is desired between the pole (Ant) and the second throw T2 (TRx2), the first SPST switch 100a can be opened, and the second SPST switch 100b can be closed.

In the foregoing switching examples of FIGS. 60 and 61, a single TRx path is connected to the antenna (Ant) node in a given switch configuration. It will be understood that in some applications (e.g., carrier-aggregation applications), more than one TRx paths may be connected to the same antenna node. Thus, in the context of the foregoing switching configuration involving a plurality of SPST switches, more than one of such SPST switches can be closed to thereby connect their respective throws (TRx nodes) to the same pole (Ant).

Figure 62:
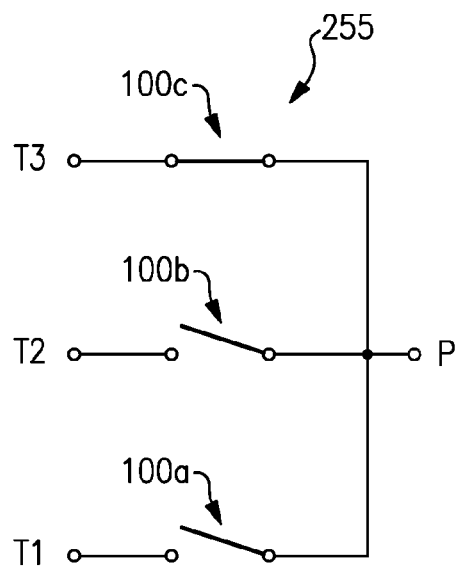
FIG. 62 shows an example of how three SPST switches having one or more features as described herein can be utilized to form a switch assembly having a single-pole-triple-throw (SP3T) configuration.
Figure 63:
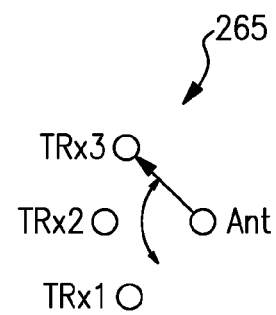
FIG. 63 shows that the switch assembly of FIG. 62 can be utilized in an antenna switch configuration.

FIG. 62 shows an example of how three SPST switches (e.g., similar to the examples of FIGS. 58, 59) having one or more features as described herein can be utilized to form a switch assembly 255 having a single-pole-triple-throw (SP3T) configuration. FIG. 63 shows, in a SP3T representation, that the switch assembly 255 of FIG. 62 can be utilized in an antenna switch configuration 265. It will be understood that one or more features of the present disclosure can also be utilized in switching applications other than antenna switching application.

Referring to the examples of FIGS. 62 and 63, it is noted that the SP3T configuration can be an extension of the SPDT configuration of FIGS. 60 and 61. For example, the single pole (P) of the switch assembly 255 of FIG. 62 can be utilized as an antenna node (Ant) of the antenna switch 265, and the first, second and third throws (T1, T2, T3) of the switch assembly 255 of FIG. 62 can be utilized as TRx1, TRx2 and TRx3 nodes, respectively, of the antenna switch 265. Although each of the TRx1, TRx2 and TRx3 nodes is indicated as providing transmit (Tx) and receive (Rx) functionalities, it will be understood that each of such nodes can be configured to provide either or both of such Tx and Rx functionalities.

In the examples of FIGS. 62 and 63, the SP3T functionality is shown to be provided by three SPST switches 100a, 100b, 100c, with the first SPST switch 100a providing a first switchable path between the pole P (Ant in FIG. 63) and the first throw T1 (TRx1 in FIG. 63), the second SPST switch 100b providing a second switchable path between the pole P (Ant in FIG. 63) and the second throw T2 (TRx2 in FIG. 63), and the third SPST switch 100c providing a third switchable path between the pole P (Ant in FIG. 63) and the third throw T3 (TRx3 in FIG. 63). Accordingly, selective coupling of the pole (Ant) with one of the first throw T1 (TRx1), the second throw T2 (TRx2), and the third throw T3 (TRx3) can be achieved by selective switching operations of the first, second and third SPST switches. For example, if a connection is desired between the pole (Ant) and the first throw T1 (TRx1), the first SPST switch 100a can be closed, and each of the second and third SPST switches 100b, 100c can be opened. If a connection is desired between the pole (Ant) and the second throw T2 (TRx2), the second SPST switch 100b can be closed, and each of the first and third SPST switches 100a, 100c can be opened. Similarly, and as depicted in the example state in FIGS. 62 and 63, if a connection is desired between the pole (Ant) and the third throw T3 (TRx3), each of the first and second SPST switches 100a, 100b can be opened, and the third SPST switch 100c can be closed.

In the foregoing switching examples of FIGS. 62 and 63, a single TRx path is connected to the antenna (Ant) node in a given switch configuration. It will be understood that in some applications (e.g., carrier-aggregation applications), more than one TRx paths may be connected to the same antenna node. Thus, in the context of the foregoing switching configuration involving a plurality of SPST switches, more than one of such SPST switches can be closed to thereby connect their respective throws (TRx nodes) to the same pole (Ant).

Based on the foregoing examples of SPST, SPDT and SP3T configurations of FIGS. 58-63, one can see that other switching configurations involving a single pole (SP) can be implemented utilizing SOI FET devices having one or more features as described herein. Thus, it will be understood that a switch having a SPNT can be implemented utilizing one or more SOI FET devices as described herein, where the quantity N is a positive integer.

Figure 64:
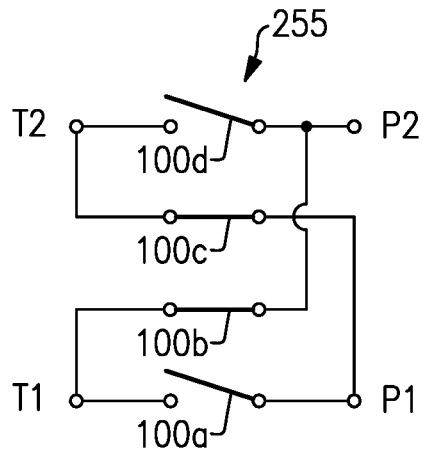
FIG. 64 shows an example of how four SPST switches having one or more features as described herein can be utilized to form a switch assembly having a double-pole-double-throw (DPDT) configuration.
Figure 65:
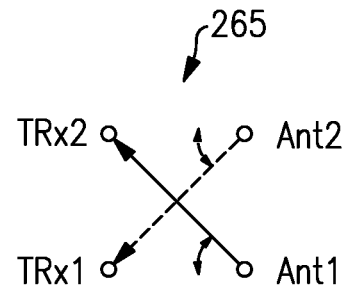
FIG. 65 shows that the switch assembly of FIG. 64 can be utilized in an antenna switch configuration.
Figure 66:
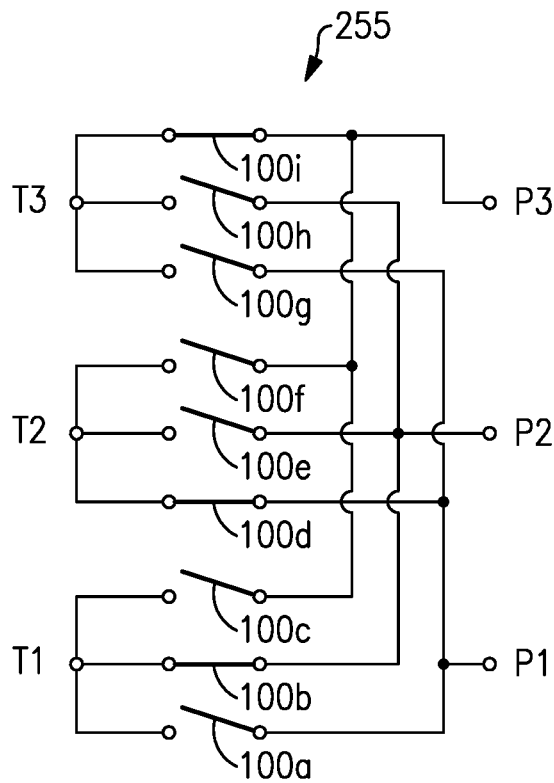
FIG. 66 shows an example of how nine SPST switches having one or more features as described herein can be utilized to form a switch assembly having a 3-pole-3-throw (3P3T) configuration.
Figure 67:
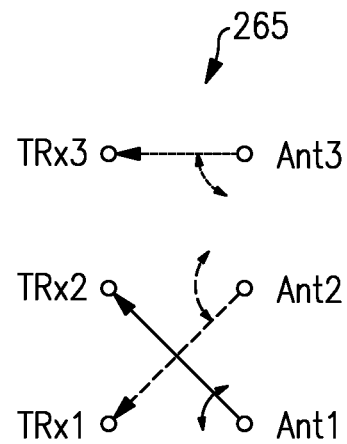
FIG. 67 shows that the switch assembly of FIG. 66 can be utilized in an antenna switch configuration.

Switching configurations of FIGS. 60-63 are examples where a single pole (SP) is connectable to one or more of a plurality of throws to provide the foregoing SPNT functionality. FIGS. 64-67 show examples where more than one poles can be provided in switching configurations. FIGS. 64 and 65 show examples related to a double-pole-double-throw (DPDT) switching configuration that can utilize a plurality of SOI FET devices having one or more features as described herein. Similarly, FIGS. 66 and 67 show examples related to a triple-pole-triple-throw (3P3T) switching configuration that can utilize a plurality of SOI FET devices having one or more features as described herein.

It will be understood that a switching configuration utilizing a plurality of SOI FET devices having one or more features as described herein can include more than three poles. Further, it is noted that in the examples of FIGS. 64-67, the number of throws (e.g., 2 in FIGS. 64 and 65, and 3 in FIGS. 66 and 67) are depicted as being the same as the corresponding number of poles for convenience. However, it will be understood that the number of throws may be different than the number of poles.

FIG. 64 shows an example of how four SPST switches (e.g., similar to the examples of FIGS. 58, 59) having one or more features as described herein can be utilized to form a switch assembly 255 having a DPDT configuration. FIG. 65 shows, in a DPDT representation, that the switch assembly 255 of FIG. 64 can be utilized in an antenna switch configuration 265. It will be understood that one or more features of the present disclosure can also be utilized in switching applications other than antenna switching application.

In the examples of FIGS. 64 and 65, the DPDT functionality is shown to be provided by four SPST switches 100a, 100b, 100c, 100d. The first SPST switch 100a is shown to provide a switchable path between a first pole P1 (Ant1 in FIG. 65) and a first throw T1 (TRx1 in FIG. 65), the second SPST switch 100b is shown to provide a switchable path between a second pole P2 (Ant2 in FIG. 65) and the first throw T1 (TRx1 in FIG. 65), the third SPST switch 100c is shown to provide a switchable path between the first pole P1 (Ant1 in FIG. 65) and a second throw T2 (TRx2 in FIG. 65), and the fourth SPST switch 100d is shown to provide a switchable path between the second pole P2 (Ant2 in FIG. 65) and the second throw T2 (TRx2 in FIG. 65). Accordingly, selective coupling between one or more of the poles (antenna nodes) with one or more of the throws (TRx nodes) can be achieved by selective switching operations of the four SPST switches 100a, 100b, 100c, 100d. Examples of such switching operations are described herein in greater detail.

FIG. 66 shows an example of how nine SPST switches (e.g., similar to the examples of FIGS. 58, 59) having one or more features as described herein can be utilized to form a switch assembly 255 having a 3P3T configuration. FIG. 67 shows, in a 3P3T representation, that the switch assembly 255 of FIG. 66 can be utilized in an antenna switch configuration 265. It will be understood that one or more features of the present disclosure can also be utilized in switching applications other than antenna switching application.

Referring to the examples of FIGS. 66 and 67, it is noted that the 3P3T configuration can be an extension of the DPDT configuration of FIGS. 64 and 65. For example, a third pole (P3) can be utilized as a third antenna node (Ant3), and a third throw (T3) can be utilized as a third TRx node (TRx3). Connectivity associated with such third pole and third throw can be implemented similar to the examples of FIGS. 64 and 65.

In the examples of FIGS. 66 and 67, the 3P3T functionality is shown to be provided by nine SPST switches 100a-100i. Such nine SPST switches can provide switchable paths as listed in Table 1.

TABLE 1

| SPST switch | Pole | Throw |
|---|---|---|
| 100a | P1 | T1 |
| 100b | P2 | T1 |
| 100c | P3 | T1 |
| 100d | P1 | T2 |
| 100e | P2 | T2 |
| 100f | P3 | T2 |
| 100g | P1 | T3 |
| 100h | P2 | T3 |
| 100i | P3 | T3 |

Based on the example of FIGS. 66 and 67, and Table 1, one can see that selective coupling between one or more of the poles (antenna nodes) with one or more of the throws (TRx nodes) can be achieved by selective switching operations of the nine SPST switches 100a-100i.

In many applications, switching configurations having a plurality of poles and a plurality of throws can provide increased flexibility in how RF signals can be routed therethrough. FIGS. 68A-68E show examples of how a DPDT switching configuration such as the examples of FIGS. 64 and 65 can be operated to provide different signal routing functionalities. It will be understood that similar control schemes can also be implemented for other switching configurations, such as the 3P3T examples of FIGS. 66 and 67.

In some wireless front-end architectures, two antennas can be provided, and such antennas can operate with two channels, with each channel being configured for either or both of Tx and Rx operations. For the purpose of description, it will be assumed that each channel is configured for both Tx and Rx operations (TRx). However, it will be understood that each channel does not necessarily need to have such TRx functionality. For example, one channel can be configured for TRx operations, while the other channel can be configured for Rx operation. Other configurations are also possible.

In the foregoing front-end architectures, there may be relatively simple switching states including a first state and a second state. In the first state, the first TRx channel (associated with the node TRx1) can operate with the first antenna (associated with the node Ant1), and the second TRx channel (associated with the node TRx2) can operate with the second antenna (associated with the node Ant2). In the second state, connections between the antenna nodes and the TRx nodes can be swapped from the first state. Accordingly, the first TRx channel (associated with the node TRx1) can operate with the second antenna (associated with the node Ant2), and the second TRx channel (associated with the node TRx2) can operate with the first antenna (associated with the node Ant1).

In some embodiments, such two states of the DPDT switching configuration can be controlled by a one-bit logic scheme, as shown in the example logic states in Table 2.

TABLE 2

| State | Control logic | TRx1-Ant1 connection | TRx1-Ant2 connection | TRx2-Ant1 connection | TRx2-Ant2 connection |
|---|---|---|---|---|---|
| 1 | 0 | Yes | No | No | Yes |
| 2 | 1 | No | Yes | Yes | No |

Figure 68A:
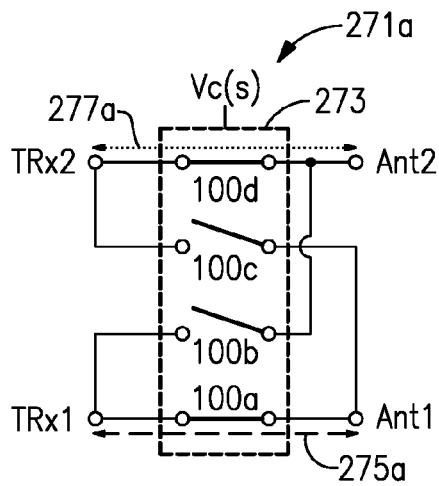
FIGS. 68A-68E show examples of how a DPDT switching configuration such as the examples of FIGS. 64 and 65 can be operated to provide different signal routing functionalities.
Figure 68B:
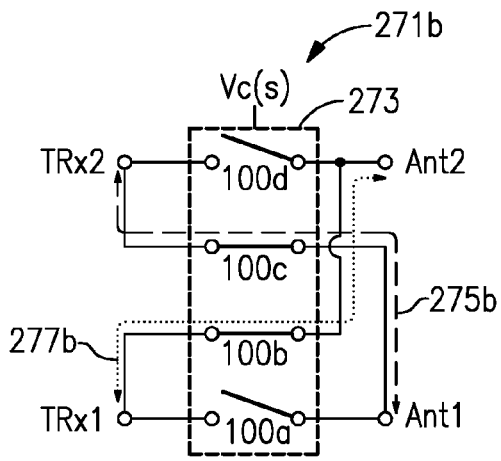

The first state (State 1) of the example of Table 2 is depicted in FIG. 68A as 271a, where the TRx1-Ant1 connection is indicated as path 275a, and the TRx2-Ant2 connection is indicated as path 277a. A control signal, representative of the control logic of Table 2, provided to the assembly (273) of the four SPST switches (100a, 100b, 100c, 100d) is collectively indicated as Vc(s). Similarly, the second state (State 2) of the example of Table 2 is depicted in FIG. 68B as 271b, where the TRx1-Ant2 connection is indicated as path 277b, and the TRx2-Ant1 connection is indicated as path 275b.

In some front-end architectures having a DPDT switching configuration, it may be desirable to have additional switching states. For example, it may be desirable to have only one path active among the two TRx channels and the two antennas. In another example, it may be desirable to disable all signal paths through the DPDT switch. Examples of 3-bit control logic that can be utilized to achieve such examples switching states are listed in Table 3.

TABLE 3

| State | Control logic (Vc1, Vc2, Vc3) | TRx1-Ant1 connection | TRx1-Ant2 connection | TRx2-Ant1 connection | TRx2-Ant2 connection |
|---|---|---|---|---|---|
| 1 | 0, 0, 0 | No | No | No | No |
| 2 | 0, 0, 1 | Yes | No | No | Yes |
| 3 | 0, 1, 0 | Yes | No | No | No |
| 4 | 0, 1, 1 | No | Yes | Yes | No |
| 5 | 1, 0, 0 | No | Yes | No | No |

Figure 68C:
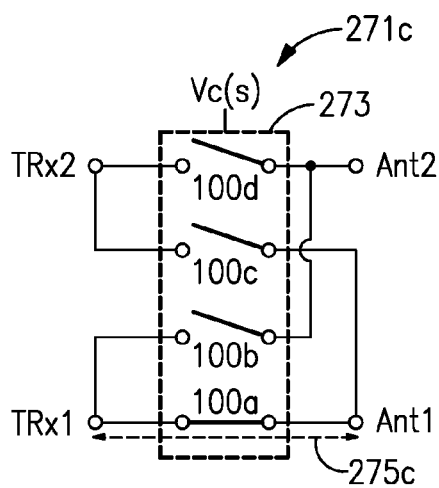
Figure 68D:
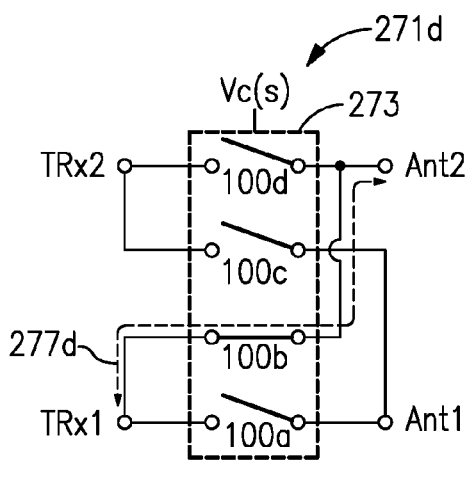
Figure 68E:
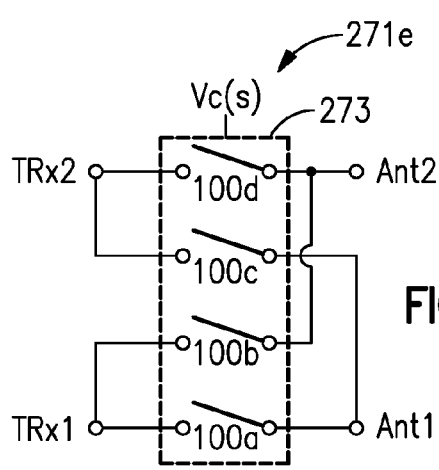

The first state (State 1) of the example of Table 3 is depicted in FIG. 68E as 271e, where all of the TRx-Ant paths are disconnected. A control signal indicated as Vc(s) in FIG. 68E and as listed in Table 3 can be provided to the assembly (272) of the four SPST switches (100a, 100b, 100c, 100d) to effectuate such a switching state.

The second state (State 2) of the example of Table 3 is depicted in FIG. 68A as 271a, where the TRx1-Ant1 connection is indicated as path 275a, and the TRx2-Ant2 connection is indicated as path 277a. A control signal indicated as Vc(s) in FIG. 68A and as listed in Table 3 can be provided to the assembly (273) of the four SPST switches (100a, 100b, 100c, 100d) to effectuate such a switching state.

The third state (State 3) of the example of Table 3 is depicted in FIG. 68C as 271c, where the TRx1-Ant1 connection is indicated as path 275c, and all other paths are disconnected. A control signal indicated as Vc(s) in FIG. 68C and as listed in Table 3 can be provided to the assembly (273) of the four SPST switches (100a, 100b, 100c, 100d) to effectuate such a switching state.

The fourth state (State 4) of the example of Table 3 is depicted in FIG. 68B as 271b, where the TRx1-Ant2 connection is indicated as path 277b, and the TRx2-Ant1 connection is indicated as path 275b. A control signal indicated as Vc(s) in FIG. 68B and as listed in Table 3 can be provided to the assembly (273) of the four SPST switches (100a, 100b, 100c, 100d) to effectuate such a switching state.

The fifth state (State 5) of the example of Table 3 is depicted in FIG. 68D as 270d, where the TRx1-Ant2 connection is indicated as path 277d, and all other paths are disconnected. A control signal indicated as Vc(s) in FIG. 68D and as listed in Table 3 can be provided to the assembly (273) of the four SPST switches (100a, 100b, 100c, 100d) to effectuate such a switching state.

As one can see, other switching configurations can also be implemented with the DPDT switch of FIGS. 68A-68E. It will also be understood that other switches such as 3P3T of FIGS. 66 and 67 can be controlled by control logic in a similar manner.

Cavity and Trench/Opening Formation

Various characteristics of substrates or other components of RF devices can contribute to non-linearity in performance. As an example, characteristics in silicon and silicon-on-insulator (SOI) technologies that can lead to degradation in performance may include substrate resistivity and/or dielectric permittivity of the substrate. Such characteristics may be particularly problematic when dealing with relatively high-frequency and radio frequency (RF) applications that utilize silicon and/or SOI technologies. Specifically, the resistivity and permittivity of the substrate are factors that can affect losses in the device. Increasing the resistivity and lowering the permittivity of the substrate may help lower such signal losses of devices. Furthermore, selectively increasing the resistivity and lowering the dielectric permittivity between circuit elements of a device may also improve the isolation and linearity of the device.

The losses described above can lead to non-linearity that can negatively impact performance in a number of ways. For example, certain components of an SOI or other type of semiconductor structure may be susceptible to cross-talk with neighboring electrical components laterally and/or vertically through semiconductor substrate or other layer/component. In certain embodiments, SOI and/or other types of semiconductor devices may include contacts for electrically connecting to passive elements, such as inductors, capacitors, or the like, which may generally have performance factor, or Q value, characteristics that provide a measurement of their efficiency. Maximizing the Q value can be achieved through minimizing both the resistance of the passive device (e.g., inductor) as well as the energy loss into the substrate and surrounding dielectric material when energized. The use of low dielectric constant (i.e., low-k) materials in the construction of planar inductor coils may be used to at least partially decrease the radio frequency (RF) energy lost into the surrounding material, thus improving the inductor Q value, especially at relatively high frequencies. In certain embodiments, relatively highly-engineered substrates, rather than traditional bulk substrate in layer-transfer processes, may be implemented to at least partially reduce parasitic bulk capacitance and/or improve active device linearity.

The formation of cavities and/or openings in semiconductor device structures may also be used in semiconductor processing to replace at least some of the material surrounding inductors, laterally and/or vertically, with air, dielectric or vacuum, which may exhibit substantially low k value characteristics, thereby potentially reducing RF loss when such cavities/openings are strategically placed around or near certain circuit elements; cavities may improve both passive and active device performance. The terms "cavity" and "opening" are used herein according to their broad and ordinary meanings and may refer to any space (e.g., three-dimensional space), via, or region that includes air, dielectric, or other material or vacuum contained within one or more physical barriers; generally, a "cavity" may not have semiconductor substrate or dielectric disposed therein, at least in a region characterized as the "cavity." Cavities and/or openings may be referred to herein as silicon-on-nothing (SON) structures. The term "trench" is also used herein according to its broad and ordinary meaning, and may be used to describe a recess, cut-out, opening, cavity, concavity, or the like, and may be used substantially interchangeably herein with the terms opening and/or cavity in certain contexts and in connection with certain embodiments.

Cavities and/or openings may be formed at the wafer-level or at the die level, using various approaches. For example, disclosed herein are devices and methods associated with the creation of cavities and/or openings nearby critical passive elements by creating them above and/or underneath such elements. Certain embodiments disclosed provide for the formation of backside via SON structures and methods of fabricating the same.

Backside via technology can be used to increase the resistivity and lower the permittivity of substrates. By selectively utilizing backside via technology on silicon and SOI-based devices, the substrate resistivity can be increased and the permittivity can be lowered on circuits and discrete elements in circuits. Various methods may be implemented for integrating backside via technology into silicon and SOI-based devices. For example, some embodiments involve a SOI wafer device that has a through-wafer via opening area directly underneath at least a portion of a device that contains passive components that are desired to be isolated. Such a device may be created in part by starting with a front-side substantially completed silicon or SOI wafer, wherein the waver is first thinned, after which the backside of the wafer may be patterned in order to create an opening in, for example, photoresist in the area where a backside isolation/opening is desired. The silicon in the photoresist opening may then be selectively etched to the backside of the oxide (BOX) layer of the SOI device using any suitable techniques (e.g., wet etching with potassium hydroxide or tetramethyl ammonium hydroxide, etc.). The opening may then be filled using one or more materials, such as a thin polysilicon layer followed by a low K dielectric.

In certain embodiments, the performance of the device may be varied through the use of different shapes/geometry with respect to the openings, different fill materials, and/or different fill material thicknesses. The opening/via structures described in the various embodiments disclosed herein may be positioned under and/or over a passive area of a device. Additionally or alternatively, openings can be selectively fabricated under and/or over active areas of circuits and devices, between active areas, between active and passive areas, or otherwise positioned. Vias/openings may also be formed in a variety of shapes and patterns on devices and circuits to optimize performance and/or mechanical strength.

FIG. 69A shows a process 3700 that can be implemented to form one or more dielectric-filled openings in an SOI device or structure having one or more features as described herein. The embodiment shown in FIG. 69A may provide for dielectric-filled opening creation under one or more passive (or active) elements of an SOI device structure. FIG. 69B shows examples of various stages of the fabrication processes of FIG. 69A. By creating backside openings in semiconductor devices and filling such openings with dielectric material having a dielectric constant value of approximately 2-4, or less, device performance may be improved in certain embodiments. In the examples of FIGS. 69A and 69B, it will be understood that the various blocks, or stages, may or may not be performed in the example sequences illustrated. Furthermore, various of the illustrated and described steps may be omitted in certain embodiments, or additional steps may be implemented that are not explicitly described while remaining within the scope of the present disclosure.

At block 3702, the process 3700 involves providing an SOI wafer 3801, or portion thereof, having one or more device and/or connections, as shown at stage 3801. The associated example wafer structure 3801 may correspond to certain SOI processes disclosed above. Specifically, the structure 3801 may include one or more of a bulk substrate 3806, buried oxide (BOX) layer 3804, active semiconductor device(s) 3850, through-BOX via(s) 3808, electrical connections (e.g., metal stack) 3810, passivation layer 3814, and/or other features.

The substrate (e.g., silicon) layer 3806 may provide stability to the structure 3801, thereby allowing for formation of certain of the remaining layers that may not be formable without being associated with a mechanically-stabilizing substrate/wafer. For example, in certain embodiments, the passivation layer/area 3814 may be approximately 10 µm thick, wherein the substrate layer 3806 is substantially thicker (e.g., approximately 600 µm think) to provide mechanical stability to the passivation layer 3814 and associated components. The passivation layer/area 3814 may comprise one or more dielectric layers. In certain contexts, an upper-most layer or portion of the one or more dielectric layers that make up the passivation layer/area 3814 may be referred to as a/the passivation layer.

In certain embodiments, wherein a plurality of elements are printed on a single die/chip, it may be desirable to at least partially prevent or reduce cross-talk between such elements. For example, separate elements may cross-talk through the substrate layer 3806, where one or more components carrying RF signal(s) may capacitively couple to the substrate 3806, such that the substrate 3806 may carry such signal(s) laterally and couple to neighboring elements, possibly leading to performance degradation.

At block 3704, the process 3700 involves at least partially thinning or removing the backside substrate layer 3806. For example, as shown in structure 3803, the backside substrate 3806 may be thinned to result in a substrate layer 3811 thinner than the substrate layer 3806 shown in structure 3801. At block 3706, the process 3700 involves selectively removing a portion of the substrate 3811 to form an opening 3874, which may expose at least a portion of the oxide layer 3804. The opening 3874 may comprise a hole or trench etched in the substrate 3811, which may extend all the way through the substrate layer to the backside of the oxide layer 3804, or alternatively may extend only part of the way through the substrate 3811, or may extend all the way through the substrate, but may not expose the oxide layer 3804 due to the presence of an intermediate material, such as a nitride or dielectric layer covering at least a portion of the backside of the oxide layer 3804. The positioning of the opening 3874 may be implemented to achieve desired RF isolation in the semiconductor die. For example, the opening 3874 may be disposed at least partially under a passive device or element, and/or an active element (e.g., the active device(s) 3850), depending on the isolation needs of the circuit. Therefore, the patterned opening 3874 may be disposed in regions where improved linearity performance is desired. To such end, the wafer 3805 may undergo photo image processing to define the desirable pattern in the substrate 3811 where the opening is desired.

The process 3700 may further involve applying a layer of dielectric material 3870 at least partially over the opening 3874 at block 3708. The dielectric layer 3870 may comprise, for example, borosilicon glass, polysilicon, silicon, or other type of material. In certain embodiments, the dielectric layer 3870 includes a relatively thin polysilicon layer followed by a low-K dielectric material. The dielectric layer 3870 may comprise polyimide in certain embodiments.

In certain embodiments, the dielectric layer 3870, or portion thereof, may be used as an attachment medium for attaching a replacement substrate (not shown) and/or to provide structural protection for the opening. The dielectric layer 3870 may be applied to the wafer backside over the opening 3874 and/or surrounding substrate 3811. The bottom surface of the dielectric layer 3870 may be substantially planar over the opening area, or may be slightly recessed in an area associated with the opening/trench 3874 as a result of surface tension, pressure, or other factor(s). The dielectric material 3870 may further serve to keep contaminants from coming in contact with certain features of the structure 3807, such as with the oxide layer 3804. In certain embodiments, the dielectric material 3870 is a spin-on dielectric application.

Certain embodiments disclosed herein provide for creation of openings/vias/trenches that are not filled with dielectric, but are instead covered to provide an air cavity in the desired region of the device. For example, a front-side completed silicon or SOI wafer may be first thinned using any suitable technology. The backside of the wafer may then be patterned so that there is an opening in the photoresist in the area where the backside opening is desired. The silicon in the photoresist opening may then be selectively etched to the oxide layer (BOX) of the SOI device using any suitable technique (e.g., wet etching with potassium hydroxide or tetramethyl ammonium hydroxide, or other technology). An air cavity may then be created in the selected area using any suitable technique, such as by applying a laminate, b-stage or c-stage epoxy onto the backside of the wafer and then curing the material. The performance of the device can be varied through the use of different shapes/geometry for the openings, different wafer thicknesses, and/or different encapsulating materials. The opening/via/trench structures described in the various embodiments disclosed herein may be positioned under and/or over a passive area of a device. Additionally or alternatively, openings can be selectively fabricated under and/or over active areas of circuits and devices, between active areas, between active and passive areas, or otherwise positioned. Vias/openings/trenches may also be formed in a variety of shapes and patterns on devices and circuits to optimize performance and/or mechanical strength.

FIG. 70 shows a process 3900 that can be implemented to form one or more cavities in an SOI device or structure having one or more features as described herein. FIG. 71 shows examples of various stages/structures of the fabrication processes of FIG. 70. The embodiments disclosed in FIGS. 70 and 71 may be implemented to provide opening creation above, beneath and/or around certain electrical element(s), such as passive element(s) of an SOI device. In the examples of FIGS. 70 and 71, it will be understood that the various blocks, or stages, may or may not be performed in the example sequences illustrated. Furthermore, various of the illustrated and described steps may be omitted in certain embodiments, or additional steps may be implemented that are not explicitly described while remaining within the scope of the present disclosure.

At block 3902, the process 3900 involves providing at least a portion of a SOI wafer or die having one or more devices and/or connections formed or otherwise associated therewith, as described in various embodiments above. Certain of the features illustrated in FIG. 71 may be similar in certain respects to certain features illustrated in figures described above, and therefore, for simplicity, detailed description of such features may not be provided here.

The substrate layer 4006 may provide stability to the structure 4001, thereby allowing for formation of certain of the remaining layers that may not be formable without being associated with a mechanically stabilizing substrate/wafer.

For example, in certain embodiments, the passivation layer/area 4014 may be approximately 10 µm thick, wherein the substrate layer 4006 is substantially thicker (e.g., approximately 600 µm think) to provide mechanical stability to the passivation layer 4014 and associated components. The passivation layer/area 4014 may comprise one or more dielectric layers. In certain contexts, an upper-most layer or portion of the one or more dielectric layers that make up the passivation layer/area 4014 may be referred to as a/the passivation layer. In certain embodiments, wherein a plurality of elements are printed on a single die/chip, it may be desirable to at least partially prevent or reduce cross-talk between such elements. For example, separate elements may cross-talk through the substrate layer 4006, where one or more components carrying RF signal(s) may capacitively couple to the substrate 4006, such that the substrate 4006 may carry such signal(s) laterally and couple to neighboring element(s), possibly leading to performance degradation.

At block 3904, the process 3900 involves at least partially thinning or removing the backside substrate layer 4006. For example, as shown in structure 4003, the backside substrate 4006 may be thinned to result in a substrate layer 4011 thinner than the substrate layer 4006 shown in structure 4001.

Certain embodiments disclosed herein provide for the creation of a trench or cavity in a substrate layer by patterning the substrate layer 4011 itself. For example, patterning may be done using various established photolithography techniques, or the like. At block 3906, the process 3900 involves selectively removing a portion of the substrate 4011 to form an opening or trench 4074, which may expose at least a portion of the oxide layer 4004, or alternatively may extend only part of the way through the substrate 4011, or may extend all the way through the substrate, but may not expose the oxide layer 4004 due to the presence of an intermediate material, such as a nitride or dielectric layer covering at least a portion of the backside of the oxide layer 4004. The positioning of the opening 4074 may be implemented to achieve desired RF isolation in the semiconductor die. For example, the opening 4074 may be disposed at least partially under a passive device or element, and/or an active element, depending on the isolation needs of the circuit. Therefore, the patterned opening 4074 may be disposed in regions where improved linearity performance is desired.

The process 3900 may further involve applying a cap layer 4009 at least partially over the opening 4074 at block 3908 to form a cavity 4075. The cap layer 4009 may be applied to the wafer backside on top of the opening 4074 and/or surrounding substrate 4011. In certain embodiments, the cap layer 4009 is permanently bonded to the wafer 4007 and provides structural support for the wafer. In certain embodiments, the cap layer 4009, and may comprise a tape layer, rigid structure, or other material or structure. The cap layer 4009 may advantageously comprise dielectric properties that are more electrically insulating than silicon, and may have a dielectric constant value of approximately 2-4 or less in certain embodiments. Furthermore, the cap layer 4009 may comprise a tape having markings thereon that may be used to help with laser marking, reducing edge chip-out, or for other purposes.

The cap layer 4009 may be a film or tape. For example, the layer 4009 may comprise an adhesive strip, film, structure, or the like. In certain embodiments, the layer 4009 may comprise a laminate material, which may be associated with an epoxy-type material. The layer 4009 may be less than 50 µm in thickness, such as approximately 25 µm, or less. In certain embodiments, the layer 4009 comprises a plastic or polymer film.

The cavity 4075 may have any shape and/or configuration. Furthermore, the cavity 4075 may be positioned below or adjacent to one or more active devices, such as the FET 4050. The cavity may further be positioned such that one or more active devices is at least partially disposed within, or exposed within, the cavity. Furthermore, the cavity 4075 may be positioned below or adjacent to one or more passive devices, such as an inductor. The cavity may further be positioned such that one or more passive devices is at least partially disposed within, or exposed within, the cavity.

It should be understood that the illustrated dimensions of FIG. 71 are for illustrative purposes only, and the various layers and/or components of FIG. 71 are not drawn to scale, and relative thicknesses and/or widths of the various layers and/or components may be substantially greater of less in implementation than shown.

While described above are processes and embodiments for patterning for cavity, trench and/or opening creation on a backside of a wafer, the description below in connection with FIGS. 72-75 may describe patterning for cavity and/or opening creation on a front-side of a wafer.

FIG. 72 shows a process 4100 that can be implemented to form one or more electrically-isolating openings on a front side of a wafer in a device or structure having one or more features as described herein. FIG. 73 shows examples of various stages of the fabrication processes of FIG. 72. In the examples of FIGS. 72 and 73, it will be understood that the various blocks, or stages, may or may not be performed in the example sequences illustrated. Furthermore, various illustrated and/or described steps may be omitted in certain embodiments, or additional steps may be implemented that are not explicitly described while remaining within the scope of the present disclosure. Certain of the features illustrated in FIG. 73 may be similar in certain respects to certain features illustrated in figures described above, and therefore, for simplicity, detailed description of such features may not be provided here.

At block 4102, the process 4100 involves providing at least a portion of an SOI wafer having one or more devices and/or connections formed or otherwise associated therewith, as described in various embodiments above. The process 4100 may provide for creation of an opening structure above, for example, a passive element of an SOI device. An electrical element 4212, such as a passive device, for example (e.g., inductor, capacitor, etc.) may be disposed on a front side of the wafer structure 4201. In addition, a handle wafer layer 4216 may be disposed on the front side of the wafer structure 4201 at least partially above the electrical element 4212.

Certain embodiments disclosed herein provide for the creation of an opening in a substrate layer by patterning the substrate layer (e.g., the handle wafer 4216) itself. For example, patterning may be done using various established photolithography techniques, prior to bonding the original wafer to its final substrate. At block 4104, the process 4100 involves selectively removing a portion of the handle wafer 4216 to form an opening or trench 4274, which may expose at least a portion of the passivation layer 4214 and/or electrical element 4212, or alternatively may extend only part of the way through the substrate 4216, or may extend all the way through the substrate, but may not expose the passivation layer due to the presence of an intermediate material, such as a nitride or other dielectric layer covering at least a portion of the passivation layer 4214. The positioning of the opening/trench 4274 may be implemented to achieve desired RF isolation in the semiconductor die, such as over one or more passive or active devices, or may be positioned such that one or more active or passive devices are at least partially within the opening/trench 4274.

The process 4100 may further involve applying a layer of dielectric material 4270 at least partially over the opening/trench 4274 at block 4106. The dielectric layer 4270 may comprise, for example, borosilicon glass, polysilicon, silicon, or other type of material. In certain embodiments, the dielectric layer 4270 includes a relatively thin polysilicon layer followed by a low-K dielectric material. In certain embodiments, the dielectric layer 4270 may be used as an attachment medium for attaching a replacement substrate (not shown) and/or to provide structural protection for the opening. The dielectric layer 4270 may be applied to the front side of the wafer on top of the opening 4274 and/or surrounding substrate 4216.

Figure 74:
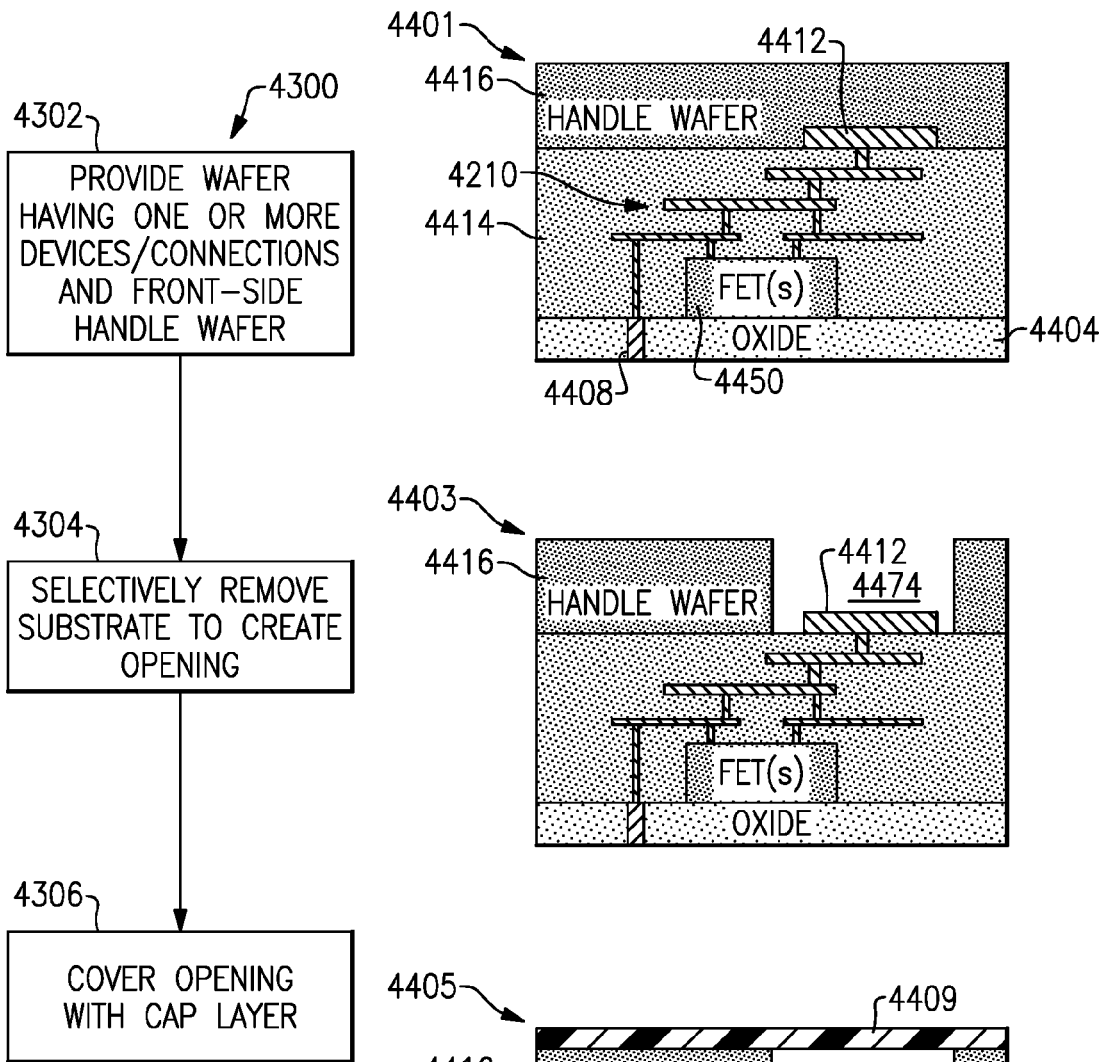
FIG. 74 shows a process for forming a cavity in accordance with one or more embodiments disclosed herein.
Figure 75:
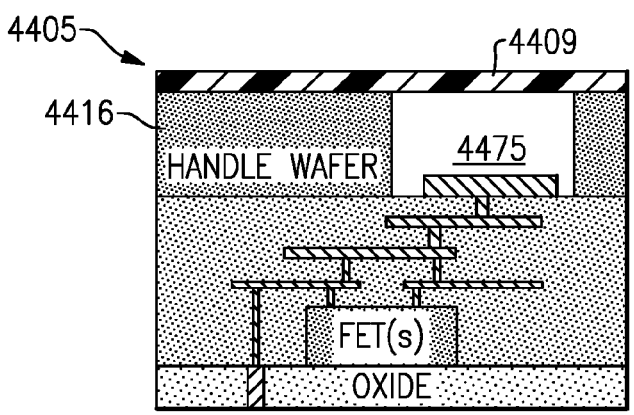
FIG. 75 shows examples of various structures associated with a cavity formation processes in accordance with one or more embodiments disclosed herein.

FIG. 74 shows a process 4300 that can be implemented to form one or more electrically-isolating cavities in an SOI device or structure having one or more features as described herein. FIG. 75 shows examples of various stages of the fabrication processes of FIG. 74. In the examples of FIGS. 74 and 75, it will be understood that the various blocks, or stages, may or may not be performed in the example sequences illustrated. Furthermore, various of the illustrated and/or described steps may be omitted in certain embodiments, or additional steps may be implemented that are not explicitly described while remaining within the scope of the present disclosure. Certain of the features illustrated in FIG. 75 may be similar in certain respects to certain features illustrated in figures described above, and therefore, for simplicity, detailed description of such features may not be provided here.

At block 4302, the process 4300 involves providing at least a portion of an SOI wafer having one or more devices and/or connections formed or otherwise associated therewith, as described in various embodiments above. The process 4300 may provide for cavity creation above, for example, a passive element, or active element (e.g., FET 4450), of an SOI device using single-layer transfer. An electrical element 4412, such as a passive device, for example (e.g., inductor, capacitor, etc.) may be disposed on a front-side of the wafer structure 4401. In addition, a handle wafer layer 4416 may be disposed on the front side of the wafer structure 4401 at least partially above the electrical element 4412.

Certain embodiments disclosed herein provide for the creation of an opening or trench in the handle wafer layer 4416 by patterning the layer itself. For example, patterning may be done using various established photolithography techniques, such as prior to bonding the original wafer to its final substrate. At block 4304, the process 4300 involves selectively removing a portion of the handle wafer 4416 to form an opening or trench 4474, which may expose at least a portion of the passivation layer 4414 and/or electrical element 4412. In certain embodiments, the opening/trench 4474 may extend only part of the way through the substrate 4216, or may extend all the way through the substrate, but may not expose the passivation layer 4414 due to the presence of an intermediate material, such as a nitride or other dielectric layer covering at least a portion of the passivation layer 4414. The positioning of the opening 4474 may be implemented to achieve desired RF isolation in the semiconductor die, such as over and/or above at least part of a passive or active (e.g., FET 4450) device.

The process 4300 may further involve applying a cap layer 4409 at least partially over the opening 4474 at block 4306 to form a cavity 4475. The cap layer 4409 may be applied to the front side of the wafer on top of the opening 4474 and/or surrounding substrate 4416. In certain embodiments, the cap layer 4409 is permanently bonded to the wafer 4205 and provides structural support for the wafer. In certain embodiments, the cap layer 4409 may comprise a tape layer, rigid structure, or other material or structure. The cap layer 4409 may advantageously comprise dielectric properties that are more electrically insulating than silicon, and may have a dielectric constant value of approximately 2-4 or less in certain embodiments. Furthermore, the cap layer 4009 may comprise a tape having markings thereon that may be used to help with laser marking, reducing edge chip-out, or for other purposes.

The cap layer 4409 may be a film or tape. For example, the layer 4409 may comprise an adhesive strip, film, structure, or the like. In certain embodiments, the layer 4009 may comprise a laminate material, which may be associated with an epoxy-type material. The layer 4409 may be less than 50 μm in thickness, such as approximately 25 μm, or less. In certain embodiments, the layer 4409 comprises a plastic or polymer film.

The cavity 4475 may have any shape and/or configuration. Furthermore, the cavity 4475 may be positioned below or adjacent to one or more active devices, such as the FET 4450. The cavity may further be positioned such that one or more active devices is at least partially disposed within, or exposed within, the cavity. Furthermore, the cavity 4475 may be positioned below or adjacent to one or more passive devices, such as an inductor. The cavity may further be positioned such that one or more passive devices is at least partially disposed within, or exposed within, the cavity.

It should be understood that the illustrated dimensions of FIG. 75 are for illustrative purposes only, and the various layers and/or components of FIG. 75 are not drawn to scale, and relative thicknesses and/or widths of the various layers and/or components may be substantially greater of less in implementation than shown.

FIGS. 76A-76C show embodiments of die structures 4500A, 4500B, 4500C that include generally rectangular-shaped cavities 4575A, 4575B, 4575C. FIG. 76A shows an embodiment of a die structure 4500A that includes a plurality of cavities 4575A formed in substantially geometrically alignment over at least portions of RF core and energy management (EM) core regions of the die 4500A.

FIG. 76B shows an embodiment of a die wherein cavities 4575 are arranged to cover at least a portion of an RF core region of the die, while an EM core portion of the die is substantially free of cavities in at least certain regions thereof. In the embodiment of FIG. 76C, cavities 4575C may be arranged in clusters (e.g., cluster 4577), which may be positioned around, or at least partially overlapping with, certain devices that are desired to be isolated to some degree.

While generally rectangular-shaped cavities are illustrated in FIGS. 76A-76C, it should be understood that cavities of any shape or configuration may be implemented within the scope of the present disclosure. FIGS. 77A-77C show embodiments of die structures 4600A, 4600B, 4600C that include generally hexagonally-shaped cavities 4675A, 4675B, 4675C. FIG. 77A shows an embodiment of a die structure 4600A that includes a plurality of cavities 4675A formed in substantially geometrically alignment over at least portions of RF core and EM core regions of the die 4600A.

FIG. 77B shows an embodiment of a die wherein cavities 4675 are arranged to cover at least a portion of an RF core region of the die, while an EM core portion of the die is substantially free of cavities in at least certain regions thereof. In the embodiment of FIG. 77C, cavities 4675C may be arranged in clusters (e.g., cluster 4677), which may be positioned around, or at least partially overlapping with, certain devices that are desired to be isolated to some degree.

Examples of Implementations in Products

Various examples of FET-based circuits and bias/coupling configurations described herein can be implemented in a number of different ways and at different product levels. Some of such product implementations are described by way of examples.

Semiconductor Die Implementation

Figure 78A:
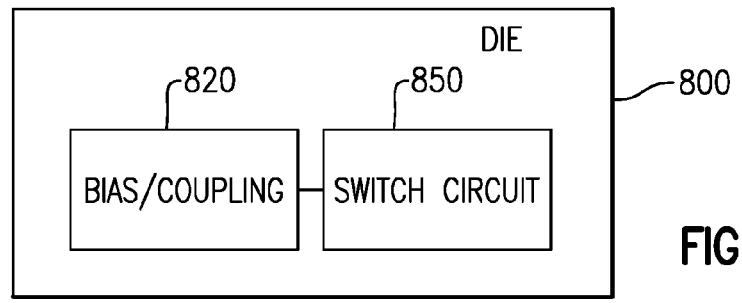
FIGS. 78A-78D depict non-limiting examples of switching circuits and bias/coupling circuits as described herein can be implemented on one or more semiconductor die.
Figure 78B:
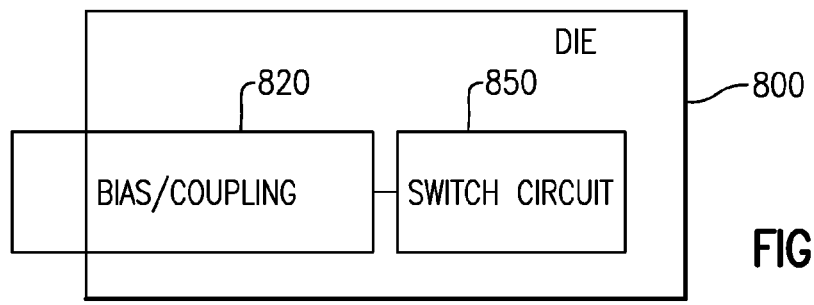

FIGS. 78A-78D schematically show non-limiting examples of such implementations on one or more semiconductor die. FIG. 78A shows that in some embodiments, a switch circuit 820 and a bias/coupling circuit 850 having one or more features as described herein can be implemented on a die 800. Certain of the switch and/or bias/coupling circuitry may be designed as to be isolated by one or more cavities formed according to one or more embodiments disclosed herein. FIG. 78B shows that in some embodiments, at least some of the bias/coupling circuit 850 can be implemented outside of the die 800 of FIG. 78A.

Figure 78C:
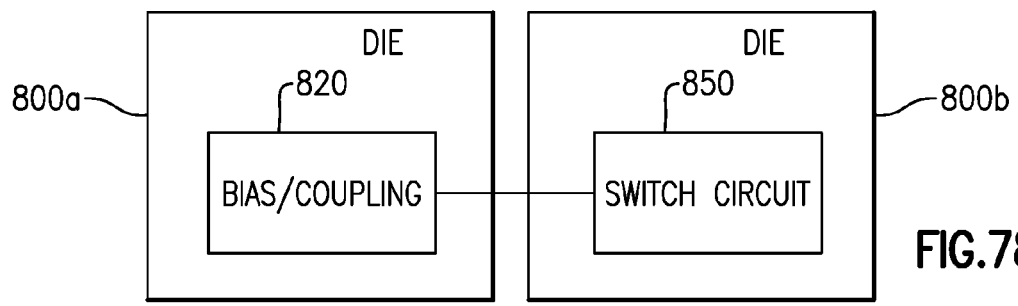
Figure 78D:
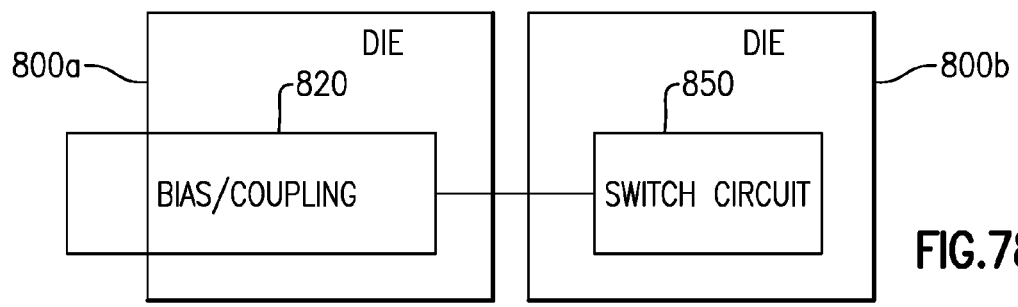

FIG. 78C shows that in some embodiments, a switch circuit 820 having one or more features as described herein can be implemented on a first die 800a, and a bias/coupling circuit 850 having one or more features as described herein can be implemented on a second die 800b. FIG. 78D shows that in some embodiments, at least some of the bias/coupling circuit 850 can be implemented outside of the first die 800a of FIG. 78C.

Packaged Module Implementation

Figure 79A:
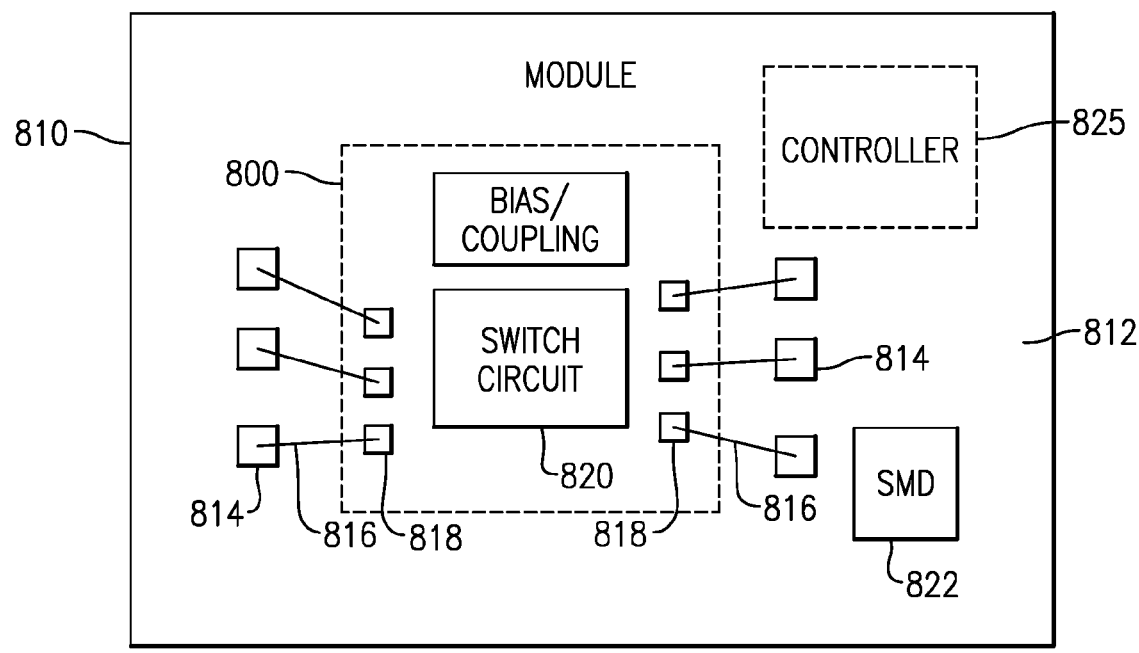
FIGS. 79A and 79B show plan and side views, respectively, of a packaged module having one or more features as described herein.

In some embodiments, one or more die having one or more cavity features described herein can be implemented in a packaged module. An example of such a module is shown in FIGS. 79A (plan view) and 79B (side view). Although described in the context of both of the switch circuit and the bias/coupling circuit being on the same die (e.g., example configuration of FIG. 79A), it will be understood that packaged modules can be based on other configurations.

A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having a switching circuit 820 and a bias/coupling circuit is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 79B:
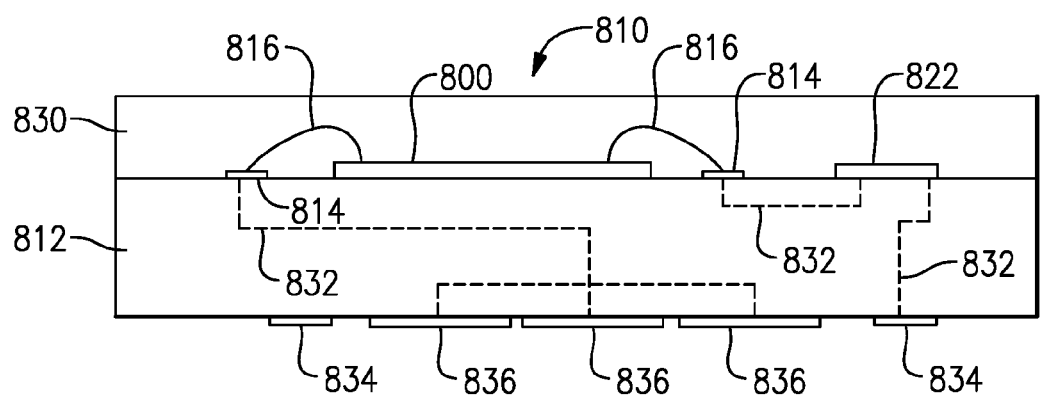
Figure 80:
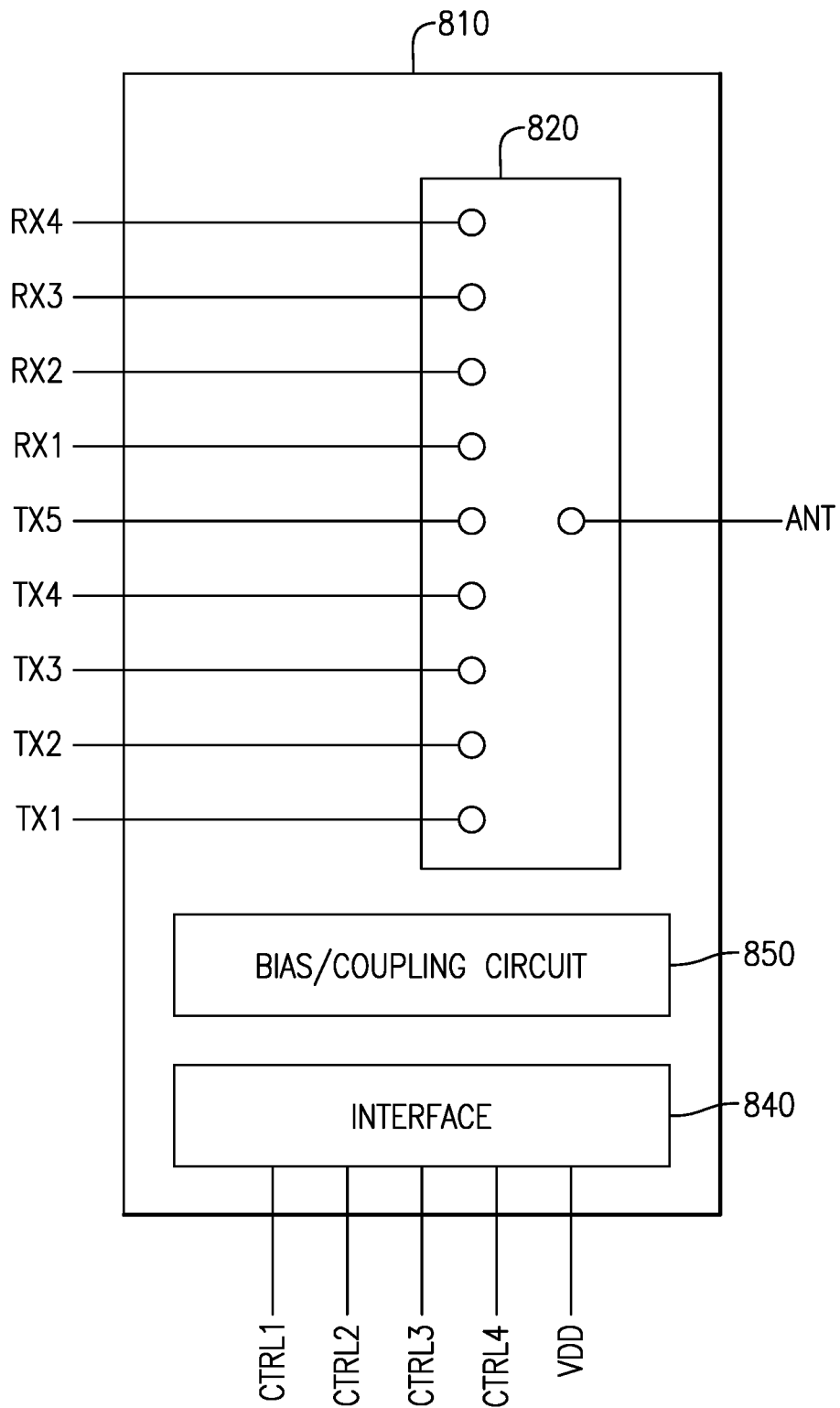
FIG. 80 shows a schematic diagram of an example switching configuration that can be implemented in the module of FIGS. 70A and 70B.

FIG. 80 shows a schematic diagram of an example switching configuration that can be implemented in the module 810 described in reference to FIGS. 79A and 79B. In the example, the switch circuit 820 is depicted as being an SP9T switch, with the pole being connectable to an antenna and the throws being connectable to various Rx and Tx paths. Such a configuration can facilitate, for example, multi-mode multi-band operations in wireless devices.

The module 810 can further include an interface for receiving power (e.g., supply voltage VDD) and control signals to facilitate operation of the switch circuit 820 and/or the bias/coupling circuit 850. In some implementations, supply voltage and control signals can be applied to the switch circuit 820 via the bias/coupling circuit 850.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 81:
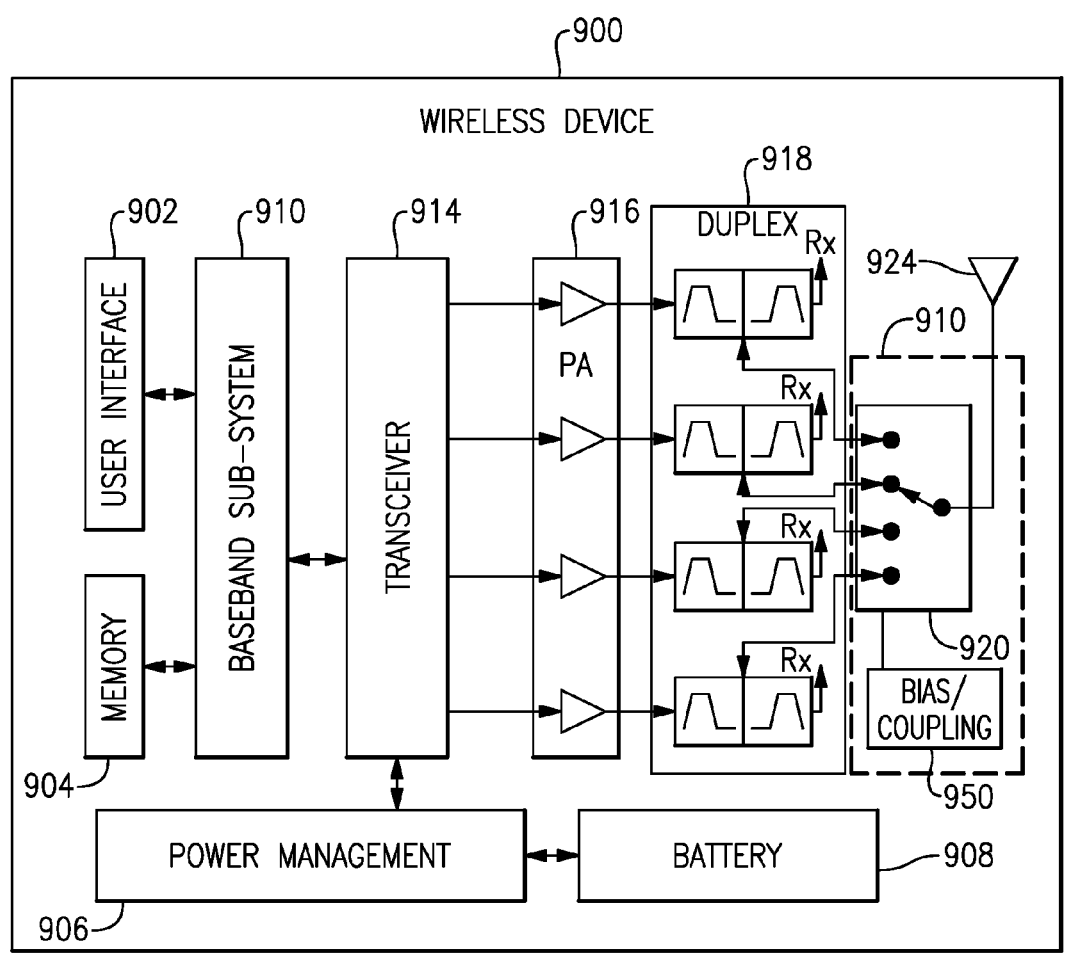
FIG. 81 depicts an example wireless device having one or more advantageous features described herein.

FIG. 81 schematically depicts an example wireless device 900 having one or more advantageous features described herein. In the context of various switches and various biasing/coupling configurations as described herein, a switch 920 and a bias/coupling circuit 950 can be part of a module 910. In some embodiments, such a switch module can facilitate, for example, multi-band multi-mode operation of the wireless device 900.

In the example wireless device 900, a power amplifier (PA) module 916 having a plurality of PAs can provide an amplified RF signal to the switch 920 (via a duplexer 920), and the switch 920 can route the amplified RF signal to an antenna. The PA module 916 can receive an unamplified RF signal from a transceiver 914 that can be configured and operated in known manners. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 810.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 918 can allow transmit and receive operations to be performed simultaneously using a common antenna (e.g., 924). In FIG. 81, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

General Comments

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of fabricating a radio-frequency device comprising:
providing a field-effect transistor formed over an oxide layer;
forming one or more electrical connections to the field-effect transistor;
forming one or more dielectric layers over at least a portion of the electrical connections;
electrically coupling an electrical element to the field-effect transistor via the one or more electrical connections;
disposing a handle wafer layer on at least a portion of the one or more dielectric layers, the handle wafer layer being at least partially over the electrical element; and
removing at least a portion of the handle wafer layer to form an opening exposing at least a portion of the electrical element.

2. The method of claim 1 further comprising thinning the handle wafer layer prior to said removing the at least a portion of the handle wafer layer.

3. The method of claim 1 further comprising covering at least a portion of the handle wafer layer and the opening with a covering to form a cavity.

4. The method of claim 3 wherein the covering is a laminate film.

5. The method of claim 3 wherein the covering is an additional replacement substrate layer.

6. The method of claim 1 further comprising at least partially filling the opening with a dielectric material.

7. The method of claim 6 further comprising covering at least a portion of the handle wafer layer with the dielectric material to form a dielectric layer.

8. The method of claim 7 further comprising applying a replacement substrate layer to the dielectric layer to provide mechanical stability for the radio-frequency device.

9. The method of claim 1 wherein the electrical element is a surface acoustic wave device.

10. The method of claim 1 wherein the electrical element is a bulk acoustic wave device.

11. The method of claim 1 further comprising at least partially removing the substrate layer to expose at least a portion of a backside of an oxide layer disposed between the field-effect transistor and the substrate layer.

12. The method of claim 11 further comprising disposing an electrical contact structure on the backside of the oxide layer to provide electrical contact to the one or more electrical connections through a through-oxide via.

13. The method of claim 11 further comprising disposing a substrate contact layer on the backside of the oxide layer.

14. A radio-frequency device comprising:
a field-effect transistor implemented over an oxide layer;
one or more electrical connections to the field-effect transistor;
one or more dielectric layers formed over at least a portion of the electrical connections;
an electrical element electrically coupled to the field-effect transistor via the one or more electrical connections; and
a handle wafer layer disposed on at least a portion of the one or more dielectric layers, the handle wafer layer including a topside trench defined at least in part by sidewall portions of the handle wafer layer, the trench exposing at least a portion of the electrical element.

15. The radio-frequency device of claim 14 further comprising a covering that covers at least a portion of the handle wafer layer and the trench to form a cavity.

16. The radio-frequency device of claim 14 further comprising a dielectric material that at least partially fills the trench.

17. The radio-frequency device of claim 16 further comprising a replacement substrate layer applied to the dielectric material to provide mechanical stability for the radio-frequency device.

18. A wireless device comprising:
a transceiver configured to process radio-frequency signals;
a radio-frequency module in communication with the transceiver, the radio-frequency module including a switching device having a field-effect transistor (FET) implemented over an oxide layer, one or more electrical connections to the field-effect transistor, one or more dielectric layers formed over at least a portion of the electrical connections, an electrical element electrically coupled to the field-effect transistor via the one or more electrical connections, a handle wafer layer disposed on at least a portion of the one or more dielectric layers, the handle wafer layer including a topside trench defined at least in part by sidewall portions of the handle wafer layer, the trench exposing at least a portion of the electrical element; and
an antenna in communication with the radio-frequency module, the antenna configured to facilitate transmitting and/or receiving of the radio-frequency signals.

19. The wireless device of claim 18 wherein the radio-frequency module further includes a covering that covers at least a portion of the handle wafer layer and the trench to form a cavity.

20. The wireless device of claim 18 wherein the radio-frequency module further comprises a dielectric material that at least partially fills the trench.

* * * * *